(12) United States Patent
Ohta et al.

(10) Patent No.: US 6,236,688 B1
(45) Date of Patent: May 22, 2001

(54) RECEIVING CIRCUIT

(75) Inventors: Gen-ichiro Ohta, Ebina; Kazunori Inogai; Fujio Sasaki, both of Yokohama, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/258,402

(22) Filed: Feb. 26, 1999

Related U.S. Application Data

(62) Division of application No. 08/682,717, filed as application No. PCT/JP95/02448 on Nov. 30, 1995, now Pat. No. 5,914,986.

(30) Foreign Application Priority Data

Nov. 30, 1994 (JP) ................................................. 6-297180
Mar. 24, 1995 (JP) ................................................. 7-66253
Oct. 26, 1995 (JP) ................................................. 7-278513

(51) Int. Cl.[7] ....................................................... H03D 3/18
(52) U.S. Cl. ............................................................. 375/328
(58) Field of Search ................................... 375/316, 322, 375/324, 328, 346; 329/300, 302, 304, 306

(56) References Cited

U.S. PATENT DOCUMENTS

| | | |
|---|---|---|
| 4,290,140 | 9/1981 | Malm . |
| 4,560,941 | 12/1985 | Welles, II et al. . |
| 5,222,106 | 6/1993 | Satoh et al. . |
| 5,598,439 | 1/1997 | Wagner . |
| 5,602,879 | 2/1997 | Wada . |
| 5,768,323 | * 6/1998 | Kroeger et al. ...................... 375/355 |
| 5,982,820 | * 11/1999 | Limberg ................................ 375/326 |
| 6,133,788 | * 10/2000 | Dent .................................. 330/124 R |

FOREIGN PATENT DOCUMENTS

| | | |
|---|---|---|
| 57-57007 | 4/1982 | (JP) . |
| 64-72626 | 3/1989 | (JP) . |
| 1-226220 | 9/1989 | (JP) . |

* cited by examiner

*Primary Examiner*—Don N. Vo
(74) *Attorney, Agent, or Firm*—McDermott, Will & Emery

(57) ABSTRACT

A receiving circuit mainly available in a digital modulation type communication system having a plurality of channels, which is capable of reducing power in a receiving system, simplifying the circuit and reducing the power consumption. Upside and downside frequencies corresponding to a central value between channels are separately supplied from a local frequency signal generating circuit 4 to first and second frequency converting circuits 2, 3 so that two output signals are developed with respect to one of a desired wave, upside channel and downside channel. The desired wave present in common in the first and second frequency converting circuits 2, 3 is extracted in a common wave extracting circuit 5, and a frequency offset of $\omega o$ existing in the output of the common wave extracting circuit 5 is removed a frequency offset circuit 6 and further an unnecessary frequency component is filtered by a filter 8. In addition, the common wave extracting circuit 5 has transformers and, using its inductances, raises the difference between the common wave and the non-common wave within the circuit to more than two times that of a prior art.

4 Claims, 38 Drawing Sheets

A/D CONVERSION INPUT

A/D CONVERSION INPUT

A/D CONVERSION INPUT

FIG. 27
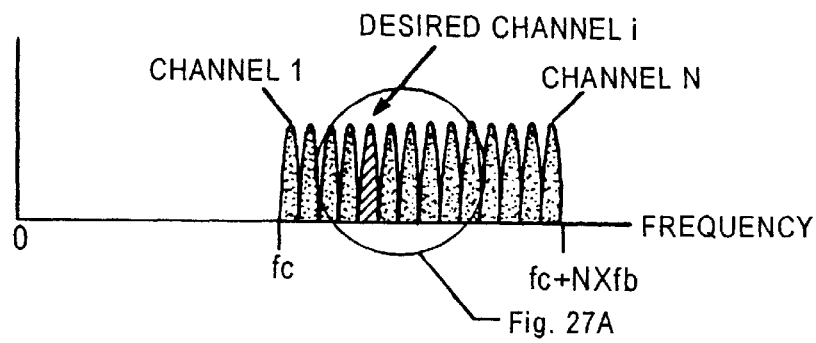
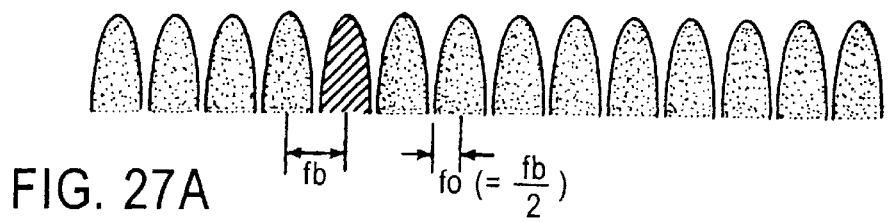
FIG. 27A
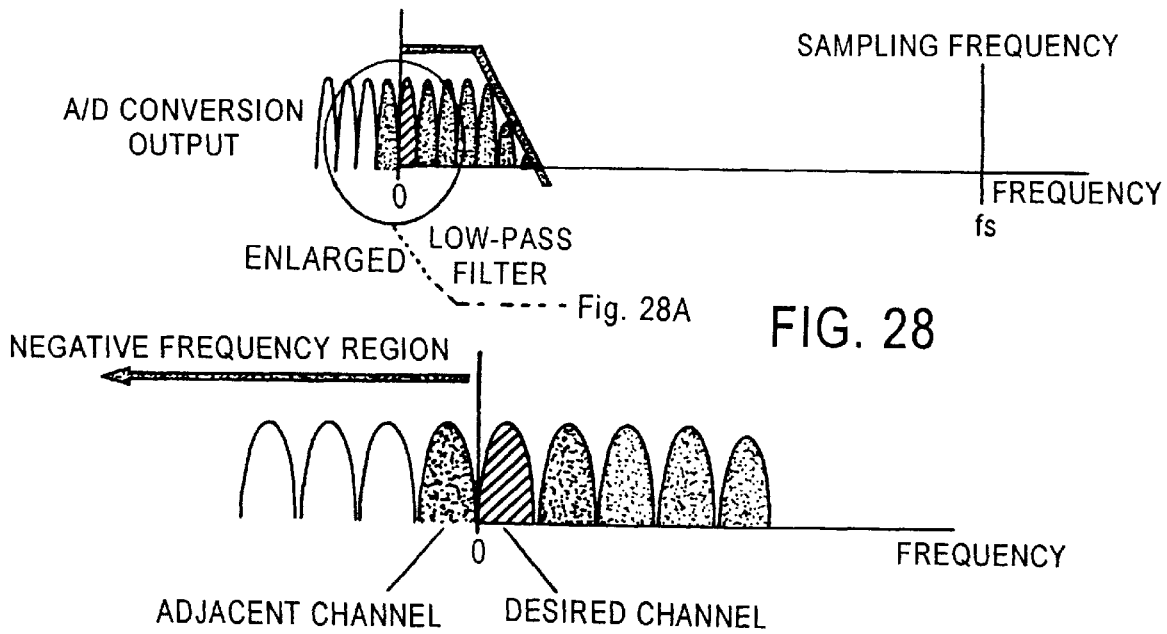
FIG. 28
FIG. 28A

RECEIVING CIRCUIT

This application is a divisional of application Ser. No. 08/682,717 filed Jul. 29, 1996 now U.S. Pat. No. 5,914,986 which is a 371 application of PCT/JP95/02448 filed Nov. 30, 1995.

BACKGROUND OF THE INVENTION

1. Field of the Invention

The present invention relates to a receiving circuit, and more particularly to a receiving circuit which permits simplification of its circuit arrangement and which further allows less power for a receiving system concurrent with reduction of power consumption.

2. Description of the Prior Art

One of important points needed for a receiving circuit in communications is to possibly reduce high-frequency circuit portions to thereby lessen a high power consumption factor, unstable operation factor and high manufacturing cost inherent in the high-frequency circuit, coupled with a space occupied by that circuit. These points are particularly important for mobile communication systems and others. For the reduction of the high-frequency circuit portions, a direct demodulation method has been proposed heretofore in terms of multiple frequency conversion and carrier frequency, thus accomplishing the direct conversion into a low frequency and the direct demodulation into a baseband. The aforesaid high-frequency circuit portion mainly constitutes a space diversity reception function necessitating two antenna systems.

As the direct demodulation method, there have been developed a number of methods in which a local oscillator generates a signal with a frequency equal to the carrier frequency which in turn, is mixed with a received input wave to derive a baseband signal therefrom. This direct demodulation method is made to produce a high-frequency signal with a frequency equal to the received signal frequency, and the high-frequency signal can be easy to release or emit in the air through an antenna of the receiver. Accordingly, another receiver adjacent thereto undergoes interferences to be inhibited from establishing communications. For this reason, this method has chiefly been adopted for communications based on frequency modulation methods which are relatively strong to single frequency interferences.

On the other hand, radio portable telephones, being recently rapidly put in widespread use, rely on a so-called PSK which is one amplitude transport modulation method, and the single frequency interference produces an offset in a demodulated output to deteriorate the error rate of a received signal. That is, since the local oscillation frequency can not take the carrier frequency, in this kind of communication method difficulty is encountered in direct frequency conversion and direct demodulation. One approach to resolve such a technical problem involves a method which, if a carrier frequency for a radio portable telephone is taken as fc and an offset frequency is taken to be fo, obtains fc+fo and fc-fo in order to provide a frequency-offset complementary local oscillation frequency for a frequency conversion. For carrying out this method, fc+fo and fc-fo are obtainable by multiplication process of fc and fo through a mixer (frequency mixer), while both signals fc+fo and fc-fo coexist in an output More specifically, although the aforesaid process independently requires signals with the respective frequencies, the prior system can not practically satisfy this requirement. The prior system essentially employs filters for the respective frequencies, while suffering a disadvantage that a carrier frequency for a desired signal is variable and hence the filters need to designed to cope with the frequency variations.

SUMMARY OF THE INVENTION

The present invention has been developed with a view to resolving the prior problems, and it is therefore a general object of the present invention to provide a receiving circuit in a communication system with a plurality of channels, which is capable of lessening the power necessary in a receiving system and of reducing the power consumption with a simplified circuit.

Another general object of this invention is to provide a receiving circuit which can provide the frequencies fc+fo and fc-fo for elimination of the problems related to the aforementioned ordinary methods.

More specifically, an object of this invention is to provide a receiving circuit which performs a direction frequency conversion of a frequency in between the channels of a receiving system as a local frequency of a receiver and prevents the occurrence of the frequency offset in its output signal and the mixing of a signal of the adjacent channels thereinto.

In addition, a further object of this invention is to structurally review functional parts making up a receiving circuit to reduce the functional parts suffering from a large power consumption or replace them with different ones.

For these purposes, as one example, a receiving circuit according to this invention is composed of first and second frequency converting circuits for accepting a received signal obtained through an antenna, a local frequency signal generating circuit for generating middle (intermediate) frequencies between a radio carrier frequency of the received signal and radio carrier frequencies of adjacent upside and downside channels and further for outputting the upside frequency of the upside and downside two wave frequencies as a conversion frequency input to said first frequency converting circuit and for outputting the downside frequency thereof as a conversion frequency input to said second frequency converting circuit, a common wave extracting circuit for extracting a component present in common in both outputs of the first and second frequency converting circuits, a frequency offset circuit for removing a frequency offset remaining in an output of the common wave extracting circuit, and a filter for removing an unnecessary frequency component remaining in an output of the frequency offset circuit.

In addition, in this invention, a means to resolve the prior problems is added to a local frequency complementary offset type direct frequency converting system, which bases this invention. A space diversity function can be realized with a receiving circuit based on a single direct quadrature detector.

With this arrangement, a received signal obtained from an antenna is fed to the first and second frequency converting circuits, while the local frequency signal generating circuit supplies, to the first and second frequency converting circuits, two different frequencies, i.e., the upside and downside frequencies corresponding to central values between channels, thus producing two output signals in terms of each of a desired wave, an upside channel and a downside channel. Further, a desired wave channel signal being a signal component present in common in both the first and second frequency converting circuits is extracted in the common wave extracting circuit. Since a frequency offset of $\omega o$ remains in the output of the common wave extracting circuit, a minute frequency conversion is carried out in the offset frequency circuit to remove the offset amount. Moreover, an unnecessary frequency component generated in this process is removed through a filter, before the resultant signal is supplied as a baseband signal to a baseband signal processing section.

In accordance with a preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit and for outputting the downside frequency thereof as a conversion frequency input to the second frequency converting circuit, a common wave extracting circuit for extracting a component present in common in both outputs of the first and second frequency converting circuits, a frequency offset circuit for removing a frequency offset remaining in an output of the common wave extracting circuit, and a filter for removing an unnecessary frequency component remaining in an output of the frequency offset circuit.

In another preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit and for outputting the downside frequency thereof as a conversion frequency input to the second frequency converting circuit, a first frequency offset circuit for removing a frequency offset contained in an output of the first frequency converting circuit, a second frequency offset circuit for removing a frequency offset contained in an output of the second frequency converting circuit, a common wave extracting circuit for extracting a component present in common in both outputs of the first and second frequency offset circuits, and a filter for removing an unnecessary frequency component left in an output of the common wave extracting circuit.

In a further preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit and for outputting the downside frequency thereof as a conversion frequency input to the second frequency converting circuit, first quantizing means for quantizing an output of the first frequency converting circuit, second quantizing means for quantizing an output of the second frequency converting circuit, a common wave extracting circuit for extracting a component present in common in both outputs of the first and second quantizing means, a frequency offset circuit for removing a frequency offset remaining in an output of the common wave extracting circuit; and a filter for removing an unnecessary frequency component left in an output of the frequency offset circuit.

In a further preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit and for outputting the downside frequency thereof as a conversion frequency input to the second frequency converting circuit, first quantizing means for quantizing an output of the first frequency converting circuit, second quantizing means for quantizing an output of the second frequency converting circuit, a first frequency offset circuit for removing a frequency offset contained in an output of the first quantizing means, a second frequency offset circuit for removing a frequency offset contained in an output of the second quantizing means, a common wave extracting circuit for extracting a component present in common in both outputs of the first and second frequency offset circuits, and a filter for removing an unnecessary frequency component left in an output of the common wave extracting circuit.

In a further preferred form of this invention, a receiving circuit comprises first and second quadrature (orthogonal) demodulating circuits for receiving a received signal obtained through an antenna, a local frequency signal generating circuit coupled to the first and second quadrature demodulating circuits for generating middle frequencies between a radio carrier frequency of the received signal and radio carrier frequencies of adjacent upside and downside channels and further for outputting the upside frequency of the upside and downside two wave frequencies as a conversion frequency input to the first quadrature demodulating circuit and for outputting the downside frequency as a conversion frequency input to the second quadrature demodulating circuit, a first common wave extracting circuit coupled to the first and second quadrature demodulating circuits for extracting a component present in common in both I outputs of the first and second quadrature demodulating circuits, a second common wave extracting circuit coupled to the first and second quadrature demodulating circuits for extracting a component present in common in both a Q output of the first quadrature demodulating circuit and a Q output of the second quadrature demodulating circuit reversed in polarity, a first frequency offset circuit for removing a frequency offset remaining in the I output extracted through the first common wave extracting circuit, a second frequency offset circuit for removing a frequency offset remaining in the Q output extracted through the second common wave extracting circuit, a first filter for removing an unnecessary frequency component remaining in an output of the first frequency offset circuit, and a second filter for removing an unnecessary frequency component remaining in an output of the second frequency offset circuit.

In a further preferred form of this invention, a receiving circuit comprises first and second quadrature demodulating circuits for receiving a received signal obtained through an antenna, a local frequency signal generating circuit coupled to the first and second quadrature demodulating circuits for generating middle frequencies between a radio carrier frequency of the received signal and radio carrier frequencies of adjacent upside and downside channels and further for outputting the upside frequency of the upside and downside two wave frequencies as a conversion frequency input to the first quadrature demodulating circuit and for outputting the downside frequency as a conversion frequency input to the second quadrature demodulating circuit, first and second frequency offset circuits for removing a frequency offset contained in common in I outputs and Q outputs of the first and second quadrature demodulating circuits, a first common wave extracting circuit for extracting a component present in common in both the I outputs of the first and second frequency offset circuits, a second common wave extracting circuit for extracting a component present in common in both the Q output of the first frequency offset circuit and the Q output of the second frequency offset circuit 6I reversed in polarity, and first and second filters for removing unnecessary frequency components remaining in outputs of the first and second common wave extracting circuits.

In a further preferred form of this invention, a receiving circuit comprises first and second quadrature demodulating circuits for receiving a received signal obtained through an antenna, a local frequency signal generating circuit coupled to the first and second quadrature demodulating circuits for generating middle frequencies between a radio carrier frequency of the received signal and radio carrier frequencies of adjacent upside and downside channels and further for outputting the upside frequency of the upside and downside two wave frequencies as a conversion frequency input to the first quadrature demodulating circuit and for outputting the downside frequency as a conversion frequency input to the second quadrature demodulating circuit, first and second quantizing means for quantizing an I output and a Q output of the first quadrature demodulating circuit, respectively, third and fourth quantizing means for quantizing an I output and a Q output of the second quadrature demodulating circuit, respectively, a first common wave extracting circuit for extracting a component present in common in the I outputs of the first and third quantizing means, a second common wave extracting circuit for extracting a component present in common in the Q output of the second quantizing means and the Q output of the fourth quantizing means reversed in polarity, a first frequency offset circuit for removing a frequency offset remaining in the I output extracted through the first common wave extracting circuit, a second frequency offset circuit for removing a frequency offset remaining in the Q output extracted through the second common wave extracting circuit, a first filter for removing an unnecessary frequency component left in an output of the first frequency offset circuit, and a second filter for removing an unnecessary frequency component left in an output of the second frequency offset circuit.

In a further preferred form of this invention, a receiving circuit comprises first and second quadrature demodulating circuits for receiving a received signal obtained through an antenna, a local frequency signal generating circuit coupled to the first and second quadrature demodulating circuits for generating middle frequency between a radio carrier frequency of the received signal and radio carrier frequencies of adjacent upside and downside channels and further for outputting the upside frequency of the upside and downside two wave frequencies as a conversion frequency input to the first quadrature demodulating circuit and for outputting the downside frequency as a conversion frequency input to the second quadrature demodulating circuit, first and second quantizing means for quantizing an I output and a Q output of the first quadrature demodulating circuit, respectively, third and fourth quantizing means for quantizing an I output and a Q output of the second quadrature demodulating circuit, respectively, a frequency offset circuit for removing frequency offsets remaining in the I outputs and the Q outputs of the first to fourth quantizing means, a first common wave extracting circuit for extracting a component present in common in the I outputs of the frequency offset circuit, a second common wave extracting circuit for extracting a component present in common in the Q output and a polarity-reversed Q output of the frequency offset circuit, a first filter for removing an unnecessary frequency component left in the I output extracted through the first common wave extracting circuit, and a second filter for removing an unnecessary frequency component left in the Q output of the second common wave extracting circuit.

Furthermore, according to this invention, in a receiving circuit, a correlator for calculating a mutual correction is used in place of the common wave extracting circuit.

In a receiving circuit according to this invention, only the first frequency converting circuit is used for accepting the received signal, and after a frequency conversion by the first frequency converting circuit, a frequency-converted output of a side where no frequency conversion is effected by the first frequency converting circuit is obtained by another frequency converting circuit to attain two frequency-converted outputs necessary for the common wave extraction.

According to this invention, in a receiving circuit, only the first frequency converting circuit is used for accepting the received signal and only one of the first and second quantizing means is used for quantization, and after the quantization by the quantizing means, a frequency-converted output of a side where no frequency conversion is performed by the first frequency converting circuit is obtained by the digital frequency converting circuit to obtain two frequency-converted digital outputs necessary for the common wave extraction.

According to this invention, in a receiving circuit, only one of the first and second quadrature demodulating circuits is used for accepting the received signal, and two outputs of the quadrature demodulating circuit are frequency-converted by the frequency converting circuit to obtain a frequency-converted output of a side where no quadrature demodulation is made, to obtain two quadrature-demodulated outputs necessary for the common wave extraction.

According to this invention, in a receiving circuit, only one of the first and second quadrature demodulating circuits is used for accepting the received signal and only the second and third quantizing means are used, and after the quantization by the quantizing means, two outputs of the quantizing means are frequency-converted by the digital frequency converting circuit to obtain a frequency-converted output of a side no quadrature demodulation is effected, to obtain two quadrature-modulated outputs necessary for the common wave extraction.

Furthermore, in a preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit 2 and for outputting the downside frequency thereof as a conversion frequency input to the second frequency converting circuit, first and second integrating circuits, serving additionally as low-pass filters, for receiving outputs of the first and second frequency converting circuits through input lines, first and second buffer amplifiers for receiving outputs of the first and second integrating circuits, first and second transformers having the same construction and having primary coils whose one ends accepts outputs of the first and second buffer amplifiers, the other ends of the primary coils of the first and second transformers being grounded in the form of alternating currents, and secondary coils of the first and second transformers being coupled in parallel to each other in accordance with polarities of the primary coils and one ends of the secondary coils equal in polarity to the primary coils is used as an output terminal while the other ends of the secondary coils are grounded, a third buffer amplifier for accepting an output from the first and second transformers, a frequency offset circuit for removing a frequency offset remaining in an output of the third buffer amplifier, and a filter for removing an unnecessary frequency component remaining in an output of the frequency offset.

In a further preferred form of this invention, a receiving circuit comprises first and second frequency converting circuits for accepting a received signal obtained through an antenna, a local frequency signal generating circuit coupled to the first and second frequency converting circuits for generating middle frequencies between a radio carrier frequency of the received signal and radio carrier frequencies of adjacent upside and downside channels and further for outputting the upside frequency of the upside and downside two wave frequencies as a conversion frequency input to the first frequency converting circuit and for outputting the downside frequency thereof as a conversion frequency input to the second frequency converting circuit, first and second differential amplifiers for accepting outputs of the first and second frequency converting circuits through input lines, first and second integrating circuits, serving additionally as low-pass filters, for correspondingly accepting outputs of the first and second differential amplifiers, first and second buffer amplifiers for supplying outputs of the first and second integrating circuits, means for making a feedback from an output side of each of the first and second buffer amplifiers to a negative input side thereof, first and second transformers having the same construction and having primary coils whose one ends accepts outputs of the first and second buffer amplifiers, the other ends of the primary coils of the first and second transformers being at least grounded in the form of alternating currents, and secondary coils of the first and second transformers being coupled in parallel to each other in accordance with polarities of the primary coils and one ends of the secondary coils equal in polarity to the primary coils is used as an output terminal while the other ends of the secondary coils are at least grounded in the form of alternating currents, a third buffer amplifier for accepting outputs of the first and second transformers, means for comparing an output of the third buffer amplifier with an average of the output of the first frequency converting circuit and the output of the second frequency converting circuit to correct the outputs of the first and second frequency converting circuits, means for causing an output of the third buffer amplifier to be feedbacked to one of the first and second frequency converting circuits to correct a difference between the outputs of the first and second frequency converting circuits, a frequency offset circuit for removing a frequency offset remaining in the output of the third buffer amplifier, and a filter for removing an unnecessary frequency component remaining in an output of the frequency offset circuit.

In accordance with this invention, in receiving circuit, the one end of the secondary coil different in polarity from the primary coil is connected with the third buffer amplifier in place of the end end of the secondary coil equal in polarity to the primary coil being connected therewith.

In accordance with this invention, in a receiving circuit, the one end of the secondary coil different in polarity from the primary coil is connected with the third buffer amplifier in place of the end end of the secondary coil equal in polarity to the primary coil being connected therewith.

A receiving circuit according to this invention further comprises local frequency generating means including a first frequency signal source for generating a signal with a frequency equal to a carrier frequency of a desired receiving signal, first means for accepting a signal from the first frequency signal source to phase-shift the accepted signal by a phase amount of $\pi/2$ with respect to a frequency of the accepted signal, a second frequency signal source for generating a frequency signal equal to ½ of a frequency channel spacing, second means for accepting a signal from the second frequency signal source to phase-shift a frequency of the accepted signal by a phase amount of $\pi/2$, a first quadrature modulator comprising a multiplier for receiving the two signals from the first and second frequency signal sources and a multiplier for receiving two signals from the first and second phase-shifting means, and a second quadrature modulator comprising two multipliers for receiving one of the two signals from the first and second frequency signal sources through the phase-shifting means.

A receiving circuit according to this invention further comprises local frequency generating means including a first frequency signal source for generating a frequency signal equal to a carrier frequency of a desired receiving signal, first means for accepting a signal from the first frequency signal source to phase-shift the accepted signal by a phase amount of $\pi/2$ with respect to a frequency of the accepted signal, a second frequency signal source for generating a frequency signal equal to ½ of a frequency channel spacing, second means for accepting a signal from the second frequency signal source to phase-shift a frequency of the accepted signal by a phase amount of $\pi/2$, multipliers for receiving the two signals from the first and second frequency signal sources, and means for inverting the polarity of an output of one of the multipliers to add the polarity-inverted output to an output of the other multiplier.

A receiving circuit according to this invention further comprises local frequency generating means including a frequency signal source for generating a frequency signal equal to a carrier frequency of a desired receiving signal, means for accepting a signal from the frequency signal source to phase-shift the accepted signal by a phase amount of $\pi/2$ in relation to a frequency of the accepted signal, a quadrature modulator comprising two multipliers for accepting a frequency signal from the frequency signal source through the phase shifting means, and means for inverting the polarity of an output of one of the two multipliers and for adding the polarity-inverted output to an output of the other multiplier.

In accordance with this invention, a receiving circuit includes means for analog-to-digital-converting first and second received signals obtained through one of the frequency converting circuits and the quadrature demodulating circuits, first and second Fourier transformers for accepting digital outputs of the analog-to-digital converting means, respectively, a correlator for accepting outputs of the first and second Fourier transformers at every frequency component, a weighting function device for accepting an output of the correlator, a weighting value multiplier for accepting an output of the weighting function device, an adder for accepting the outputs of the first and second Fourier transformers, and means for inputting an addition result of the adder to the multiplier, and an inverse Fourier transformer for accepting an output of the weighting value multiplier, wherein an inverse Fourier transformed output of the inverse Fourier transformer is used as a desired wave extraction result.

Moreover, in a preferred form of this invention, a receiving circuit comprises received signal inputting means for receiving a received signal from an antenna, a quadrature demodulator for carrying out a frequency converting process of the received signal from the received signal inputting means, first and second analog-to-digital converters for accepting an output signal of the quadrature demodulator to convert its analog signal into a digital signal, a sampling clock generator for generating, to the first and second analog-to-digital converters, a clock with a frequency which is more than two times a frequency corresponding to a bandwidth of the received signal, an adding circuit for adding a delayed pulse train (sequence) to a pulse train from the sampling clock generator, means for providing the pulse train from the sampling clock generator and the delayed pulse train as an sampling pulse for the analog-to-digital converters, and means for extracting a quadrature component of a desired receiving channel signal from digital output data of the analog-to-digital converters.

In a further preferred form of this invention, a receiving circuit comprises received signal inputting means for receiving a received signal from an antenna, a quadrature demodulator for carrying out a frequency converting process of the received signal from the received signal inputting means, first and second analog-to-digital converters for accepting an output signal of the quadrature demodulator to convert its analog signal into a digital signal, a sampling clock generator for generating, to the first and second analog-to-digital converters, a clock with a frequency higher than a frequency corresponding to a bandwidth of the received signal, an adding circuit for adding a delayed pulse train to a pulse train from the sampling clock generator, means for providing the pulse train from the sampling clock generator and the delayed pulse train as an sampling pulse for the analog-to-digital converters, and means for extracting a quadrature component of a desired receiving channel signal from digital output data of the analog-to-digital converters, wherein one or more delayed pulse trains is generated so that the pulse train from the sampling clock generator and the delayed pulse train from the delayed pulse train adding circuit take a delayed time other than a phase difference corresponding to $\pi$ of a frequency of the desired channel signal.

In accordance with this invention, in a receiving circuit, the pulse train is generated from the sampling clock generator and the delayed pulse train taking a phase difference time corresponding to $\pi/2$ relative to a frequency of the desired channel signal is generated from the delayed pulse train adding circuit.

In a further preferred form of this invention, a receiving circuit comprises received signal inputting means for receiving a received signal from an antenna, first and second analog-to-digital converters for accepting the received signal to convert the received signal into a digital signal, a sampling clock generator for generating, to the first and second analog-to-digital converters, a clock with a frequency higher than a frequency corresponding to a bandwidth of the received signal, an adding circuit for adding a delayed pulse train to a pulse train from the sampling clock generator, means for providing the pulse train from the sampling clock generator and the delayed pulse train as an sampling pulse for the analog-to-digital converters, and means for extracting a desired receiving channel signal from digital output data of the analog-to-digital converters.

Furthermore, in accordance with this invention, in a receiving circuit, in -addition to the pulse train from the sampling clock generator, the delayed pulse train taking a phase difference time corresponding to $\pi/2$ with respect to a frequency of the desired channel signal is generated from the delayed pulse train adding circuit.

Moreover, in accordance with this invention, in a receiving circuit, in addition to the pulse train from the sampling clock generator, a plurality of delayed pulse trains taking a phase difference time corresponding to $\pi/2$ in relation to a frequency of the desired channel signal are generated from the delayed pulse train adding circuit.

In a further preferred form of this invention, a receiving circuit comprises received signal inputting means for receiving a received signal from an antenna, an analog-to-digital converter for accepting the received signal to convert the received signal into a digital signal, a sampling clock generator for generating, to the analog-to-digital converter, a clock with a frequency higher than a frequency corresponding to a bandwidth of the received signal, an adding circuit for adding a delayed pulse train to a pulse train from the sampling clock generator, means for providing the pulse train from the sampling clock generator and the delayed pulse train as an sampling pulse for the analog-to-digital converter, and means for extracting a desired receiving channel signal from digital output data of the analog-to-digital converter.

In a still further preferred form of this invention, a receiving circuit comprises received signal inputting means for accepting received signals from a plurality of antennas, first and second frequency converting means for accepting the received signals, a local oscillator for supplying, to the first and second frequency converting means, an output at a frequency produced by providing a frequency offset of ½ of a channel spacing frequency to a desired carrier frequency, first and second analog-to-digital converters for accepting signals from the first and second frequency converting means, a sampling clock generator for generating, to the analog-to-digital converters, a clock with a frequency higher than a frequency corresponding to a bandwidth of the received signal, an adding circuit for adding a delayed pulse train to a pulse train from the sampling clock generator, means for providing the pulse train from the sampling clock generator and the delayed pulse train as an sampling pulse for the analog-to-digital converters, and means for extracting a desired receiving channel signal from digital output data of the analog-to-digital converters.

In accordance with this invention, in a receiving circuit, the local oscillator for providing the output to the first and second frequency converting means is provided independently so that local oscillation frequencies are frequencies produced by providing positive and negative frequency offsets of ½ of a channel spacing frequency with respect to the desired carrier frequency.

Furthermore, in accordance with this invention, in a receiving circuit, the two received signals are supplied to the first and second analog-to-digital converters without being frequency-converted

BRIEF DESCRIPTION OF THE DRAWINGS

The object and features of the present invention will become more readily apparent from the following detailed description of the preferred embodiments taken in conjunction with the accompanying drawings in which:

FIG. 27 is an illustration of a state of a receiving channel in a multi-channel communication system in this invention;

FIG. 28 is an illustration of an A/D converted output with a negative frequency region appearing in the twenty second embodiment of this invention;

MOST PREFERRED EMBODIMENTS OF THE INVENTION

Prior to explanation of preferred embodiments of the present invention, a description will be made hereinbelow of a logical ground supporting the present invention. First of all, the description starts with a binary PSK, i.e., BPSK, which has currently mostly been employed in digital modulation ways. A BPSK signal $S_B$ on a base frequency, i.e., baseband, is expressible as follows.

$$S_B = A \cos(\theta k)$$

where A represents an amplitude, and θk designates a phase indicative of BPSK information, i.e., θk=0, π.

When this baseband signal is modulated with a carrier angular frequency ωc, the resulting modulated signal $S_C$ is expressible as follows.

$$S_C = S_B(\theta k) \times a \cos \omega c t + S_B(\theta k) - \frac{1}{2}\pi \times a \cos\left(\omega c t - \frac{1}{2}\pi\right) \quad (1)$$

$$A_C = a \times A, \theta k = 0, \pi$$

$$= A_C \cos(\omega c t + \theta k)$$

When this modulated signal is received and frequency-converted with a local frequency ωc for a frequency conversion, the frequency-converted output $S_R$ can be given as follows.

$$S_R = S_C \times b \cos \omega c t \quad (2)$$

$$= \frac{A_C \cdot b}{2}[\cos\{2\omega c t + \theta k\} + \cos\{\theta k\}]$$

if using $\frac{A_C \cdot b}{2} = A_R$ $$= A_R[\cos\{2\omega c t + \theta k\} + \cos\{\theta k\}]$$

Further, this frequency-converted output $S_R$ is passed through a low-pass filter in order to remove (reject) a high-frequency component 2ωc, the resultant output $S_{RF}$ becomes as follows, thus allowing the demodulation of the binary PSK, i.e., BPSK.

$$S_{RF} = A_R \cos(\theta k) \quad (3)$$

θk=0, π

However, since in the receiving frequency conversion the local oscillation frequency signal is set to ωc equal to the carrier frequency, this local oscillation frequency signal radiates from the receiver into the air and can interfere with other nearby receivers.

Figure 20:
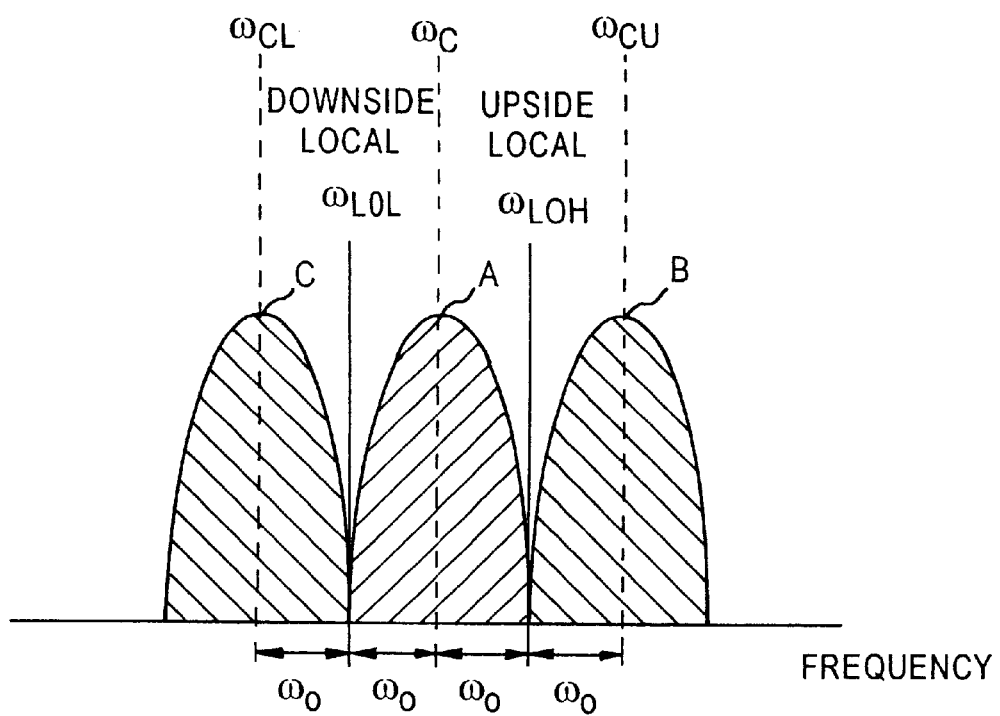
FIG. 20 is a diagrammatic view useful for describing a local frequency setting method in embodiments of this invention.

In this invention, the local oscillation frequency is set as follows to eliminate such a problem. FIG. 20 illustrates a method of setting the local oscillation frequency according to this invention, where character A indicates a band of a desired channel with its carrier frequency being ωc, character B denotes a band of an upside adjacent (upper neighboring) channel, whose carrier frequency is ωcu, and character C depicts a band of a downside adjacent (lower neighboring) channel which has a carrier frequency of ωcL. The spacing between the carrier frequencies of the respective channels is approximately four times that of the base frequency ωb in the BPSK The bands of the respective channels assume the carrier frequency ±2ωb. Accordingly, the locations remote by an amount corresponding to the base frequency 2ωb from the respective carrier frequencies come to gorge positions between the channels. Even if interference waves with a line spectrum exist at these positions, all the channels are hardly subjected to interference. Taking notice of this point, as a main means to resolve the aforesaid problem, according to this invention the local oscillation frequency of the receiver is set to middle values with respect to the frequencies of the adjacent channels.

Secondly, a description will be taken hereinbelow in conjunction with equations in terms of another point of this invention which shows how to construct circuits (which will be mentioned later) so that the demodulation is possible as well as the prior art in the case of setting the local oscillation frequency of the receiver as described above. When a modulated signal is received and the local oscillation frequency for the frequency conversion in the receiver is set to ωc+ωo as mentioned before, the frequency-converted output $S_R$ becomes as follows.

$$S_R = S_C \times b \cos(\omega c + \omega o)t \quad (4)$$

$$= \frac{A_C \cdot b}{2}\cos\{\omega c t + \theta k\}\cos(\omega c + \omega o)t$$

if using $\frac{A_C \cdot b}{2} = A_R$ $$= A_R[\cos\{(2\omega c + \omega o)t + \theta k\} + \cos(-\omega o t + \theta k)]$$

If this frequency-converted output $S_R$ is passed through a low-pass filter to eliminate the high-frequency component 2ωc, the resultant output $S_{RF}$ is as follows, thus resulting in producing a binary PSK, i.e., BPSK signal, which is offset by only the frequency ωo.

$$S_{RF} = A_R\{\cos(-\omega o t + \theta k)\} \quad (5)$$

θk=0, π

Subsequently, the local oscillation frequency is set to ωc-ωo lower by wo than the carrier frequency ωc of a desired channel. In this instance, the frequency-converted output $S_L$ becomes as follows.

$$S_L = S_C \times b \cos(\omega c - \omega o)t \quad (6)$$

$$= \frac{A_C \cdot b}{2}\cos\{\omega c t + \theta k\}\cos(\omega c + \omega o)t$$

if using $\frac{A_C \cdot b}{2} = A_R$ $$= A_R[\cos\{2\omega c - \omega o + \theta k\} + \cos\{\omega o t + \theta k\}]$$

If this frequency-converted Output $S_L$ is passed through a low-pass filer to remove the high-frequency component 2ωc, the resultant output $S_{LF}$ becomes as follow, thus producing a BPSK signal which is also equal in phase to the output $S_{LF}$.

$$S_{LF} = A_R \cos(\omega o t + \theta k) \quad (7)$$

θk=0, π

Since the reception local oscillation frequency is also an equal distance from the adjacent channels, the components of the adjacent channels are also introduced into a signal being demodulated. When the carrier frequency is taken as ωch, the signal of the upside adjacent channel assumes ωch=ωc+ωo, and hence the aforesaid reception side frequency conversion is performed as follows. If the modulated signal is received and the local oscillation frequency for the frequency conversion in the receiver is set to ωc+ωo as mentioned before, the frequency-converted output $S_{Rh}$ is given as follows.

$$S_{Rb} = S_{Ch} \times b \cos(\omega c + \omega o)t \qquad (8)$$

$$= \frac{A_{Ch} \cdot b}{2}[\cos\{\omega c t + 2\omega o t + \theta h\}\cos(\omega c + \omega o)t]$$

if using $\frac{A_{Ch} \cdot b}{2} = A_{Rh}$ $$= A_{Rh}[\cos\{(2\omega c + 3\omega o)t + \theta h\} + \cos\{\omega o t + \theta h\}]$$

If this frequency-converted output $S_{Rh}$ is passed through a low-pass filter to eliminate the high-frequency component $2\omega c$, the resultant output $S_{RFh}$ is given as follows, thus producing a BPSK signal present in the same band as the desired channel.

$$S_{RFh} = A_{Rh} \cos(\omega o t + \theta h) \qquad (9)$$

θh=0, π

On the other hand, when the carrier frequency is expressed by $\omega c_1$, the signal of the downside adjacent channel represents $\omega c_1 = \omega c - 2\omega o$, and the aforesaid reception side frequency conversion is carried out as follows. If the local oscillation frequency of the receiver is set to $\omega c + \omega o$ as noted before, the frequency-converted output $S_{R1}$ becomes as follows.

$$S_{Rl} = S_{Cl} \times b \cos(\omega c + \omega o)t \qquad (10)$$

$$= \frac{A_{Cl} \cdot b}{2}[\cos\{(\omega c - 2\omega o)t + \theta l\}\cos(\omega c + \omega o)t]$$

if using $\frac{A_{Cl} \cdot b}{2} = A_{Rl}$ $$= A_{Rl}[\cos(2\omega c t - \omega o t + \theta l) + \cos(-3\omega o t + \theta l)]$$

θl = 0, π

If this frequency-converted output $S_{R1}$ is passed through a low-pass filer to eliminate the high-frequency component $2\omega c$, the resultant output $S_{RF1}$ is given as follows, which generates a BPSK signal at a frequency separated by $3\omega o$ from the desired channel.

$$S_{RF1} = A_{Rl}[\cos(3\omega t - \theta l)] \qquad (11)$$

Furthermore, a verification will be made hereinbelow of a frequency conversion condition of an adjacent channel in the case that the local frequency is $\omega c - \omega o$. When the carrier frequency is expressed by $\omega ch$, the signal of the upside adjacent channel takes $\omega ch = \omega c + 2\omega o$, and therefore, when the local oscillation frequency is $\omega c - \omega o$, the frequency conversion is made as follows. First, if the modulated signal is received and the local oscillation frequency for the frequency conversion in the receiver is set to $\omega c - \omega o$ as noted before, the frequency-converted output $S_{Lh}$ becomes as follows.

$$S_{Lh} = S_{Ch} \times b \cos(\omega c - \omega o)t \qquad (12)$$

$$= \frac{A_{Ch} \cdot b}{2}[\cos\{\omega c t + 2\omega o t + \theta h\}\cos(\omega c - \omega o)t]$$

if using $\frac{A_{Ch} \cdot b}{2} = A_{Rh}$ $$= A_{Rh}[\cos\{(2\omega c + \omega o)t + \theta h\} + \cos\{3\omega o t + \theta h\}]$$

If this frequency-converted output $S_{Lh}$ is passed through a low-pass filter to remove the high-frequency component $2\omega c$, the resultant output $S_{LFh}$ becomes as follows.

$$S_{LFh} = A_{Rh}[\cos(3\omega o t + \theta h)] \qquad (13)$$

θh=0, π

On the other hand, when the carrier frequency is expressed by $\omega_{C1}$, the signal of the downside adjacent channel takes $\omega_{C1} = \omega c - 2\omega o$, and therefore, the aforesaid reception side frequency conversion is carried out as follows. First, if the local oscillation frequency of the receiver is set to $\omega c - \omega o$ as noted before, the frequency-converted Output $S_{L1}$ is given as follows.

$$S_{Ll} = S_{Cl} \times b \cos(\omega c - \omega o)t \qquad (14)$$

$$= \frac{A_{Cl} \cdot b}{2}[\cos\{(\omega c - 2\omega o)t + \theta l\}\cos(\omega c - \omega o)t]$$

if using $\frac{A_{Cl} \cdot b}{2} = A_{Rl}$ $$= A_{Ll}[\cos\{(2\omega c - 3\omega o)t + \theta l\} + \cos(-\omega o t + \theta l)]$$

θh = 0, π

If this frequency-converted output $S_{L1}$ is passed through a low-pass filter to eliminate the high-frequency component $2\omega c$, the resultant output SLF1 becomes as follows, which produces a BPSK signal at a frequency equal to that of the desired channel.

$$S_{LF1} = A_{R1} \cos(\omega o t - \theta l) \qquad (15)$$

From the above description, in the case that the local frequency is shifted upward by $\omega o$, the output takes the following three kinds.

$$S_{RF} = A_R \cos(-\omega o t + \theta k) \quad \text{desired channel} \qquad (16)$$

$$S_{RFh} = A_{Rh} \cos(\omega o t + \theta h) \quad \text{upside channel}$$

$$S_{RFl} = A_{Rl} \cos(3\omega o t - \theta l) \quad \text{downside channel}$$

Going the the other way, when the local frequency is shifted downward by (o, the output takes the following three kinds.

$$S_{LF} = A_R \cos(\omega o t + \theta k) \quad \text{desired channel} \qquad (17)$$

$$S_{LFh} = A_{Rh} \cos(3\omega o t + \theta h) \quad \text{upside channel}$$

$$S_{LFl} = A_{Rl} \cos(\omega o t - \theta l) \quad \text{downside channel}$$

The common component of these two groups is present in only the desired channel. Accordingly, if both are supplied as two inputs to an adder, only the desired channel can be derived from its output. Although the output is frequency-offset by $\omega o$, this frequency offset is removable with a simple frequency offset circuit.

This invention is on the basis of the above-described principle and can be embodied as being described in the following embodiments.

First Embodiment

Figure 1:
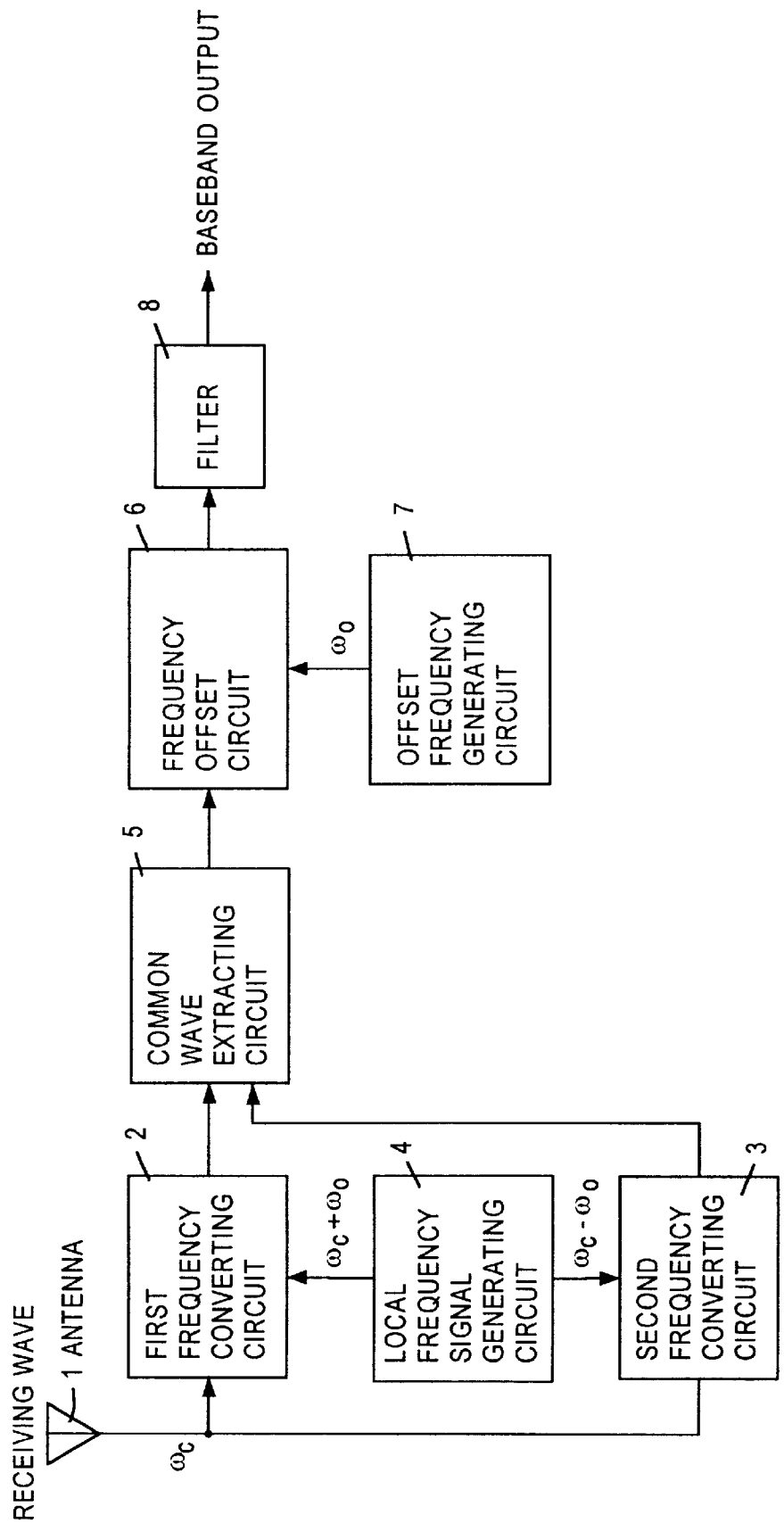
FIG. 1 is a block diagram showing an arrangement of a receiving circuit according to a first embodiment of this invention.

FIG. 1 is an illustration of an arrangement of a receiving circuit according to a first embodiment of this invention. In FIG. 1, the receiving circuit is shown, as comprising an antenna 1 for accepting a signal being received, first and second frequency converting circuits 2, 3 for accepting the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first frequency converting circuit 2 while outputting the downside frequency as a conversion frequency input to the second frequency converting circuit 3, a common wave extracting circuit 5 for extracting a component present in common in (common to) the output of the first frequency converting circuit 2 and the output of the second frequency converting circuit 3, a frequency offset circuit 6 for removing a frequency offset remaining in the output of the common wave extracting circuit 5, an offset frequency generating circuit 7 for performing a minute frequency conversion to supply an offset amount to the frequency offset circuit 6, and a filter 8 for eliminating an unnecessary frequency component remaining in the output of the frequency offset circuit 6.

Secondly, a description will be made hereinbelow of an operation of the receiving circuit according to this first embodiment. According to the above-mentioned equations, the received signal obtained through the antenna 1 is supplied to both the first and second frequency converting circuits 2, 3, while the local frequency signal generating circuit 4 separately supplies two different frequencies, i.e., the upside and downside frequencies equivalent to the central value between the channels, to the first and second frequency converting circuits 2, 3, which produces two output signals in terms of each of the three signals: the desired channel signal, the upside channel signal and the downside channel signal. According to the equation developments, the signal component present in common in the first and second frequency converting circuits 2, 3 is only the desired channel signal. When it is fed to the common wave extracting circuit 5 for extracting a balanced component, the balanced component mainly comprising the desired wave is obtainable. Since in the output of the common wave extracting circuit 5 a frequency offset of ωo remains, a minute frequency conversion is conducted in the offset frequency generating circuit 7 and the offset amount is removed in the frequency offset circuit 6. In addition, the unnecessary frequency component generated in this process is removed in the filter 8, before the resultant signal is fed as a baseband signal to a baseband signal processing circuit (not shown).

Second Embodiment

Figure 2:
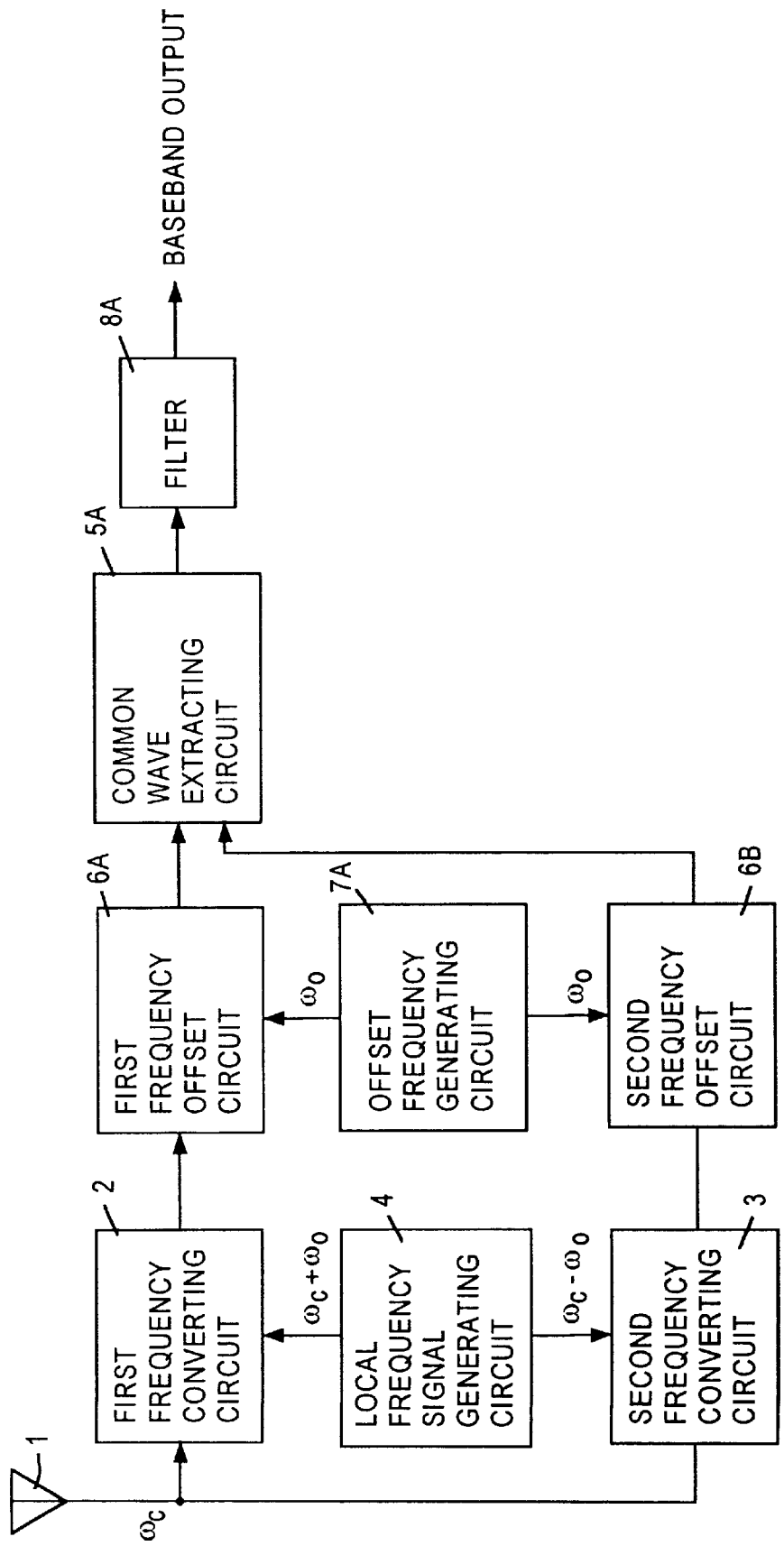
FIG. 2 is a block diagram showing an arrangement of a receiving circuit according to a second embodiment of this invention.

FIG. 2 shows an arrangement of a receiving circuit according to a second embodiment of this invention. In FIG. 2, the receiving circuit is shown, as comprising an antenna 1 for accepting a signal being received, first and second frequency converting circuits 2, 3 for accepting the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first frequency converting circuit 2 while outputting the downside frequency as a conversion frequency input to the second frequency converting circuit 3, a first frequency offset circuit 6A for removing a frequency offset contained in the output of the first frequency converting circuit 2, a second frequency offset circuit 6B for removing a frequency offset contained in the output of the second frequency converting circuit 3, an offset frequency generating circuit 7A for performing a minute frequency conversion to supply an offset amount to the respective frequency offset circuits 6A and 6B, a common wave extracting circuit 5A for extracting a component present in common in both the outputs of the first and second frequency offset circuits 6A, 6B, and a filter 8A for removing an unnecessary frequency component left in the output of the common wave extracting circuit 5A.

Secondly, a description will be taken hereinbelow of an operation of the receiving circuit according to the second embodiment. In this embodiment the process for performing a frequency offset is interchanged with the common wave extracting process as compared with the aforementioned first embodiment. That is, the frequency offset process is carried out ahead, so that the desired channel signal directly becomes a baseband signal whereby more stable extraction is expectable.

A description will be made hereinbelow of the appropriateness of the preference of the frequency offset process. In the case of the frequency offset for the signal group in which the local frequency is shifted upward by ωo, the shifting is made for eliminating only ωo, thus resulting in the following three kinds of outputs.

$$S_{RF} = A_R \cos(2\omega o t - \theta k) \quad \text{desired channel} \tag{18}$$

$$S_{RFh} = A_{Rh} \cos(\theta h) \quad \text{upside channel}$$

$$S_{RFl} = A_{Rl} \cos(4\omega o t - \theta l) \quad \text{downside channel}$$

On the other hand, in the case of the frequency offset for the signal group in which the local frequency is shifted downward by ωo, the shifting is made for eliminating only ωo, thus resulting in the following three kinds of outputs.

$$S_{LF} = A_R \cos(2\omega o t + \theta k) \quad \text{desired channel} \tag{19}$$

$$S_{LFh} = A_{Rh} \cos(4\omega o t + \theta h) \quad \text{upside channel}$$

$$S_{LFl} = A_{Rl} \cos(\theta l) \quad \text{downside channel}$$

The common component of both the groups is also present in only the desired channel. Accordingly, if both are fed as two inputs to an adder, a BPSK signal of only the desired channel can be derived from its output signal.

Third Embodiment

Figure 3:
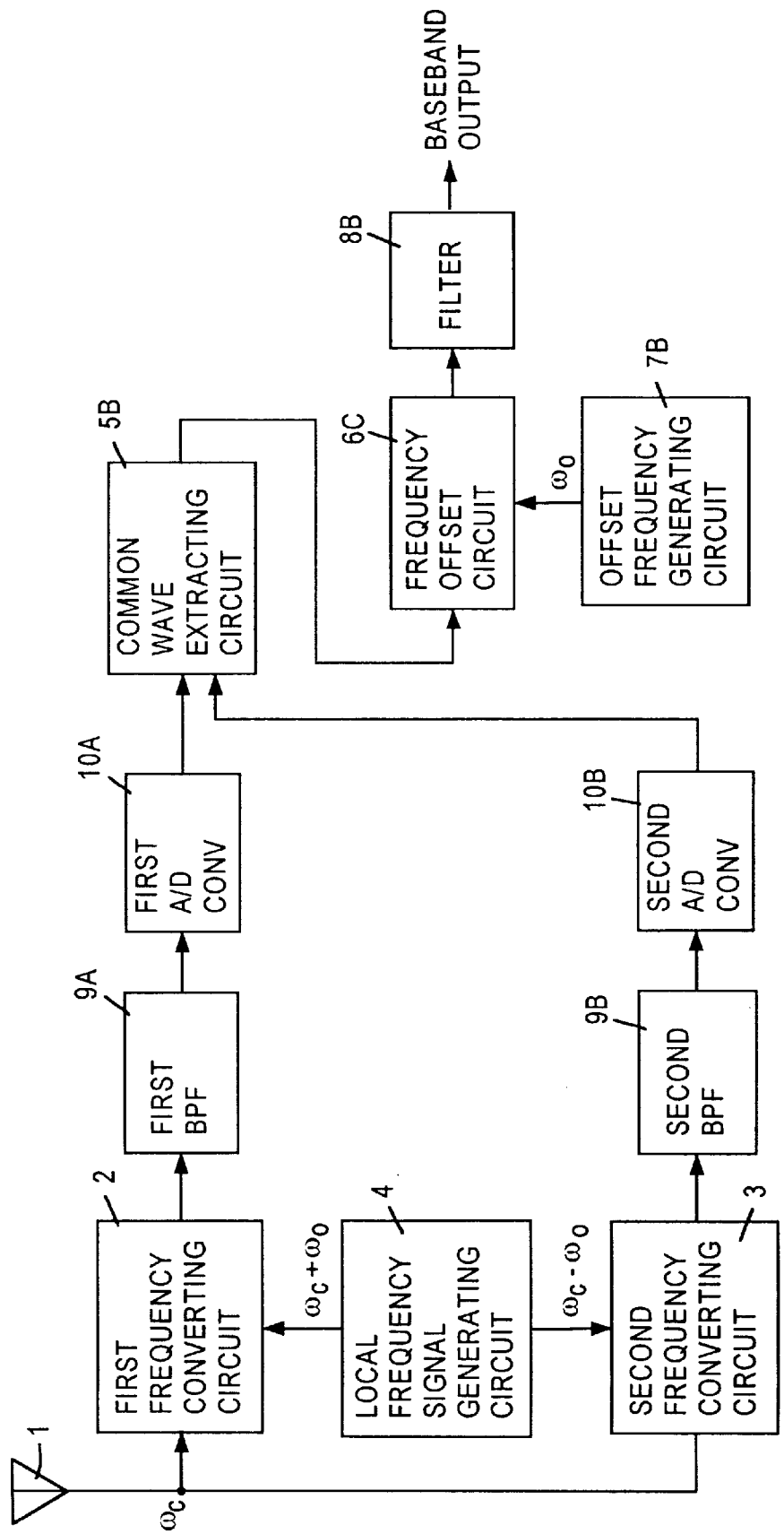
FIG. 3 is a block diagram showing an arrangement of a receiving circuit according to a third embodiment of this invention.

FIG. 3 illustrates an arrangement of a receiving circuit according to a third embodiment of this invention. In FIG. 3, included therein are an antenna 1 for accepting a signal being received, first and second frequency converting circuits 2, 3 for accepting the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first frequency converting circuit 2 while outputting the downside frequency as a conversion frequency input to the second frequency converting circuit 3, a first bandpass filter 9A for waveform-shaping the output of the first frequency converting circuit 2, a first A/D converter 10A for converting the output of the first bandpass filter 9A into a digital signal, a second bandpass filter 9B for waveform-shaping the output of the second frequency converting circuit 3, a second A/D converter 10B for converting the output of the second bandpass filter 9B into a digital signal, a common wave extracting circuit 5B for extracting a component present in common in both the outputs of the first and second A/D converters 10A and 10B, a frequency offset circuit 6C for removing a frequency offset remaining in the output of the common wave extracting circuit 5B, an offset frequency generating circuit 7B for performing a minute frequency conversion to supply the offset amount to the frequency offset circuit 6C, and a filter 8B for removing an unnecessary frequency component left in the output of the frequency offset circuit 6C.

Secondly, a description will be made hereinbelow of an operation of the receiving circuit according to the third embodiment of this invention. According to this embodiment, the outputs of the same two frequency converting circuits 2, 3 as in the aforementioned first embodiment are quantized with the A/D converters 10A, 10B, respectively, thereby providing processes equivalent to that of the first embodiment according to a digital calculation, that is, carrying out the common wave extraction, frequency offset, and filtering. The common wave extraction and filtering are possible with a digital filter technique, whereas the frequency offset is possible with a digital quadrature modulation.

Furthermore, the principle of this embodiment will be described hereinbelow in terms of a quadrature PSK, i.e., QPSK or quadruplet QAM. The base frequency, i.e., a QPSK signal $S_B$ in the baseband, is expressible as follows.

$$S_B = A\cos(\theta k) + j\, A\sin(\theta k) \tag{20}$$

where j denotes an imaginary unit indicative of an imaginary axis perpendicular to a real axis, A depicts an amplitude, and θk designates a phase representative of QPSK information:

$$\theta k = (\pm 1/4, \pm 3/4)\pi$$

When this baseband signal is modulated with the carrier angular frequency ωc, the resultant modulated output Sc can be expressed as follows.

$$\begin{aligned}S_C &= S_B \times a(\cos\omega ct + j\sin\omega ct) \\ &= A_C\{\cos(\omega ct + \theta k) + j\sin(\omega ct + \theta k)\} \\ A_C &= a \times \sqrt{2}\, A,\quad \theta k = \left(\pm\frac{1}{4}, \pm\frac{3}{4}\right)\pi \\ &= \frac{A_C}{2}[\cos\{\omega ct + \theta k\}] + \frac{A_C}{2}[j\sin(\omega ct + \theta k)]\end{aligned} \tag{21}$$

Generally, a real axis component is called an I-axis signal and an imaginary axis component is called a Q-axis signal. If this modulated signal is received and quadrature-demodulated with the frequency conversion local frequency ωc, the quadrature-demodulated I-axis output SIR is given as follows.

$$\begin{aligned}S_{IR} &= S_C \times b\cos\omega ct \\ &= \frac{A_C \cdot b}{2\times 2}[\cos\{\omega ct + \theta k\}\cos\omega ct] \\ &\text{if using } \frac{A_C \cdot b}{2} = A_R \\ &= A_R[\cos\{2\omega ct + \theta k\} + \cos\{\theta k\}]\end{aligned} \tag{22}$$

If this quadrature-demodulated I-axis Output $S_{IR}$ is passed through a low-pass filter to remove the high-frequency component 2ωc, the resultant output SIRF becomes as follows, thus allowing the demodulation of the I-axis signal of the quadrature PSK, i.e., QPSK.

$$S_{IRF} = A_R\cos(\theta k) \quad \theta k = \left(\pm\frac{1}{4}, \pm\frac{3}{4}\right)\pi \tag{23}$$

However, as well as the above description, in this instance, since the local oscillation frequency on the quadrature demodulation is equal to the carrier frequency ωc, this local oscillation frequency signal radiates from the receiver into the air, which can interfere with other nearby receivers. For this reason, when the local oscillation frequency of the receiver is set to ωc+ωo as noted before, the I-axis output $S_{IR}$ on the quadrature demodulation becomes as follows.

$$\begin{aligned}S_{IR} &= S_C \times b\cos(\omega c + \omega o)t \\ &= \frac{A_C \cdot b}{2}[\cos\{\omega ct + \theta k\}\cos(\omega c + \omega o)t] \\ &\text{if using } \frac{A_C \cdot b}{2} = A_R \\ &= A_R[\cos\{(2\omega c + \omega o)t + \theta k\} + \cos(\omega ot + \theta k)]\end{aligned} \tag{24}$$

If this quadrature-demodulated I-axis output $S_{IR}$ is passed through a low-pass filter to remove the high-frequency component 2ωc, the resultant output SIRF becomes as follows, thus providing an I-axis output of the quadrature PSK, i.e., QPSK.

$$S_{IRF} = A_R[\cos(\omega ot + \theta k)] \tag{25}$$

Subsequently, the local oscillation frequency is set to ωc−ωo lower by ωo than the carrier frequency of the desired channel. In this case, the frequency-converted output $S_{IL}$ becomes as follows.

$$\begin{aligned}S_{IL} &= S_C \times b\cos(\omega c - \omega o)t \\ &= \frac{A_C \cdot b}{2}[\cos(\omega ct + \theta k)\cos(\omega c - \omega o)t] \\ &\text{if using } \frac{A_C \cdot b}{2} = A_R \\ &= A_R[\cos\{2\omega c - \omega ot + \theta k\} + \cos\{-\omega ot + \theta k\}]\end{aligned} \tag{26}$$

If this quadrature-demodulated I-axis output $S_{IL}$ is passed through a low-pass filter to remove the high-frequency component 2ωc, the resultant Output $S_{ILF}$ is given as follows.

$$S_{ILF} = A_R\cos\{-\omega ot + \theta k\} \quad \theta k = \left(\pm\frac{1}{4}, \pm\frac{3}{4}\right)\pi \tag{27}$$

If the quadrature-demodulated I-axis output $S_{IRh}$ is passed through a low-pass filter to remove the high-frequency component 2ωc, the output $S_{IRFh}$ is obtainable.

The signal, demodulated, of adjacent channels being an equal distance from the reception local oscillation frequency is as follows. That is, when the carrier frequency is taken as ωch, the upside adjacent channel signal takes each ωch =ωc+2ωo, and hence, if the local oscillation frequency is ωc+ωo, the quadrature-demodulated I-axis output $S_{IRh}$ becomes as follows.

$$\begin{aligned}S_{IRh} &= S_{Ch} \times b\cos(\omega c + \omega o)t \\ &= \frac{A_{Ch} \cdot b}{2}[\cos\{\omega ct + 2\omega ot + \theta h\}\cos(\omega c + \omega o)t] \\ &\text{if using } \frac{A_{Ch} \cdot b}{2} = A_{Rh} \\ S_{IRh} &= A_{Rh}[\cos\{(2\omega c + 3\omega o)t + \theta h\} + \cos\{\omega ot + \theta h\}]\end{aligned} \tag{28}$$

If this quadrature-demodulated I-axis output $S_{IRh}$ is passed through a low-pass filter to remove the high-frequency component 2ωc, the resultant output $S_{IRFh}$ becomes as follows, thus producing a quadrature PSK, i.e., QPSK signal, present in the same band as that of the desired channel.

$$S_{IRFh} = A_{Rh}[\cos(\omega ot + \theta h)] \quad \theta k = \left(\pm \frac{1}{4}, \pm \frac{3}{4}\right)\pi \quad (29)$$

Going the other way, when the carrier frequency is given by $\omega c_1$, the downside adjacent channel signal represents $\omega c_1 = \omega c - 2\omega o$. Accordingly, when the local oscillation frequency is set to $\omega c + \omega o$ as noted before, the reception side quadrature-demodulated I-axis output $S_{IR1}$ becomes as follows.

$$S_{IRl} = S_{Cl} \times b \cos(\omega c + \omega o)t \quad (30)$$

$$= \frac{A_{Cl} \cdot b}{2}[\cos\{(\omega c - 2\omega o)t + \theta l\}\cos(\omega c + \omega o)t]$$

if using $\frac{A_{Cl} \cdot b}{2} = A_{Rl}$ $$= A_{Rl}[\cos(2\omega ct - \omega ot + \theta l) + \cos(-\omega ot + \theta l)]$$

If this quadrature-demodulated I-axis output $S_{IR1}$ is passed through a low-pass filter to remove the high-frequency component $2\omega c$, the resultant output $S_{IRF1}$ is given as follows, thus producing a quadrature PSK, i.e., QPSK signal, at the same frequency as that of the desired channel.

$$S_{IRFl} = A_{Rl}[\cos(-\omega ot + \theta l)] \quad \theta k = \left(\pm \frac{1}{4}, \pm \frac{3}{4}\right)\pi \quad (31)$$

Subsequently, when the local oscillation frequency of the receiver is set to $\omega c + \omega o$ as noted before and its phase is delayed by $\pi/2$, the quadrature-demodulated Q-axis output $S_{QR}$ is obtainable as follows.

$$S_{QR} = S_C \times b \sin(\omega c + \omega o)t \quad (32)$$

$$= \frac{A_C \cdot b}{2}[\cos(\omega ct + \theta k)\sin(\omega c + \omega o)t]$$

if using $\frac{A_C \cdot b}{2} = A_R$ $$= A_R[\sin\{(2\omega c + \omega o)t + \theta k\} + \sin(-\omega ot + \theta k)]$$

If this quadrature-demodulated Q-axis output $S_{QR}$ is passed through a low-pass filter to remove the high-frequency component $2\omega c$, the resultant output $S_{QRF}$ is given as follows, whereby the Q-axis output of the quadrature PSK, i.e., QPSK, is obtainable.

$$S_{QRF} = A_R \sin(-\omega ot + \theta k) \quad (33)$$

Let it be assumed that, in the case that the local oscillation frequency is set to $\omega c - \omega o$ lower by $\omega o$ than the carrier frequency of the desired channel, the phase is delayed by $\pi/2$. In this instance, the quadrature-demodulated Q-axis output SQL becomes as follows.

$$S_{QL} = S_C \times b \sin(\omega c - \omega o)t \quad (34)$$

$$= \frac{A_C \cdot b}{2}[\cos\{\omega ct + \theta k\}\sin(\omega c - \omega o)t]$$

if using $\frac{A_C \cdot b}{2} = A_R$ $$S_{QL} = A_R[\sin\{(2\omega c + \omega o)t + \theta k\} + \sin(\omega ot + \theta k)]$$

If this quadrature-demodulated Q-axis output $S_{QL}$ is passed through a low-pass filter to remove the high-frequency component $2\omega c$, the resultant output $S_{QLF}$ is given as follows, whereby the quadrature PSK signal Q-axis output different in polarity from $S_{QLF}$ is obtainable.

$$S_{QLF} = A_R \sin(\omega ot + \theta k) \quad \theta k = \left(\pm \frac{1}{4}, \pm \frac{3}{4}\right)\pi \quad (35)$$

Furthermore, the analysis of the adjacent channels will be made hereinbelow in terms of the quadrature-demodulated Q-axis output. When the carrier frequency is $\omega_{ch}$, the upside adjacent channel signal represents $\omega_{ch} = \omega c + 2\omega o$, and therefore, in the case that the local oscillation frequency is set to $\omega c + \omega o$, the quadrature-demodulated Q-axis output $S_{QRh}$ of the upside channel becomes as follows.

$$S_{QRh} = S_{Ch} \times b \sin(\omega c + \omega o)t \quad (36)$$

$$= \frac{A_{Ch} \cdot b}{2}[\cos\{\omega ct + 2\omega ot + \theta h\}\sin(\omega c + \omega o)t]$$

if using $\frac{A_{Ch} \cdot b}{2} = A_{Rh}$ $$= A_{Rh}[\sin\{(2\omega c + 3\omega o)t + \theta h\} + \sin(\omega ot + \theta h)]$$

If this quadrature-demodulated Q-axis Output $S_{QRh}$ is passed through a low-pass filter to remove the high-frequency component $2\omega c$, the resultant output $S_{QLFh}$ becomes as follows, which produces a quadrature PSK, i.e., QPSK signal Q-axis output present in the same band as that of the desired channel.

$$S_{QRFh} = A_{Rh}[\sin(\omega ot + \theta h)] \quad \theta h = \left(\pm \frac{1}{4}, \pm \frac{3}{4}\right)\pi \quad (37)$$

A similar process is effected for the downside adjacent channel. Since the carrier frequency $\omega_{c1}$ is $\omega_{c1} = \omega c - 2\omega o$, the quadrature-demodulated Q-axis output $S_{QR1}$ at the local oscillation frequency $\omega c + \omega o$ becomes as follows.

$$S_{QRl} = S_{Cl} \times b \sin(\omega c + \omega o)t \quad (38)$$

$$= \frac{A_{Cl} \cdot b}{2}[\cos\{(\omega c - 2\omega o)t + \theta l\}\sin(\omega c + \omega o)t]$$

if using $\frac{A_{Cl} \cdot b}{2} = A_{Rl}$ $$= A_{Rl}[\sin(2\omega ct - \omega ot + \theta l) + \sin(-3\omega ot + \theta l)]$$

If this quadrature-demodulated Q-axis output $S_{QR1}$ is passed through a low-pass filter to remove the high-frequency component $2\omega c$, the resultant output $S_{QRF1}$ is given as follows, thus producing a quadrature PSK, i.e., QPSK, signal Q-axis output at a frequency separated by $3\omega o$ from the desired channel.

$$S_{QRFl} = A_{Rl}\sin(-3\omega ot + \theta l) \quad \theta l = \left(\pm \frac{1}{4}, \pm \frac{3}{4}\right)\pi \quad (39)$$

$$S_{QRF1} = A_{R1}\sin(-3\omega ot + \theta 1) \quad (39)$$

$\theta 1 = (\pm \frac{1}{4}, \pm \frac{3}{4})\pi$

On the other hand, if the local oscillation frequency is set to $\omega c - \omega o$, the quadrature-demodulated Q-axis output $S_{QR}$ of the adjacent channel becomes as follows. That is, since the carrier frequency $\omega_{ch}$ for the upside adjacent channel signal is $\omega_{ch}=\omega c+2\omega o$, the quadrature-demodulated Q-axis output $S_{QRh}$ at the local oscillation frequency $\omega c-\omega o$ becomes as follows.

$$S_{QRh} = S_{Ch} \times b \, \sin(\omega c - \omega o)t \qquad (40)$$

$$= \frac{A_{Ch} \cdot b}{2} [\cos\{\omega ct + 2\omega ot + \theta h\} \sin(\omega c - \omega o)t]$$

if using $\dfrac{A_{Ch} \cdot b}{2} = A_{Rh}$ $$S_{QRh} = A_{Rh}[\sin\{(2\omega c + \omega o)t + \theta h\} + \sin(3\omega ot + \theta h)]$$

If this quadrature-demodulated Q-axis output $S_{QRh}$ is passed through a low-pass filter to remove the high-frequency component $2\omega c$, the resultant output $S_{QRFh}$ is given as follows, thus producing a quadrature PSK, i.e., QPSK, signal Q-axis output present in a band separated by $3\omega o$ from the desired channel.

$$S_{QRFh} = A_{QRh}[\sin(3\omega ot + \theta h)] \quad \theta h = \left(\pm\frac{1}{4}, \pm\frac{3}{4}\right)\pi \qquad (41)$$

A similar process is implemented in terms of the downside adjacent channel signal. The carrier frequency $\omega_{cl}$ is $\omega_{cl}=\omega c-2\omega o$, and the local oscillation frequency of the receiver is $\omega c-\omega o$. Thus, the quadrature-demodulated Q-axis output $S_{QRl}$ becomes as follows.

$$S_{QRl} = S_{Cl} \times b \, \sin(\omega c - \omega o)t \qquad (42)$$

$$= \frac{A_{Cl} \cdot b}{2} [\cos\{(\omega c - 2\omega o)t + \theta l\} \sin(\omega c - \omega o)t]$$

if using $\dfrac{A_{Cl} \cdot b}{2} = A_{Rl}$ $$= A_{Rl}[\sin\{(2\omega c - 3\omega o)t + \theta l\} + \sin(-\omega ot + \theta l)]$$

If this quadrature-demodulated Q-axis output $S_{QR1}$ is passed through a low-pass filter to remove the high-frequency component $2\omega c$, the resultant output $S_{QRF1}$ is given as follows, thus producing a quadrature PSK, i.e., QPSK, signal Q-axis output at the same frequency as that of the desired channel.

$$S_{QRFl} = A_{Rl}[\sin(-\omega ot + \theta l)] \quad \theta l = \left(\pm\frac{1}{4}, \pm\frac{3}{4}\right)\pi \qquad (43)$$

In summary, the above description becomes as follows.

I-Axis Quadrature-Demodulated Output

I-Axis Quadrature-Demodulated Output (44)

Output at Upside Local Frequency

| | | |
|---|---|---|
| $S_{IRF} = A_R \, [\cos(-\omega ot + \theta k)]$ | | desired channel |
| $S_{IRFh} = A_{Rh} \, [\cos(\omega ot + \theta h)]$ | | upside channel |
| $S_{IRFl} = A_{Rl} \, [\cos(-3\omega ot + \theta l)]$ | | downside channel |

Output at Downside Local Frequency

| | | |
|---|---|---|
| $S_{ILF} = A_R \, [\cos(\omega ot + \theta k)]$ | | desired channel |
| $S_{ILFh} = A_{Rh} \, [\cos(3\omega ot + \theta h)]$ | | upside channel |
| $S_{ILFl} = A_{Rl} \, [\cos(-\omega ot + \theta l)]$ | | downside channel |

Q-Axis Quadrature-Demodulated Output (45)

Output at Upside Local Frequency

| | | |
|---|---|---|
| $S_{QRF} = A_R \, [\sin(-\omega ot + \theta k)]$ | | desired channel |
| $S_{QRFh} = A_{Rh} \, [\sin(\omega ot + \theta h)]$ | | upside channel |
| $S_{QLFh} = A_{Rh} \, [\sin(-3\omega ot + \theta h)]$ | | downside channel |

Output at Downside Local Frequency

| | | |
|---|---|---|
| $S_{QLF} = A_R \, [\sin(\omega ot + \theta k)]$ | | desired channel |
| $S_{QRFl} = A_{Rl} \, [\sin(3\omega ot + \theta l)]$ | | upside channel |
| $S_{QLFl} = A_{Rl} \, [\sin(-\omega ot + \theta l)]$ | | downside channel |

It is found from the above equations that, as described before, in the I-axis side the desired channel is contained in common in the outputs of the two quadrature-demodulating circuits, while in the Q-axis side the desired channel is contained in common and in antiphase in the outputs of the two quadrature-demodulating circuits. The third embodiment of this invention is realized on the basis of this principle.

Fourth Embodiment

Figure 4:
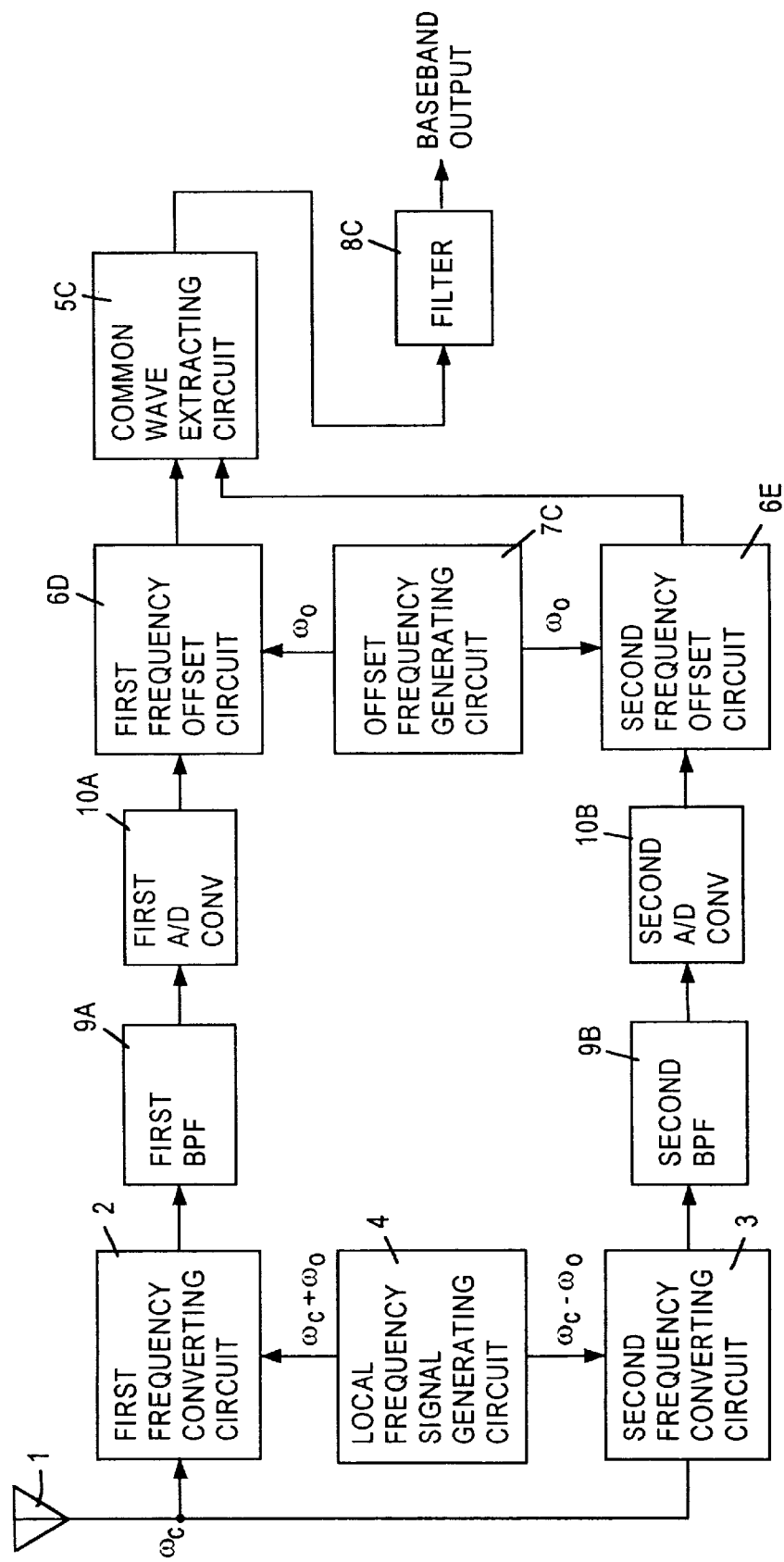
FIG. 4 is a block diagram showing an arrangement of a receiving circuit according to a fourth embodiment of this invention.

FIG. 4 shows an arrangement of a receiving circuit according to a fourth embodiment of this invention. In FIG. 4, included therein are an antenna 1 for accepting a signal being received, first and second frequency converting circuits 2, 3 for accepting the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first frequency converting circuit 2 while outputting the downside frequency as a conversion frequency input to the second frequency converting circuit 3, a first bandpass filter 9A for waveform-shaping the output of the first frequency converting circuit 2, a first A/D converter 10A for converting the output of the first bandpass filter 9A into a digital signal, a second bandpass filter 9B for waveform-shaping the output of the second frequency converting circuit 3, a second A/D converter 10B for converting the output of the second bandpass filter 9B into a digital signal, a first frequency offset circuit 6D for removing a frequency offset contained in the output of the first A/D converter 10A, a second frequency offset circuit 6E for removing a frequency offset contained in the output of the second A/D converter 10B, an offset frequency generating circuit 7C for performing a minute frequency conversion to supply the offset amount to the respective frequency offset circuits 6D and 6E, a common wave extracting circuit 5C for extracting a component present in common in both the outputs of the first and second frequency offset circuits 6D and 6E, and a filter 8C for removing an unnecessary frequency component left in the output of the common wave extracting circuit 5C.

Secondly, a description will be made hereinbelow of an operation of the receiving circuit according to the fourth embodiment of this invention. In this embodiment, the process of performing a frequency offset is interchanged with the common wave extracting process as compared with the aforementioned third embodiment. The preceding execution of the frequency offset process allows the desired channel signal to directly constitute the base signal and permits a more stable extraction to be expectable. In addition, digitalization allows the quadrature-demodulating function with a high accuracy, provides the suitability for integration, and causes the reduction of the power consumption.

Fifth Embodiment

Figure 5:
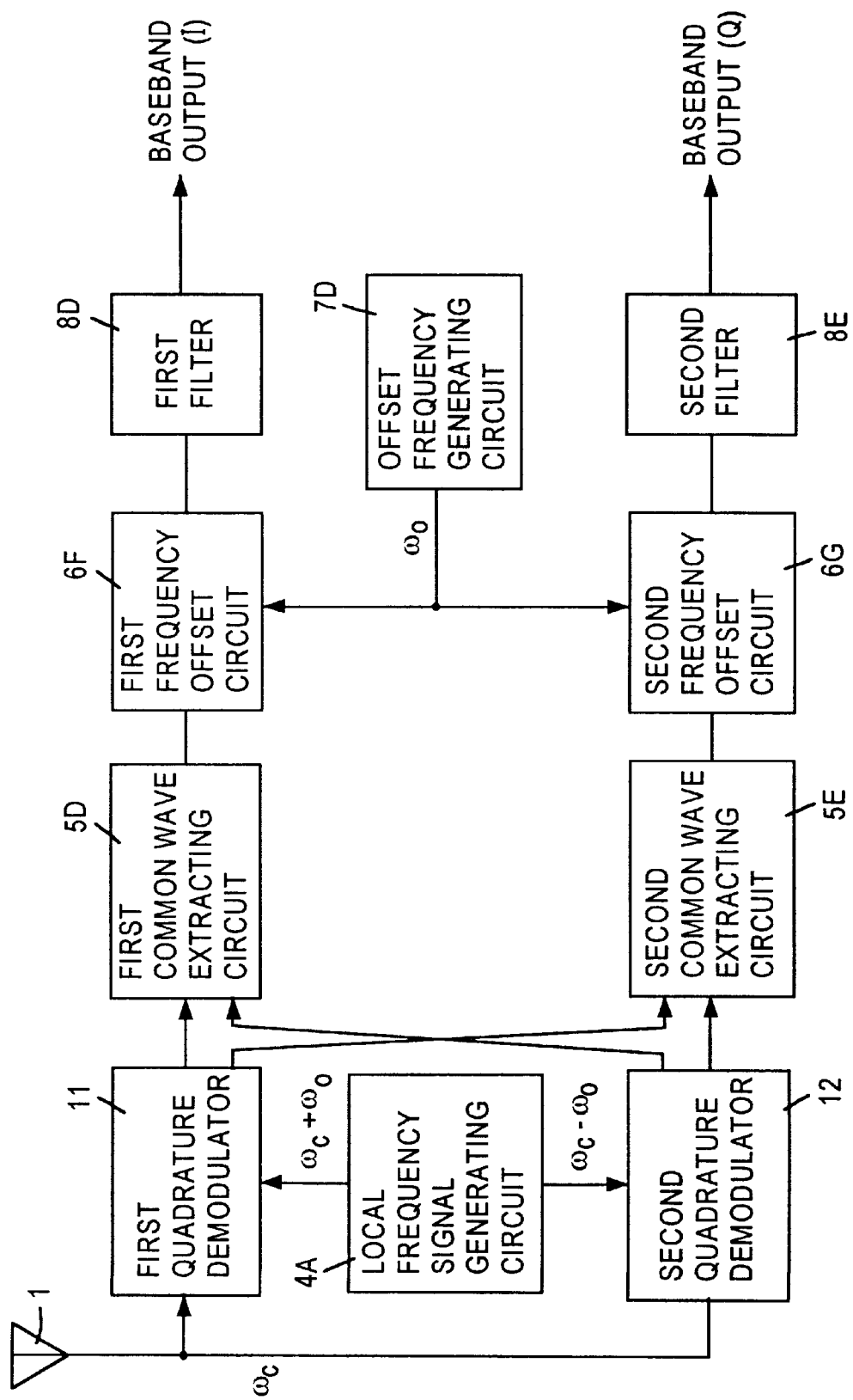
FIG. 5 is a block diagram showing an arrangement of a receiving circuit according to a fifth embodiment of this invention.

FIG. 5 is an illustration of an arrangement of a receiving circuit according to a fifth embodiment of this invention. In FIG. 5, there are shown an antenna 1 for accepting a signal being received, first and second quadrature demodulating circuits 11 and 12 for receiving the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first quadrature demodulating circuit 11 while outputting the downside frequency as a conversion frequency input to the second quadrature demodulating circuit 12, a first common wave extracting circuit 5D for extracting a component present in common in both the I outputs of the first and second quadrature demodulating circuits 11 and 12, a second common wave extracting circuit 5E for extracting a component present in common in both the Q output of the first quadrature demodulating circuit 11 and the Q output of the second quadrature demodulating circuit 12 reversed in polarity, a first frequency offset circuit 6F for removing a frequency offset remaining in the I side output extracted through the first common wave extracting circuit 5D, a second frequency offset circuit 6G for removing a frequency offset remaining in the Q side output extracted through the second common wave extracting circuit 5E, an offset frequency generating circuit 7D for performing a minute frequency conversion to supply the offset amount to the respective frequency offset circuits 6F and 6G, a first filter 8D for removing an unnecessary frequency component remaining in the output of the first frequency offset circuit 6F, and a second filter 8E for removing an unnecessary frequency component remaining in the output of tie second frequency offset circuit 6G.

Secondly, a description will be made hereinbelow of an operation of the receiving circuit according to the fifth embodiment. In this embodiment, the concept of this invention is applied to a quaternary PSK, i.e., QPSK, of the digital modulation. According to the above description referring to the aforementioned equations, the received signal obtained from the antenna 1 is supplied to the first and second quadrature demodulating circuits 11 and 12, while the local frequency signal generating circuit 4A separately supplies two different frequencies, that is, the upside and downside frequencies comparable with the central value between the channels, to the first and second quadrature demodulating circuits 11 and 12, which produces four output signals in terms of each of three signals of the desired channel, the upside channel and the downside channel. According to the equation developments, the signal component present in common in both the first and second quadrature demodulating circuits 11 and 12 is only the desired channel signal, and the I-axis side is extractable as a balanced component, whereas the Q-axis side is extractable as a differential component. Accordingly, if the I-axis side balanced component is fed to the common wave extracting circuit SD and the Q-axis side differential component is fed to the common wave extracting component 5E, the I-axis signal and Q-axis signal of the desired channel are obtainable. Since a frequency offset of ωo remains in the outputs of the common wave extracting circuits SD and SE, a minute frequency conversion is made in the offset frequency generating circuit 7D so that the offset amount is removed in the frequency offset circuits 6F and 6G. In addition, the unnecessary frequency component generated in this process is removed in the filters 8D and 8E, before the signal is supplied as a baseband signal to the baseband signal processing section.

Sixth Embodiment

Figure 6:
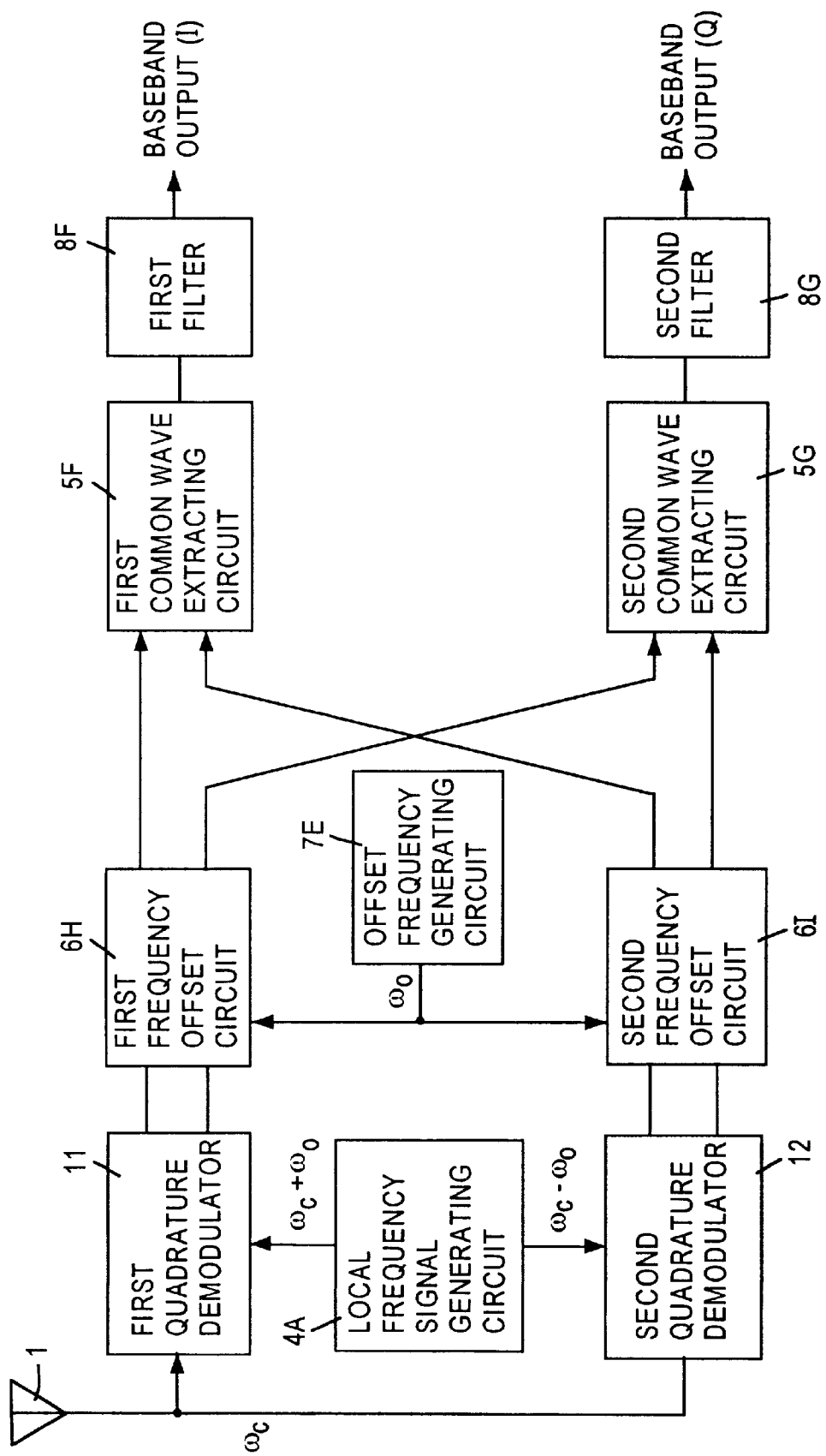
FIG. 6 is a block diagram showing an arrangement of a receiving circuit according to a sixth embodiment of this invention.

FIG. 6 is an illustration of an arrangement of a receiving circuit according to a sixth embodiment of this invention. In FIG. 6, there are shown an antenna 1 for accepting a signal being received, first and second quadrature demodulating circuits 11 and 12 for receiving the received signal, a local frequency signal generating circuit 4A for generating middle frequencies between the radio carrier frequency of the received signal and the radio carrier frequencies of the adjacent upside and downside channels and for outputting the upside frequency of the upside and downside two wave frequencies as a conversion frequency input to the first quadrature demodulating circuit 11 while outputting the downside frequency as a conversion frequency input to the second quadrature demodulating circuit 12, first and second frequency offset circuits 6H and 6I for removing a frequency offset contained in common in the I output and Q output of the respective quadrature demodulating circuits 11 and 12, an offset frequency generating circuit 7E for carrying out a minute frequency conversion to supply the offset amount to the respective frequency offset circuits 6H and 6I, a first common wave extracting circuit 5F for extracting a component present in common in both the I outputs of the first and second frequency offset circuits 6H and 6I, a second common wave extracting circuit 5G for extracting a component present in common in both the Q output of the first frequency offset circuit 6H and the Q output of the second frequency offset circuit 6I reversed in polarity, and first and second filters 8F and 8G for removing unnecessary frequency components remaining in the outputs of the respective common wave extracting circuits 5F and 5G.

Secondly, a description will be made hereinbelow of an operation of the receiving circuit of the sixth embodiment. In this embodiment, the common wave extracting process is interchanged with the frequency offset process as compared with the aforementioned fifth embodiment. When the frequency offset process is executed precedently, the desired channel signal directly becomes a base signal, which allows more stable extraction to be expectable.

Seventh Embodiment

Figure 7:
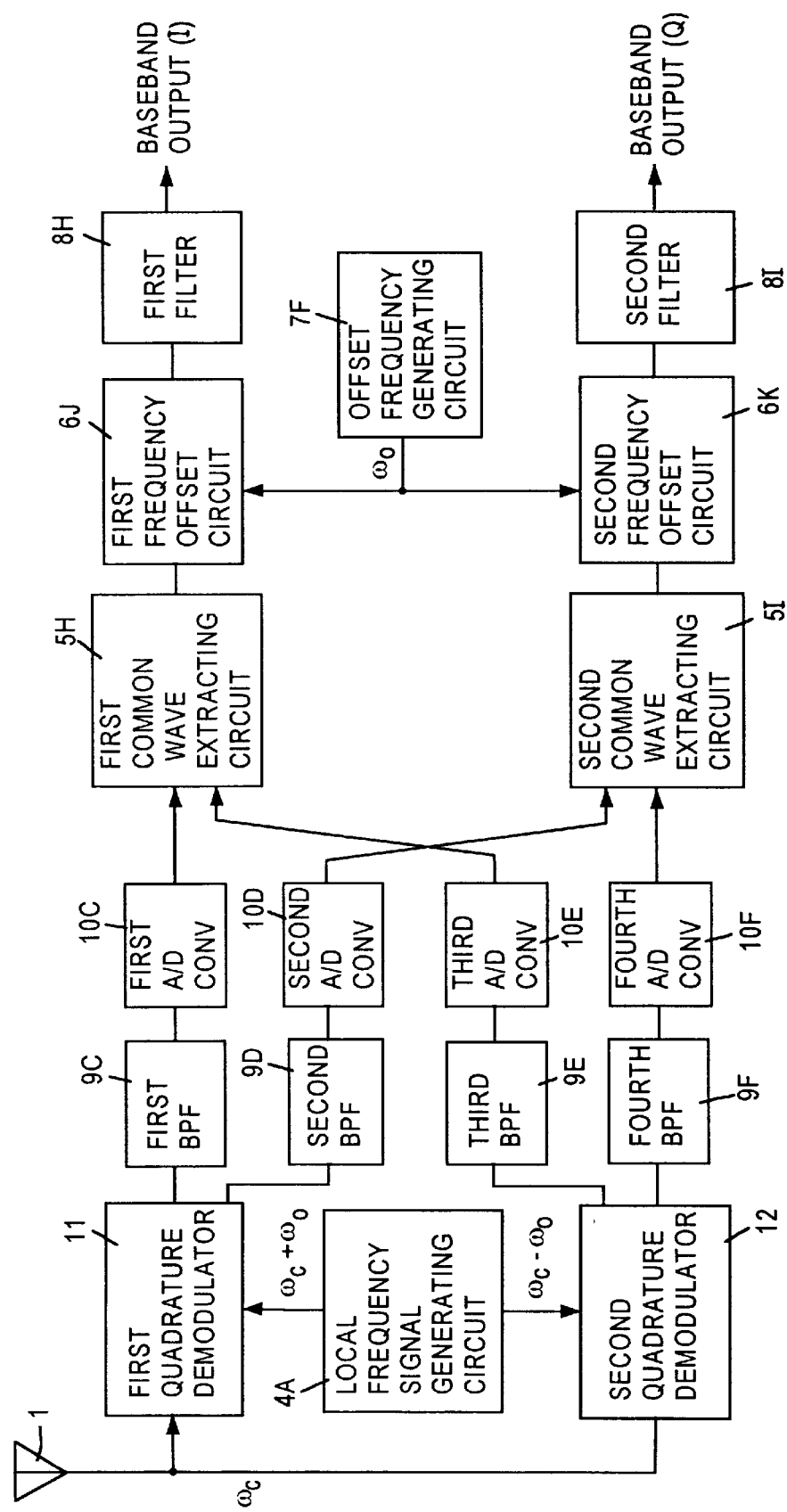
FIG. 7 is a block diagram showing an arrangement of a receiving circuit according to a seventh embodiment of this invention.

FIG. 7 shows an arrangement of a receiving circuit according to a seventh embodiment of this invention. In FIG. 7, there are shown an antenna 1 for accepting a signal being received, first and second quadrature demodulating circuits 11 and 12 for receiving the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first quadrature demodulating circuit 11 while outputting the downside frequency as a conversion frequency input to the second quadrature demodulating circuit 12, first and second bandpass filters 9C and 9D for waveform-shaping the I output and Q output of the first quadrature demodulating circuit 11, respectively, first and second A/D converters 10C and 10D for converting the outputs of the first and second bandpass filter 9C and 9D into digital signals, respectively, third and fourth band pass filters 9E and 9F for waveform-shaping the I output and Q output of the second quadrature demodulating circuit 12, respectively, third and fourth A/D converters 10E and 10F for converting the outputs of the third and fourth bandpass filters 9E and 9F into digital signals, respectively, a first common wave extracting circuit 5H for extracting a component present in common in the I outputs of the first and third A/D converters 10C and 10E, a second common wave extracting circuit 5I for extracting a component present in common in the Q output of the second A/D converter 10D and the Q output of the fourth A/D converter 10E reversed in polarity, a first frequency offset circuit 6J for removing a frequency offset remaining in the I side output extracted through the first common wave extracting circuit 5H, a second frequency offset circuit 6K for removing a frequency offset remaining in the Q side output extracted through the second common wave extracting circuit 5I, an offset frequency generating circuit 7F for carrying out a minute frequency conversion to supply the offset amount to the respective frequency offset circuits 6J and 6K, a first filter 8H for removing an unnecessary frequency component left in the output of the first frequency offset circuit 6J, and a second filter 8I for removing an unnecessary frequency component left in the output of the second frequency offset circuit 6K.

Secondly, a description will be made hereinbelow of an operation of the receiving circuit according to this seventh embodiment. In this seventh embodiment, the outputs of the same two quadrature demodulating circuits 11, 12 as in the aforementioned fifth embodiment are quantized with the A/D converters 10C to 10F so as to accomplish an operation equivalent to that of the fifth embodiment by means of the digital calculation, that is, to perform the common wave extraction, the frequency offset and the filtering. The common wave extraction and the filtering are possible by the digital filter technique, while the frequency offset is possible by the digital quadrature modulation.

Eighth Embodiment

Figure 8:
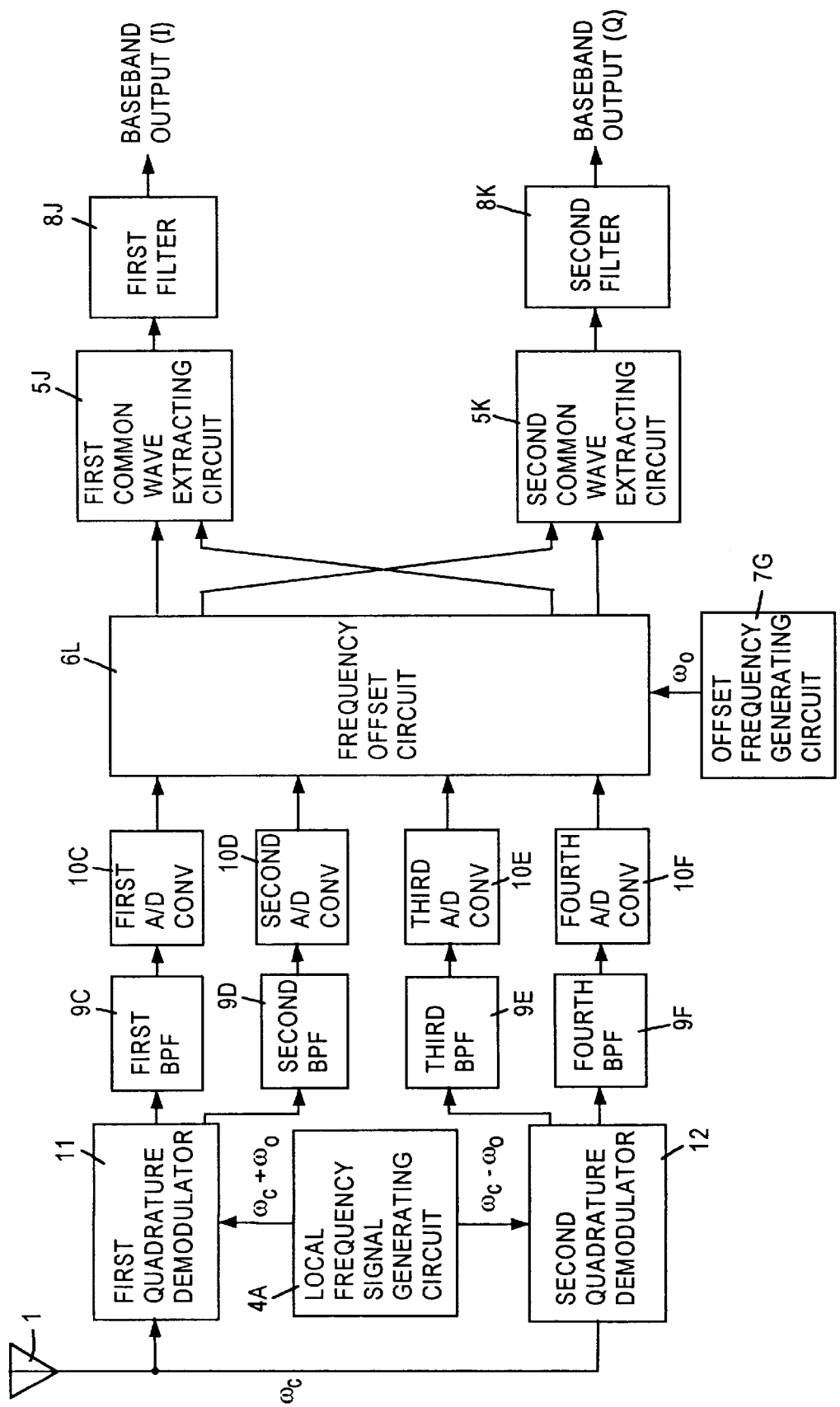
FIG. 8 is a block diagram showing an arrangement of a receiving circuit according to an eighth embodiment of this invention.

FIG. 8 shows an arrangement of a receiving circuit according to an eighth embodiment of this invention. In FIG. 8, there are shown an antenna 1 for accepting a signal being received, first and second quadrature demodulating circuits 11 and 12 for receiving the received signal, a local frequency signal generating circuit 4 for generating middle frequencies between the radio carrier frequency of the received signal and the radio carrier frequencies of the adjacent upside and downside channels and for outputting the upside frequency of the upside and downside two wave frequencies as a conversion frequency input to the first quadrature demodulating circuit 11 while outputting the downside frequency as a conversion frequency input to the second quadrature demodulating circuit 12, first and second bandpass filters 9C and 9D for waveform-shaping the I output and Q output of the first quadrature demodulating circuit 11, respectively, first and second A/D converters 10C and 10D for converting the outputs of the first and second bandpass filter 9C and 9D into digital signals, respectively, third and fourth band pass filters 9E and 9F for waveform-shaping the I output and Q output of the second quadrature demodulating circuit 12, respectively, third and fourth A/D converters 10E and 10F for converting the outputs of the third and fourth bandpass filters 9E and 9F into digital signals, respectively, a frequency offset circuit 6L for removing frequency offsets remaining in the I outputs and Q outputs of the respective A/D converters 10C to 10F, an offset frequency generating circuit 7G for performing a minute frequency conversion to supply the offset amount to the respective frequency offset circuit 6L, a first common wave extracting circuit 5J for extracting a component present in common in the I outputs of the frequency offset circuit 6L, a second common wave extracting circuit 5K for extracting a component present in common in the Q output and the polarity-reversed Q output of the frequency offset circuit 6L, a first filter 8J for removing an unnecessary frequency component left in the I output extracted through the first common wave extracting circuit 5J, and a second filter 8K for removing an unnecessary frequency component left in the Q output of the second common wave extracting circuit 5K.

Secondly, a description will be made hereinbelow of an operation of the receiving circuit according to the eighth embodiment. In this embodiment, the common wave extraction process is interchanged with the frequency offset process as compared with the aforementioned seventh embodiment. That is, the preceded frequency offset process permits the desired channel signal to directly become a base signal, which makes more stable extraction expectable. In addition, the digitalization allows the quadrature-demodulating function with a high accuracy, provides the suitability for integration, and causes the reduction of the power consumption.

Ninth Embodiment

Figure 9:
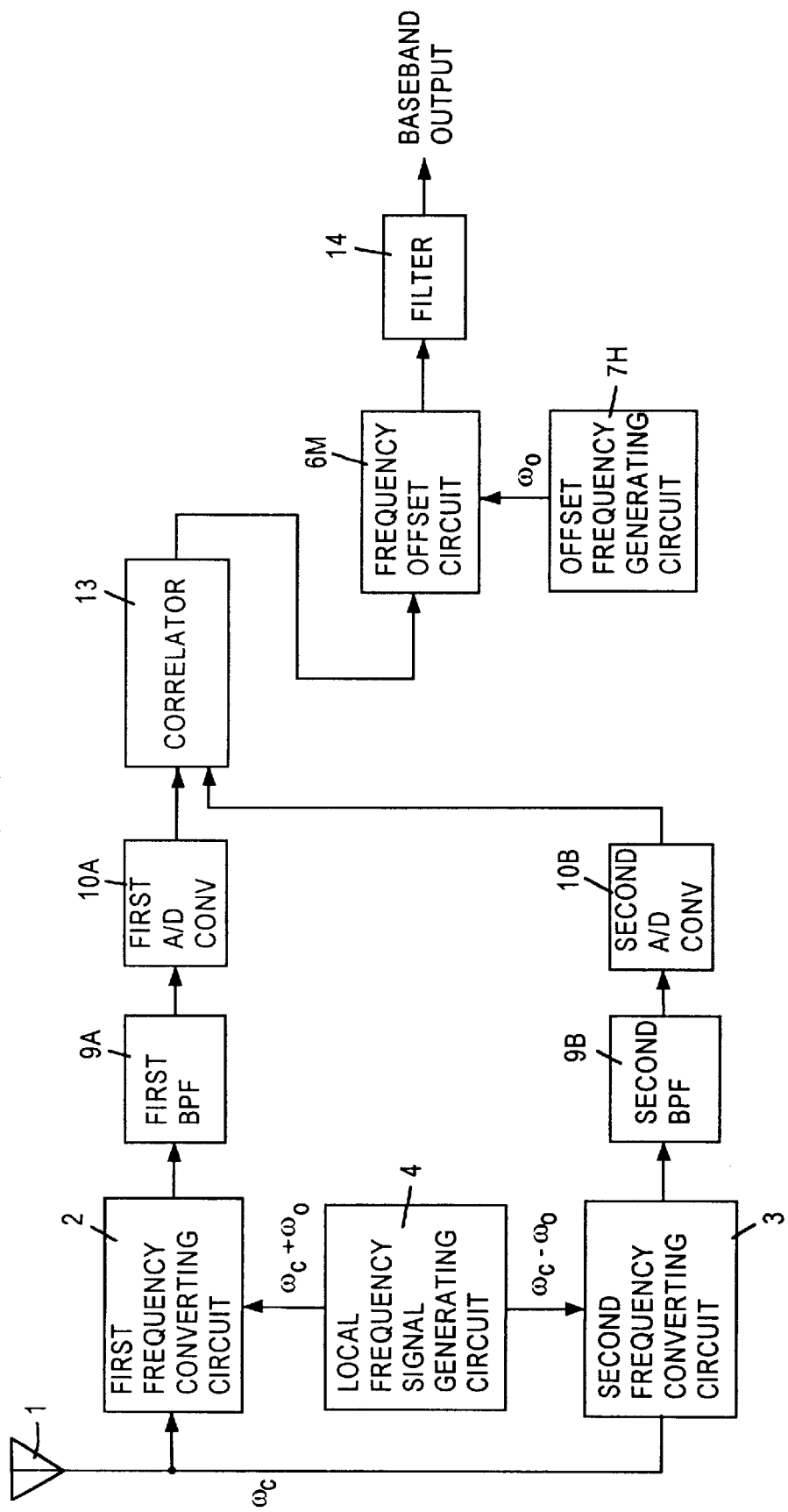
FIG. 9 is a block diagram showing an arrangement of a receiving circuit according to a ninth embodiment of this invention.

FIG. 9 is an illustration of an arrangement of a receiving circuit according to a ninth embodiment of this invention. In this embodiment, a correlator 13 for calculating a cross-correlation is used in place of the common wave extracting circuit 5B in the third embodiment shown in FIG. 3. According to this embodiment, since the common wave extraction is effected by the digital filter technique, although the use of the correlator 13 causes the inversion of the polarity of the correlation coefficient if the components contained in common are different in polarity from each other, the correlator 13 can ensure its amplitude as it is. This feature of this embodiment is also applicable to the above-described fourth, seventh and eighth embodiments.

Tenth Embodiment

Figure 10:
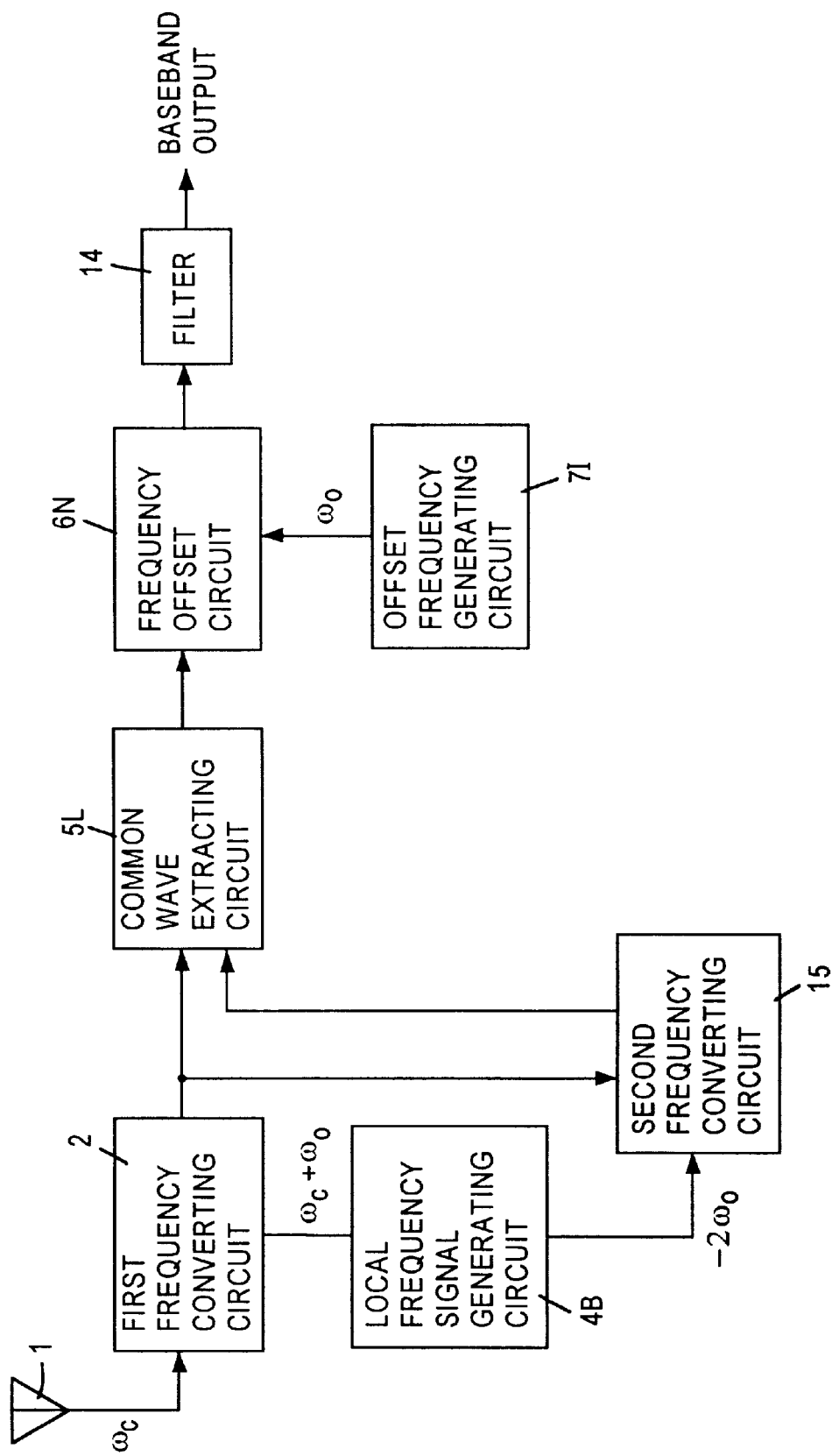
FIG. 10 is a block diagram showing an arrangement of a receiving circuit according to a tenth embodiment of this invention.

FIG. 10 is an illustration of an arrangement of a receiving circuit according to a tenth embodiment of this invention. In this embodiment, only the first frequency converting circuit 2 is provided for accepting the received signal from the antenna 1, as compared with the first embodiment shown in FIG. 1. After the frequency conversion by this first frequency converting circuit 2, a second frequency converting circuit 15, accepting a frequency corresponding to the inter-channel frequency 2ωo from the local frequency signal generating circuit 4B, provides a frequency-converted output in the side where the frequency conversion is not made by the first frequency converting circuit 2, thus ensuring two frequency-converted outputs necessary for the desired channel extraction by a common wave extracting circuit 5L.

Accordingly, in this embodiment, the outputs of the first and second frequency converting circuits 2 and 15 agree with the two outputs of the first and second frequency converting circuits 2 and 3 in the first embodiment, and hence the treatment of the carrier frequency is possible with only one high-frequency circuit set, with the result that not only the space necessary for the circuit but also the power consumption are reducible. The feature of this embodiment is also applicable to the second embodiment.

Eleventh Embodiment

Figure 11:
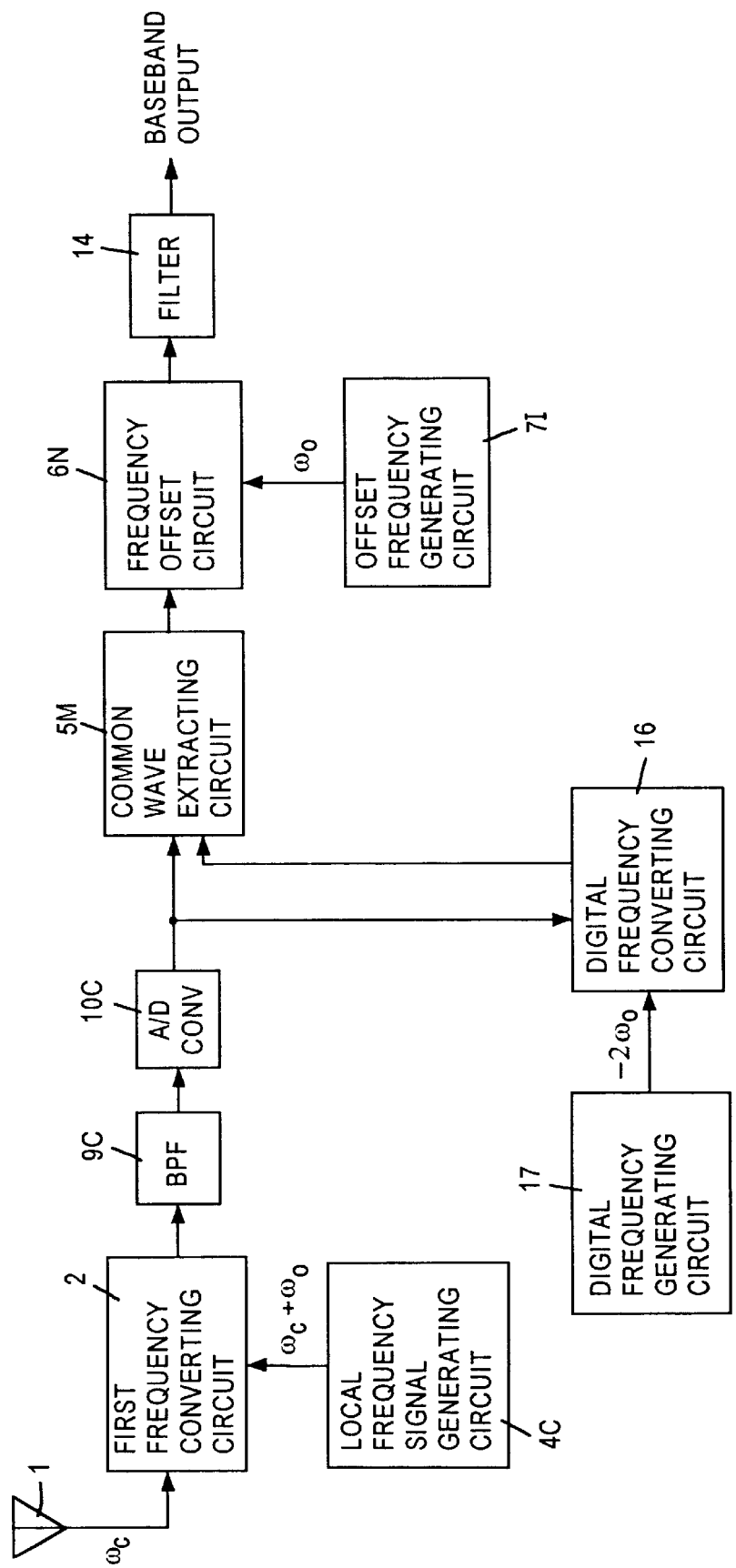
FIG. 11 is a block diagram showing an arrangement of a receiving circuit according to an eleventh embodiment of this invention.

FIG. 11 is an illustration of an arrangement of a receiving circuit according to an eleventh embodiment of this invention. In this embodiment, as compared with the third embodiment shown in FIG. 3, the frequency converting circuit for accepting the received signal is effected with only the first frequency converting circuit 2 and further the quantizing means is constructed with only a bandpass filter 9C and an A/D converter 10C responsive to the output of the first frequency converting circuit 2. After the A/D conversion by the A/D converter 10C, a digital frequency converting circuit 16, accepting a frequency corresponding to the inter-channel frequency 2ωo from a digital frequency generating circuit 17, carries a digital frequency conversion, thus providing a frequency-converted output of the side where the frequency conversion is not made by the first frequency converting circuit 2 so as to obtain two frequency-converted digital outputs necessary for the extraction of the desired channel by a common wave extracting circuit 5M.

Thus, according to this embodiment, the output of the first frequency converting circuit 2 A/D-converted through the A/D converter 10C and the output of the digital frequency converting circuit 16 coincide with the two outputs of the first and second frequency converting circuits 2 and 3 in the above-mentioned third embodiment, with the result that the treatment of the carrier frequency is possible with only on a high-frequency circuit set, which makes it possible to reduce the space necessary for the circuit as well as the power consumption. The feature of this embodiment is also applicable to the fourth embodiment.

Twelfth Embodiment

Figure 12:
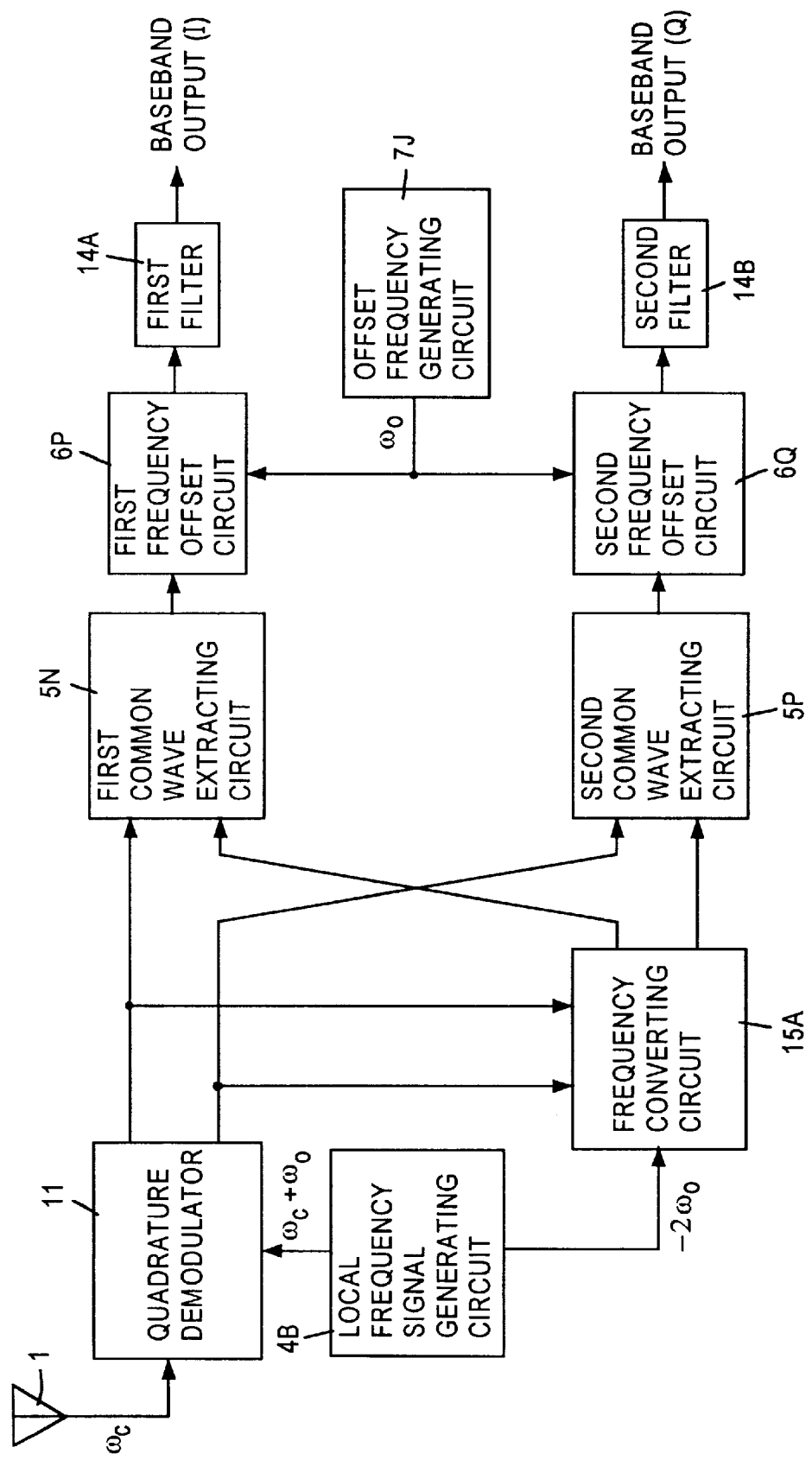
FIG. 12 is a block diagram showing an arrangement of a receiving circuit according to a twelfth embodiment of this invention.

FIG. 12 is an illustration of an arrangement of a receiving circuit according to a twelfth embodiment of this invention. A feature of this embodiment is that as compared with the fifth embodiment shown in FIG. 5 the quadrature demodulating means for accepting the received signal is constructed with only one quadrature demodulating circuit 11 and the two outputs of the quadrature demodulating circuit 11 are frequency-converted in a frequency converting circuit 15A which accepts a frequency corresponding to the inter-channel frequency 2ωo from a local frequency signal generating circuit 4B, whereby the frequency-converted output of the side which is not quadrature-demodulated is obtainable to obtain two quadrature-demodulated outputs necessary for the extraction of the desired channel by first and second common wave extracting circuits 5N and 5P.

Thus, according to this embodiment, the outputs of the quadrature demodulating circuit 11 and the frequency converting circuit 15A coincide with the two quadrature-demodulated outputs of the first and second quadrature demodulating circuits 11 and 12 in the fifth embodiment, with the result that the treatment of the carrier frequency is possible with only on a high-frequency circuit set, which makes it possible to reduce the space necessary for the circuit as well as the power consumption. The feature of this embodiment is also applicable to the sixth embodiment.

Thirteenth Embodiment

Figure 13:
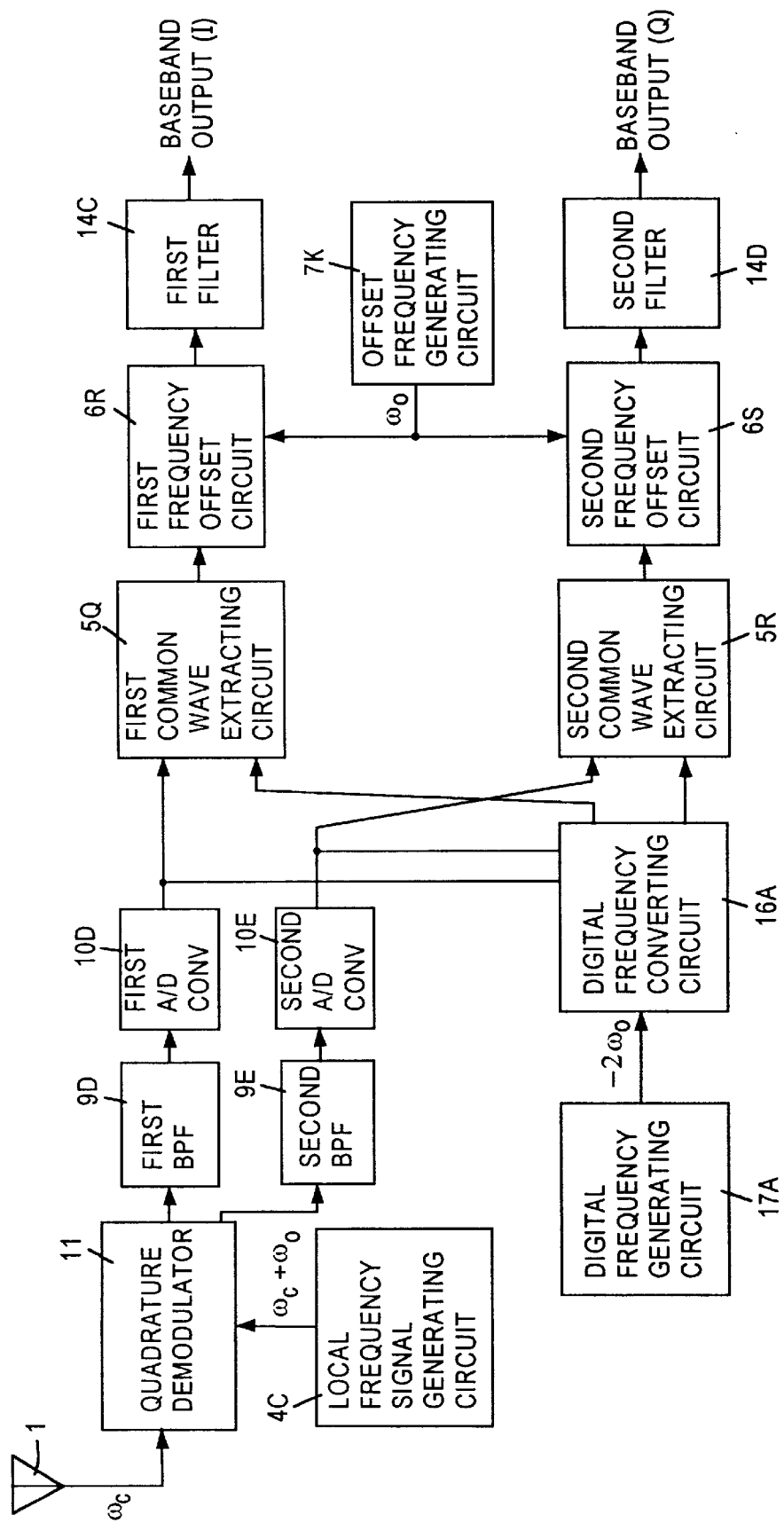
FIG. 13 is a block diagram showing an arrangement of a receiving circuit according to a thirteenth embodiment of this invention.

FIG. 13 is an illustration of an arrangement of a receiving circuit according to a thirteenth embodiment of this invention. A feature of this embodiment is that as compared with the seventh embodiment shown in FIG. 7 the quadrature demodulating means for accepting the received signal is constructed with only one quadrature demodulating circuit 11 and the quantizing means is constructed with one band-pass filters 9D, 9E and one A/D converters 10D, 10E. After the A/D conversion by the A/D converters 10D and 10E, a digital conversion is made in a digital frequency conversing circuit 16A which accepts a frequency corresponding to the inter-channel frequency 2ωo from a digital frequency generating circuit 17A, whereby a frequency-converted output of the side where the quadrature modulation is not effected in the quadrature demodulating circuit 11 is obtainable to ensure two quadrature-demodulated outputs necessary for the extraction of the desired channel by first and second common wave extracting circuits SQ and 5R.

Thus, according to this embodiment, the outputs of the quadrature demodulating circuit 11 A/D-converted by the A/D converters 10D and 10E and the output of the digital frequency converting circuit 16A agree with the two outputs of the first and second quadrature demodulating circuits 11 and 12 in the seventh embodiment, with the result that the treatment of the carrier frequency is possible with only on a high-frequency circuit set, which makes it possible to reduce the space necessary for the circuit. as well as the power consumption. The feature of this embodiment is also applicable to the eighth embodiment.

Fourteenth Embodiment

Figure 14:
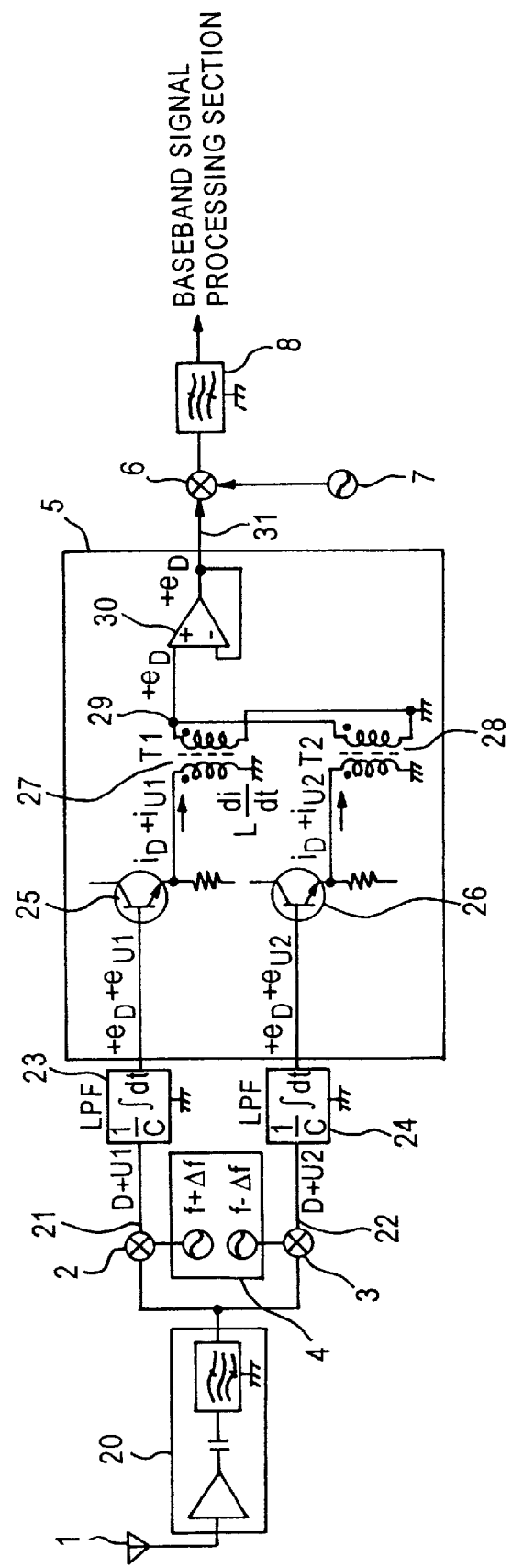
FIG. 14 is a block diagram showing an arrangement of a receiving circuit according to a fourteenth embodiment of this invention.

FIG. 14 is an illustration of an arrangement of a receiving circuit according to a fourteenth embodiment of this invention. This embodiment relates to an improvement of the common wave extracting circuit as employed in the above-described first embodiment. In FIG. 14, as well as the first embodiment, the receiving circuit includes an antenna 1, a first frequency converting circuit 2, a second frequency converting circuit 3, a local frequency signal generating circuit 4, a common wave extracting circuit 5, and a filter 8. Further included therein are a received signal input section 20, an input line 21 through which the output of the first frequency converting circuit 2 passes, an input line 22 through which the output of the second frequency converting circuit 3 passes, integrating circuits 23 and 24 also serving as low-pass filters for accepting the outputs of the first and second frequency converting circuits 2 and 3 through the input lines 21 and 22, respectively, first and second buffer amplifiers 25 and 26 for accepting the outputs of the integrating circuits 23 and 24, respectively, and first and second transformers 27 and 28 having primary coils whose one ends receive the outputs of the first and second buffer amplifiers 25 and 26. The other ends of the primary coils of the first and second transformers 27, 28 are alternating-grounded, and their secondary coils are coupled in parallel to each other in a state with the same polarity. A junction 29 between one ends of the secondary coils equal in polarity to the primary coil is used for its output, while the other ends are grounded. Further, included therein are a third buffer amplifier 30 whose input terminal is connected to the junction 29. The output 31 of the third buffer amplifier 30 is supplied as the output of the common wave extracting circuit 5 to a next-stage frequency offset circuit 6.

Secondly, a description will be made hereinbelow of an operation of the common wave extracting circuit 5 in the fourteenth embodiment. A common wave $e_D$ of a desired wave signal component and an adjacent channel wave signal component $e_U$ are obtainable from the first and second frequency converting circuits 2 and 3. As to the adjacent channel wave signal component, the component obtainable from the first frequency converting circuit 2 and the component obtainable from the second frequency converting circuit 3 are different in central frequency from each other, and hence the component obtainable from the first frequency converting circuit 2 will be expressed by $e_{U1}$, while the component obtainable from the second frequency converting circuit 3 will be expressed by $e_{U2}$. That is, the signal from the first frequency converting circuit 2 assumes $e_D+e_{U1}$, whereas the signal from the second frequency converting circuit 3 takes $e_D+e_{U2}$. There is a possibility that, in addition to these signals, unnecessary high-frequency components are contained in the outputs of the first and second frequency converting circuits 2 and 3. These high-frequency components are lessened by means of the integrating circuits 23 and 24 also serving as low-pass filters.

The signal $e_D+e_{U1}$ from the first frequency converting circuit 2 and the signal $e_D+e_{U2}$ from the second frequency converting circuit 3, which are respectively passed through the integrating circuits 23 and 24, are fed to the corresponding buffer amplifiers 25 and 26, respectively. Each of the buffer amplifiers 25 and 26 has an output impedance set to a low value. After being passed through the buffer amplifiers 25 and 26, the signal $e_D+e_{U1}$ from the first frequency converting circuit 2 and the signal $e_D+e_{U2}$ from the second frequency converting circuit 3 are fed to the primary coils of the transformers 27 and 28, respectively. The ratio of the number of winding turns of the secondary coil to the number of winding turns of the primary coil of each of the transformers 27, 28 is 1, with the result that the signal $e_D+e_{U1}$ from the first frequency converting circuit 2 and the signal $e_D+e_{U2}$ from the second frequency converting circuit 3 correspondingly take place in the secondary coils of the transformers 27, 28.

In this instance, the secondary coils of the transformers 27, 28 are arranged such that their terminals are coupled in parallel in a state that their polarities are coincident with those of the primary coils. Accordingly, a signal corresponding to the common component, i.e., the desired wave signal component $e_D$, of the signal $e_D+e_{U1}$ from the first frequency converting circuit 2 and the signal $e_D+e_{U2}$ from the second frequency converting circuit 3 which are generated in the secondary coils is obtainable at the terminal with no troubles such as the collision of the outputs of the secondary coils.

On the other hand, since the component $e_{U1}$ from the first frequency converting circuit 2 which arises in the secondary coil of the transformer 27 and the component $e_{U2}$ from the second frequency converting circuit 3 which arises in the secondary coil of the transformer 28 are different in frequency from each other, the components are mutually introduced into the mating secondary coils. At this time, the input impedances of the transformers viewed from the secondary coil sides becomes equal to the output impedances of the signal sources coupled to the primary coils, meanwhile, because the output impedances of the buffer amplifiers 25, 26 being the signal sources are set to very low values as noted before, the components other than the common component, i.e., the component $e_{U1}$ from the first frequency converting circuit 2 which arises in the secondary coil of the transformer 27 and the component $e_{U2}$ from the second frequency converting circuit 3 which arises in the secondary coil of the transformer 28, are reduced due to the low impedances.

Figure 15:
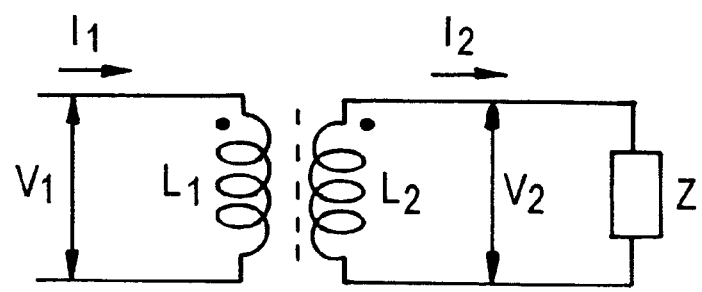
FIG. 15 is an illustration of a concept of a transformer in the fourteenth embodiment.

In general, the buffer amplifier can be realized with an emitter-follower constructed using transistors. In the case of using this device, the output impedance of the buffer amplifier based on the wiring shown in FIG. 14 is below several ohms. This principle will be described with reference to FIG. 15. In FIG. 15, a transformer comprises two coils $L_1$ and $L_2$, and the coil $L_1$ is used as a primary coil, while the coil $L_2$ is used as a secondary coil. The voltages and currents at the respective coil terminals are set as follows. Let it be assumed that the primary current is taken to be $I_1$, the secondary current is taken to be $I_2$, the voltage developed between the terminals of the primary coil $L_1$ is taken as $V_1$, the voltage developed between the terminals of the secondary coil $L_2$ and the mutual inductance between the primary coil $L_1$ and the secondary coil $L_2$ is taken as M. In this case, if a load Z is coupled to the secondary coil $L_2$, the input impedance Zin viewed from the terminal of the primary coil $L_1$ is given by the following equation.

$$Zin = \frac{V_1}{I_1} = j\omega L_1 + \frac{(\omega M)^2}{j\omega L_2 + Z} \tag{46}$$

where $\omega$ denotes an angular frequency, and $L_1 L_2$ are almost equal to $M^2$.

If the load Z is in a short-circuited state, that is, if Z=0, the input impedance Zin becomes zero as follows.

$$Zin = j\omega L_1 + \frac{(\omega M)^2}{j\omega L_2 + Z} \to j\omega L_1 - \frac{j\omega M^2}{L_2} \approx j\omega L_1 - j\omega L_1 = 0 \tag{47}$$

Subsequently, if the load Z is set to an open state, that is, if Z=∞, the input impedance Zin becomes as follows, with the result that the impedance merely depends upon the inductance of only the primary coil.

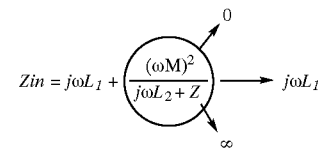

(48)

Accordingly, the input impedances of the primary coils of the transformers 27 and 28 are affected by the loads of the secondary coils.

Returning back to FIG. 14, when the principle described with reference to FIG. 15 is applied thereto, the buffer amplifiers 25, 26 loads are in the short-circuited states, and the respective primary coils of the transformers 27, 28 operate in a stat that the input impedances of the secondary coils of the transformers 27, 28 are zero (short-circuited state). Accordingly, in FIG. 14 the signal currents $i_{U1}$ and $i_{U2}$ do not induce a voltage between the terminals of each of the secondary coils. In general, when the transformer is driven, the signal for the transformer is treated as a current, and the magnetic flux proportional to the product of that current and the inductance of the primary coil breaks out within the magnetic core of the transformer. A voltage is induced in the secondary coil in accordance with the time-variation (differential coefficient) of this magnetic flux. Now, when a potential induced at the terminals of the secondary coil $L_2$ is taken as $e_2$, this potential $e_2$ can be defined as follows.

$$e_2 = M\frac{dI_i}{dt} \tag{49}$$

That is, in this instance, since a signal source for driving the transformer is a current source, its output impedance is ∞, and when viewed from the secondary coil side, as described before it depends upon the impedance due to the inductance of only the secondary coil. One of the features of this embodiment, being different from this ordinary method, is that the transformer is driven with a voltage source.

Secondly, a brief description will be made hereinbelow of the integrating circuits 23, 24 additionally serving as low-pass filters. In the case of the integrating circuits 23, 24, when the integral capacity is taken as C, 1/C becomes the integral coefficient of proportion. However, in a case where the input signal is expressible by a sine wave, when its angular frequency is taken as ω, the integral coefficient of proportion becomes 1/ωC which exhibits a frequency characteristic. This frequency characteristic is for the purpose of cancelling the differential actions of the transformers 27, 28, i.e., eliminating the fact that, when the inductance is taken as L, the differential coefficient of proportion ωL appears in the differential output so that the transformers 27, 28 have a frequency characteristic. That is, the integrated frequency characteristic of the first and second frequency converting circuits 2, 3 to the common wave extraction output is made to be even. If the frequency characteristic is even in the frequency range of the signal for the other circuit elements, the integrated frequency characteristic H of the first and second frequency converting circuits 2, 3 to the common wave extraction output is expressed according to the following equation, and the frequency variable ω disappears so that it become even.

$$H = 1/\omega C \times \omega L = L/C \tag{50}$$

As described above, in terms of the common wave extracting circuit being an element of the receiving circuit, the prior art uses a current source as a signal source for driving the transformer, while according to this embodiment a voltage source is employed as the signal source, and in addition, with the secondary coils of the transformers being coupled in parallel to each other, the impedance of the transformer can be raised only in relation to the inphase signal being a common wave or the anti-phase signal in accordance with the polarities in the connection between the secondary coils of the transformers, with the result a load effect due to an impedance close to zero arises for the non-common wave. Accordingly, although in the prior art the difference (ratio) between the common wave and the non-common wave in the circuit is 2:1 at most, according to this embodiment the difference can at least be increased up to more than two times as compared with that of the prior art, thereby providing the removing effects greater than that of the prior art.

Fifteenth Embodiment

Figure 16:
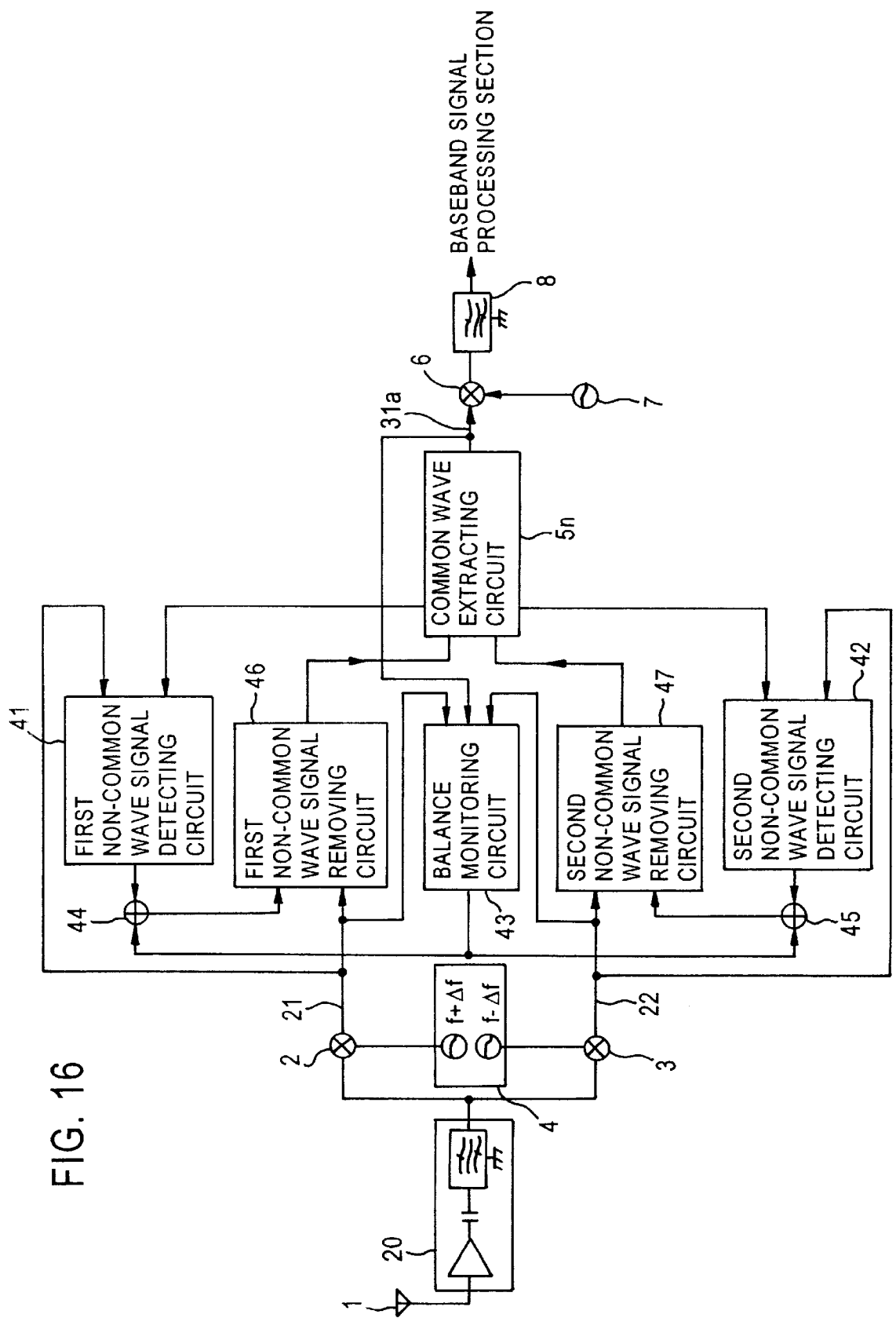
FIG. 16 is a block diagram showing an arrangement of a receiving circuit according to a fifteenth embodiment of this invention.

FIG. 16 is an illustration of an arrangement of a receiving circuit according to a fifteenth embodiment of this invention. This embodiment relates to a modification of the fourteenth embodiment shown in FIG. 14. In FIG. 16, parts corresponding to those in FIG. 14 are marked with the same numerals. The difference from the fourteenth embodiment is that an input line 21 through which the output of the first frequency converting circuit 2 passes and an input line 22 through which the output of the second frequency converting circuit 3 passes are connected with first and second non-common wave signal removing circuits 46, 47 which accept as first inputs the outputs thereof, respectively. The outputs of the first and second non-common wave signal removing circuits 46, 47 are fed to a common wave extracting circuit 5n. Further, the input line 21 through which the output of the first frequency converting circuit 2 passes and the input line 22 through which the output of the second frequency converting circuit 3 passes are connected with a balance monitoring circuit 43 which receives the respective outputs as comparison signals. An output 31a of the common wave signal extracting circuit 5n is coupled to the frequency offset circuit 6 and further fed as a third input to the balance monitoring circuit 43. Other outputs of the common wave signal extracting circuit 5n are fed to first and second non-common wave signal detecting circuits 41, 42, respectively. The first and second non-common wave signal detecting circuits 41, 42 accept, as a second input, the outputs of the first and second frequency converting circuits 2, 3 through the input lines 21, 22, respectively. The outputs of the first and second non-common wave signal detecting circuits 41, 42, together with the output of the balance monitoring circuit 43, are supplied to first and second synthesizing circuits 44, 45, respectively. The outputs of the synthesizing circuits 44, 45 are fed as a second input to the first and second non-common wave signal removing circuits 46, 47, respectively. The other arrangements are the same as those in FIG. 14 except that the common wave extracting circuit is generally denoted at 5n in place of 5, and the description thereof will be omitted.

Secondly, a description will be made hereinbelow of an operation of the receiving circuit according to this embodiment. As well as in FIG. 14, a signal $e_D + e_{U1}$ is outputted from the first frequency converting circuit 2, while a signal $e_D + e_{U2}$ is outputted from the second frequency converting circuit 3. The outputs of the first and second frequency converting circuits 2, 3 are supplied to the first and second non-common wave signal removing circuits 46, 47, respectively. In the first and second non-common wave signal removing circuits 46, 47, a subtraction is made with a second input which will be described later. The outputs of the first and second non-common wave signal removing circuits 46, 47 are supplied to the common wave extracting circuit 5n. These inputs to the common wave extracting circuit 5n are basically the first frequency converting circuit 2 side signal $e_D + e_{U1}$ and the second frequency converting circuit 3 side signal $e_D + e_{U2}$, respectively. Accordingly, in the common wave extracting circuit 5n, the common wave signal $e_D$ is extracted as described in detail in terms of the common wave extracting circuit 5 in the fourteenth embodiment. However, the common wave extracting circuit 5n can not completely remove the non-common wave signals as obvious from the example shown in FIG. 14. More specifically, if the coupling degree of the primary coils and the secondary coils of the transformers 27, 28 in the common wave extracting circuit 5n is insufficient, or if the output impedance of the amplifier 25 or 26 for driving the transformer is not sufficiently low, the removal of the non-common wave components can not be accomplished sufficiently. For this reason, according to this embodiment, the common wave signal output 31a once extracted is feedbacked to be compared with the first frequency converting circuit 2 side signal $e_D + e_{U1}$ or the second frequency converting circuit 3 side signal $e_D + e_{U2}$. For this comparison, the aforesaid first and second non-common wave signal detecting circuits 41, 42 serves as comparators.

This comparison results are outputted through the synthesizing circuits 44, 45 for correcting the input signals from the input line 21 through which the output of the first frequency converting circuit 2 passes and from the input line 22 through which the output of the second frequency converting circuit 3 passes. For this correction, the aforesaid first and second non-common wave signal removing circuits 46, 47 work. On the other hand, when noting the common wave signal $e_D$, the first frequency converting circuit 2 side signal strength and the second frequency converting circuit 3 side signal strength are not always equal to each other at the stage of the signals from the input line 21 through which the output of the first frequency converting circuit 2 passes and from the input line 22 through which the output of the second frequency converting circuit 3 passes, or in the whole range up to the common wave extracting circuit 5n. Whereupon, if these signal strengths are significantly different from each other, the difference is treated as a non-common wave component, and hence, even if one has a sufficient signal strength, the signals are not used effectively. Thus, it is effective that the output of the common wave extracting circuit 5n is compared with an intermediate point between the outputs of the first and second non-common wave signal removing circuits 46, 47 and the comparison result is corrected with the offset being made in the whole of the circuit. This function can be accomplished with the balance monitoring circuit 43 and a path that the output of the balance monitoring circuit 43 passes through the first and second synthesizing circuits 44, 45 and feedbacks to the first and second non-common wave signal removing circuits 46, 47.

Figure 17:
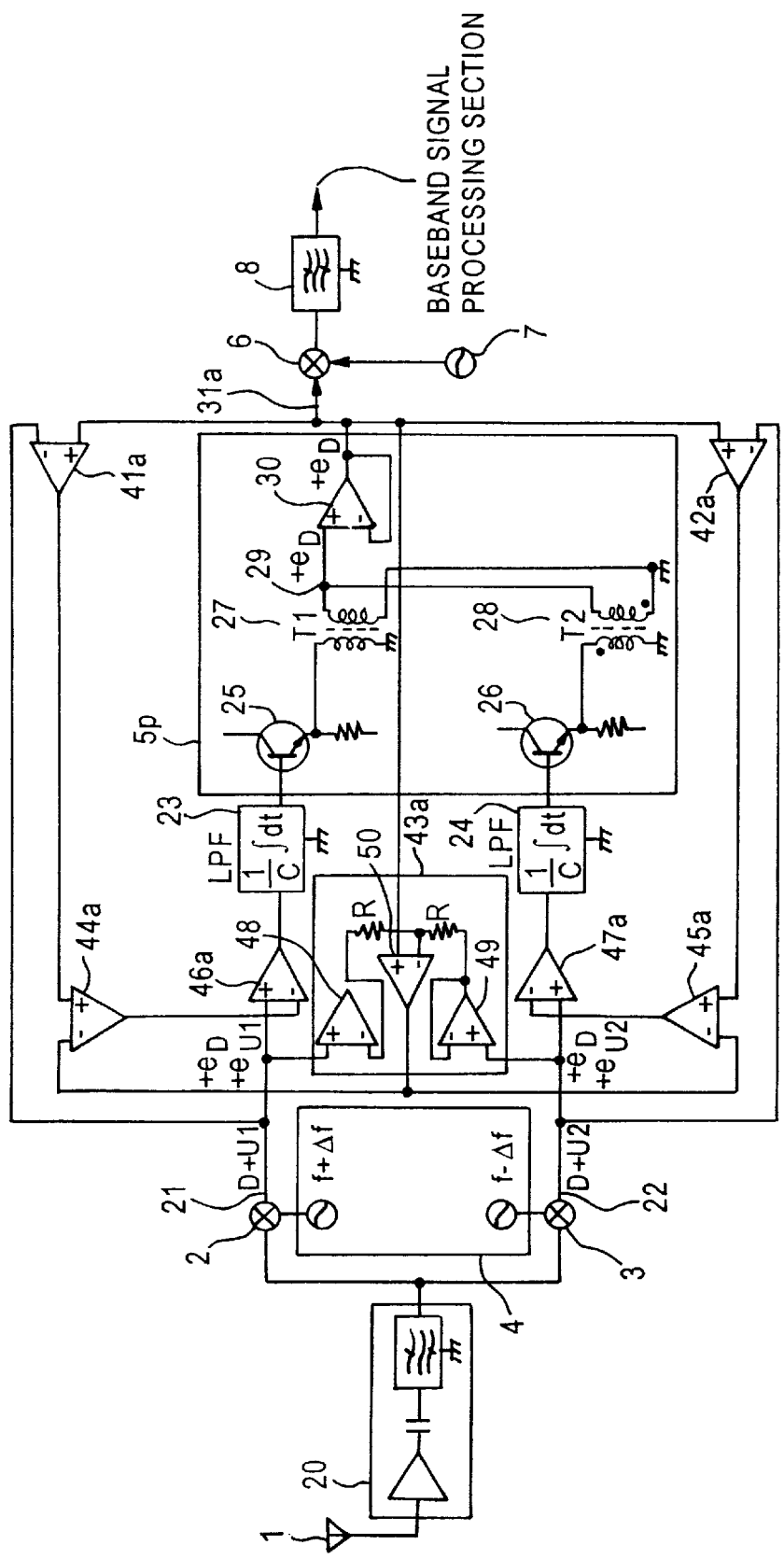
FIG. 17 is a block diagram showing a concrete arrangement of a receiving circuit according to the fifteenth embodiment of this invention.

FIG. 17 is an detailed illustration of the fifteenth embodiment shown in FIG. 16, where parts corresponding to those in FIG. 16 are marked with the same reference numerals. As well as in FIG. 16, the outputs of the first and second frequency converting circuits 2, 3 are supplied as a first input through the input lines 21, 22 to first and second differential amplifiers 46a, 47a, the outputs of which are fed to first and second integrating circuits 23, 24 which serve as low-pass filters. The outputs of the first and second integrating circuits 23, 24 are supplied to first and second buffer amplifiers 25, 26, respectively. The outputs of the first and second buffer amplifiers 25, 26 are feedbacked to their negative input sides. The outputs of the first and second buffer amplifiers 25, 26 are applied to one ends of the primary coils of transformers 27, 28. The other ends of the primary coils of the transformers 27, 28 are grounded in the form of alternating currents. The secondary coils thereof are coupled in parallel to each other to have the same polarities, and a junction 29 between one ends of the secondary coils equal in polarity to the primary coils acts as an output terminal, while the the other ends thereof are grounded as alternating currents. The junction 29 of the secondary coils is connected with a third buffer amplifier 30 the output of which is feedbacked to its negative input side. The output 31a of the third buffer amplifier 30 is fed to the frequency offset circuit 6 and further coupled to the positive input sides of third and fourth differential amplifiers 41a, 42a and to the positive input side of a differential amplifier 50. The negative input terminals of the third and fourth differential amplifiers 41a, 42a are connected with the input line 21 through which the output of the first frequency converting circuit 2 passes and further with the input line 22 through which the output of the second frequency converting circuit 3 passes, respectively. The outputs of fourth and fifth buffer amplifiers 48, 49 are coupled through two resistors R, equal in resistance, to each other, and the node therebetween is coupled to the negative input terminal of an eighth differential amplifier 50. Further, the outputs of the third and fourth differential amplifiers 41a, 42a coupled to the positive input terminals of sixth and seventh differential amplifiers 44a, 45a, while the negative input terminals of the differential amplifiers 44a, 45a are coupled to the output of the eighth differential amplifier 50. The outputs of the sixth and seventh differential amplifiers 44a, 45a are coupled to the negative input terminals of the first and second differential amplifiers 46a, 47a, respectively.

In FIGS. 16 and 17, the non-common wave signal removing circuits 46, 47 respectively correspond to the first and second differential amplifiers 46a, 47a, the common wave extracting circuit 5n corresponds to a common wave extracting circuit 5p, the balance monitoring circuit 43 corresponds to a balance monitoring circuit 43a comprising the fourth and fifth buffer amplifiers 48, 49, the resistors R and the differential amplifier 50, the non-common wave signal detecting circuits 41, 42 correspond to the third and fourth differential amplifiers 41a, 42a, and the synthesizing circuits 44, 45 correspond to the sixth and seventh differential amplifiers 44a, 45a.

Secondly, a description will be made hereinbelow of an operation of a concrete example according to this embodiment. As well as in FIG. 16, a signal $e_D+e_{U1}$ is outputted from the first frequency converting circuit 2, while a signal $e_D+e_{U2}$ is outputted from the second frequency converting circuit 3. The outputs of the first and second frequency converting circuits 2, 3 are supplied to the positive input terminals of the differential amplifiers 46a, 47a for the removal of the non-common wave signals, where the subtraction of a second input which will be described later is made, the outputs of which are fed to a common wave extracting circuit 5p. In the common wave extracting circuit 5p, high-frequency unnecessary components are reduced by the integrating circuit 23 or integrating circuit 24 also serving as a low-pass filter, before the signals therefrom are fed to the first and second buffer amplifiers 25, 26. Accepting the first frequency converting circuit 2 side signal $e_D+e_U$, and the second frequency converting circuit 3 side signal $e_D+e_{U2}$ from the buffer amplifiers 25, 26, transformers 27 and 28, as described in the fourteenth embodiment shown in FIG. 15, extract the common wave signal $e_D$, while at the same time the non-common wave components are left. The outputs of the secondary coils of the transformers 27, 28 containing the remainder of the non-common wave components are led to the positive input terminals of the differential amplifiers 41a, 42a. The differential amplifiers 41a, 42a accept the outputs of the first and second frequency converting circuits 2, 3 as comparison signals through input lines 21, 22, and further supply the differential amplifiers 44a, 45a with the difference between these comparison signals and the common wave signal output 31a extracted as a substantial common wave component. On the other hand, the common wave S extracted output 31a is feedbacked to the differential amplifiers 44a, 45a to be compared with the first frequency converting circuit 2 side signal $e_D+e_{U1}$ or the second frequency converting circuit 3 side signal $e_D+e_{U2}$. These differential amplifiers 41a, 42a correspond to the aforesaid non-common wave signal detecting circuits 41, 42. This comparison results are fed to the positive input terminals of the differential amplifiers 44a, 45a. Going the other way, In terms of the common wave signal $e_D$, if there is a difference between the strength of the signal entering the first frequency converting circuit 2 side or the circuit gain in a range from the first frequency converting circuit 2 output (21) to the common wave signal output 31a and the strength of the signal entering the second frequency converting circuit 3 side or the circuit gain in a range from the second frequency converting circuit 3 output to the common wave signal output 31a, in order to attain the outputs with a high efficiency, the first frequency converting circuit 2 output (21) and the second frequency converting circuit 3 output (22) are obtained in the buffer amplifiers 48 and 49, before the intermediate value due to the resistors R is compared with the common wave extracted output 31a in the differential amplifier 50. The comparison result is fed to the negative input terminals of the differential amplifiers 44a, 45a, i.e., the synthesizing circuits 44, 45, so as to be added to the first frequency converting circuit 2 output (21) and the second frequency converting circuit 3 output (22). The signals synthesized in the differential amplifiers 44a, 45a are supplied to the differential amplifiers 46a, 47a, respectively, thus correcting the first frequency converting circuit 2 output (21) and the second frequency converting circuit 3 output (22).

Thus, according to this embodiment, there are provided a function that removes the non-common wave components remaining the common wave extracted output and a function that, in terms of the common wave signal $e_D$, removes the difference arising between the strength of the signal entering the first frequency converting circuit 2 side or the circuit gain from the output (21) to the output 31a and the strength of the signal entering the second frequency converting circuit 3 side or the circuit gain from the output (22) to the output 31a.

Sixteenth Embodiment

Figure 18:
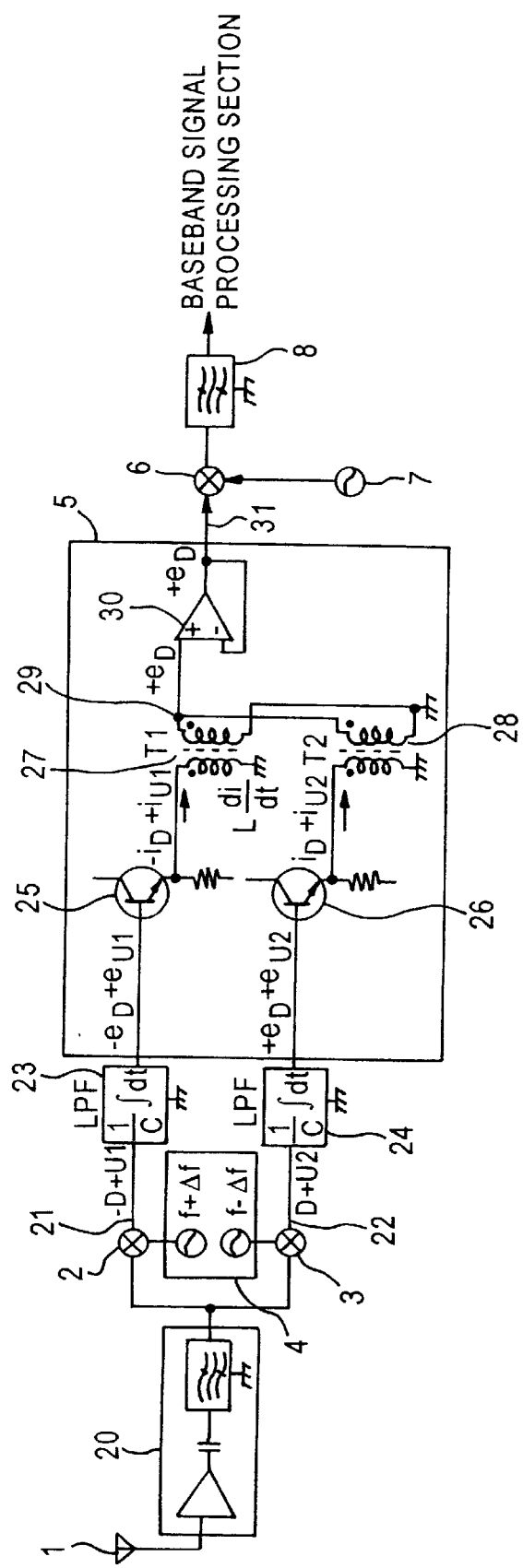
FIG. 18 is a block diagram showing an arrangement of a receiving circuit according to a sixteenth embodiment of this invention.

FIG. 18 is an illustration of an arrangement of a receiving circuit according to a sixteenth embodiment of this invention. A communicating method covered by this invention includes QPSK, and the arrangements as shown in FIGS. 14, 16 and 17 can only extract components equal in phase, i.e., the I-axis components in the QPSK. This embodiment is designed to extract signals different by 180 degrees in phase. As shown in FIG. 18, the receiving circuit basically has the same arrangement as in FIG. 14, while two transformers are coupled so that the polarities of the signals of the secondary coils are opposite to each other. The FIG. 18 arrangement is the same as the FIG. 14 arrangement except for this point, and the description thereof will be omitted for brevity. In operation, in the case of the FIG. 14 arrangement, the inphase signals can be produced at the secondary sides without interfering with each other, whereas in the FIG. 18 arrangement the polarity of one secondary coil is inverted, with the result that the anti-phase signals, i.e., the Q signals in the QPSK, which do not interfere with each other, are taken out at reception. Accordingly, the inphase signals come into anti-phase and interfering relation to each other in the secondary coil sides to attenuate.

Seventeenth Embodiment

Figure 19:
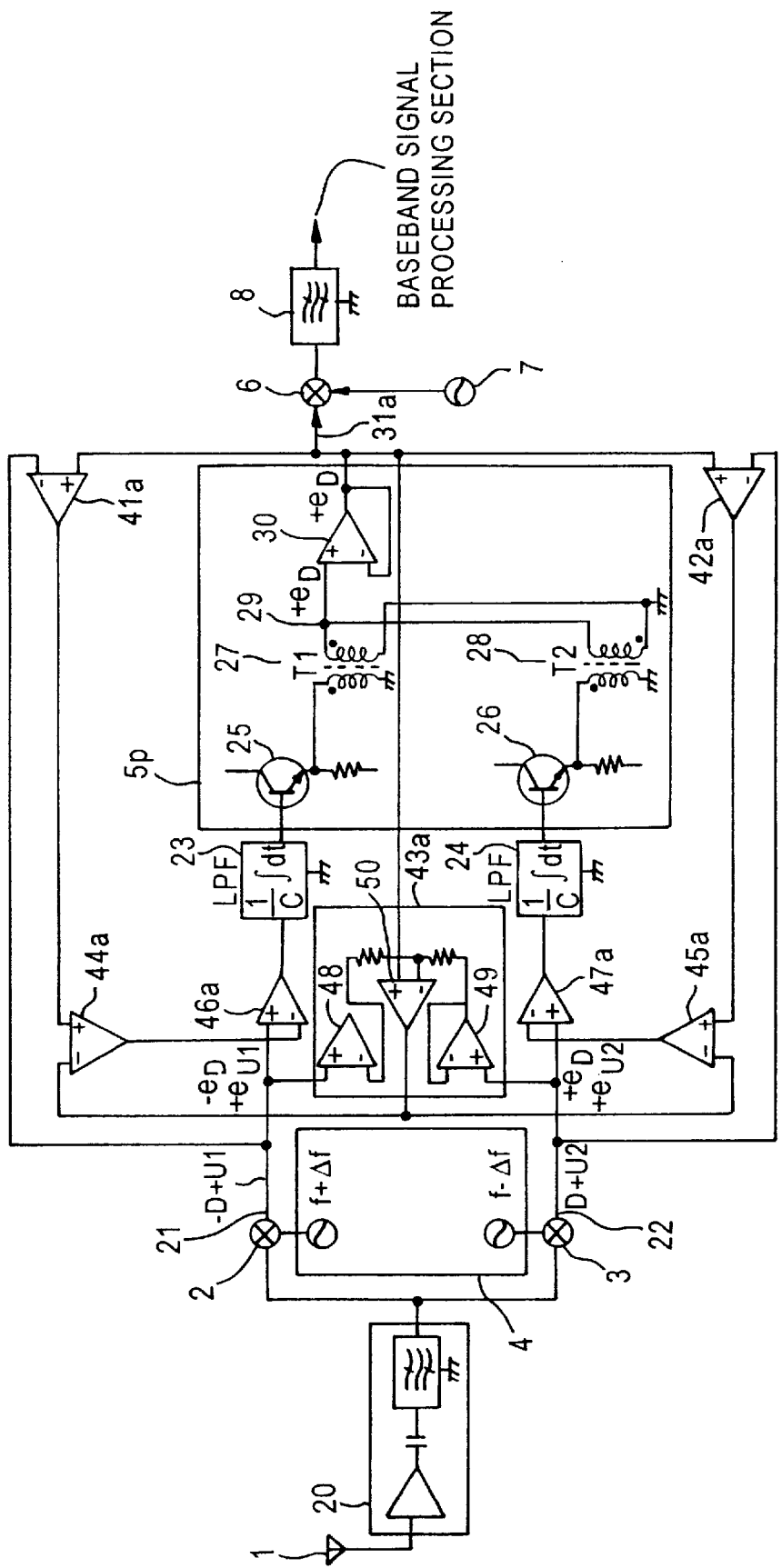
FIG. 19 is a block diagram showing an arrangement of a receiving circuit according to a seventeenth embodiment of this invention.

FIG. 19 is an illustration of an arrangement of a receiving circuit according to a seventeenth embodiment of this invention. This embodiment relates to the antiphase signal taking-out feature of the aforesaid sixteenth embodiment being applied to the receiving circuits as shown in FIGS. 16 and 17. Although the FIG. 17 arrangement relates to the removal of the non-common wave signal components of the inphase signals and the improvement of balancing, in this embodiment, the common wave signal is treated as the antiphase signal to exhibit the same effects.

Eighteenth Embodiment

Figure 21:
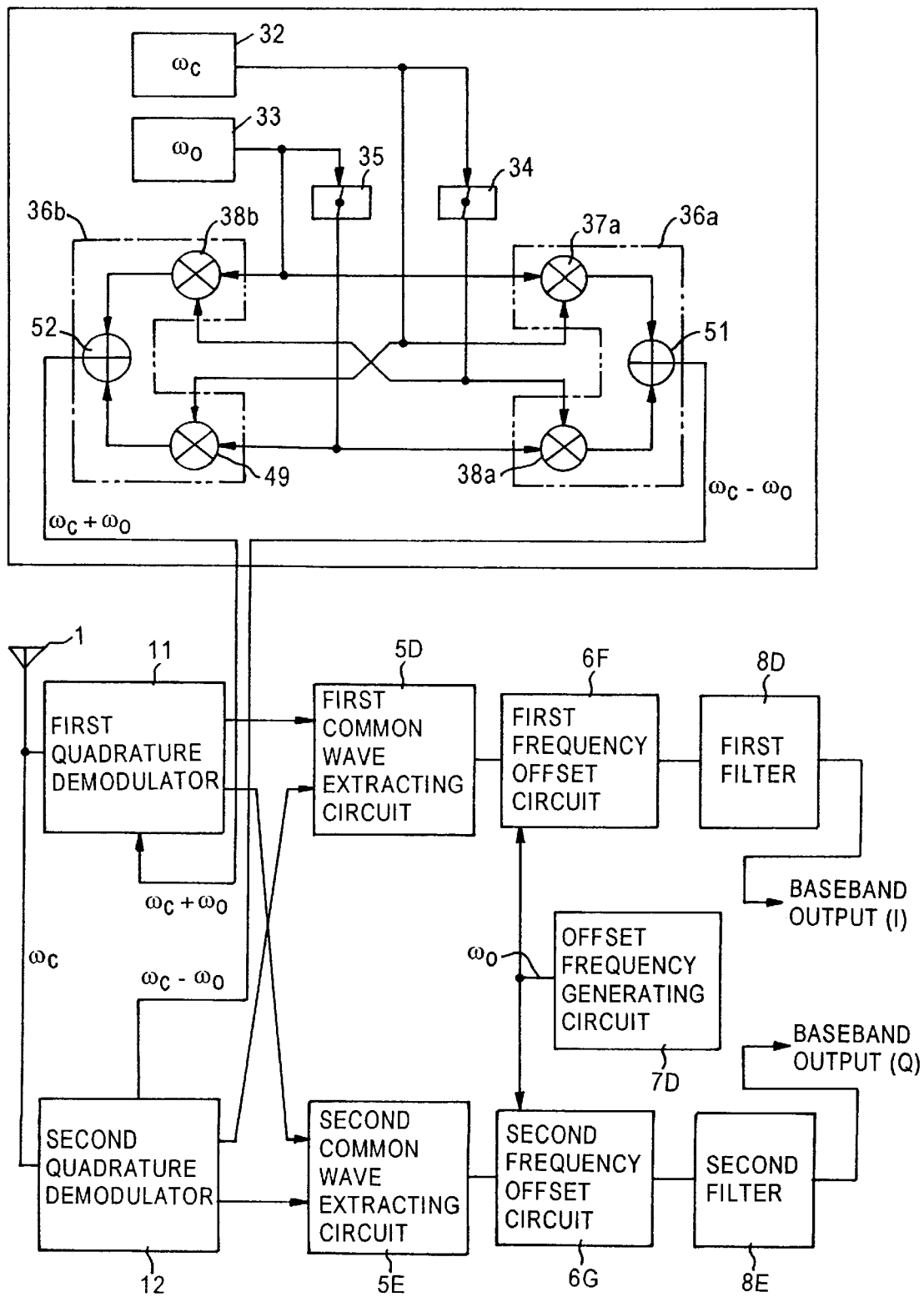
FIG. 21 is a block diagram showing an arrangement of a receiving circuit according to an eighteenth embodiment of this invention.

FIG. 21 is a block diagram showing an arrangement of a receiving circuit according to an eighteenth embodiment of this invention. This embodiment adopts the same receiving method as that of the receiving circuit according to the fifth embodiment shown in FIG. 5. For this reason, the same parts as those in FIG. 5 are marked with the same reference numerals, and the detailed description will be omitted for simplicity, while only the unique portions of FIG. 21 arrangement will be described hereinbelow. In this embodiment, the local frequency signal generating circuit 4A is composed of a desired wave carrier frequency signal generating source 32 for producing a desired wave carrier frequency signal, an offset frequency signal generating source 33 placed in parallel relation to the desired wave carrier frequency signal generating source 32 to produce an offset frequency signal, a carrier frequency signal phase-shifting circuit 34 being a means for phase-shifting (delaying) the carrier frequency signal from the desired wave carrier frequency signal generating source 32, an offset frequency signal phase-shifting circuit 35 being a means for phase-shifting the offset frequency signal from the offset frequency signal generating source 33, and first and second quadrature demodulators 36a and 36b.

The first quadrature demodulator 36a comprises a first multiplier 37a for multiplying the desired wave carrier frequency signal produced in the desired wave carrier frequency signal generating source 32 by the offset frequency signal produced in the offset frequency signal generating source 33, a second multiplier 38a for multiplying the desired wave carrier frequency signal phase-shifted in the carrier frequency signal phase-shifting means 34 by the offset frequency signal phase-shifted in the offset frequency signal phase-shifting circuit 35, and a negative offset side local frequency outputting adder 51 for summing up the multiplication result of the first multiplier 37a and the multiplication result of the second multiplier 38a to output a negative offset side local frequency ($\omega c-\omega o$). On the other hand, the second quadrature modulator 36b is composed of a third multiplier 37b for multiplying the desired wave carrier frequency signal produced in the desired wave carrier frequency signal generating source 32 by the offset frequency signal phase-shifted in the offset frequency signal phase-shifting circuit 35, a fourth multiplier 38b for multiplying the desired wave carrier frequency signal phase-shifted in the carrier frequency signal phase-shifting circuit 34 by the offset frequency signal produced in the offset frequency signal generating source 33, and a positive offset side local frequency outputting adder 52 for summing up the multiplication result of the third multiplier 37b and the multiplication result of the fourth multiplier 38b to output a positive offset side local frequency ($\omega c+\omega o$). The output of the negative offset side local frequency outputting adder 51 is fed to the second quadrature demodulator 12, whereas the output of the positive offset side local frequency outputting adder 52 is fed to the first quadrature demodulator 11.

Secondly, a description will be made hereinbelow of an operational principle and an operation of the eighteenth embodiment. The desired wave carrier frequency signal $\omega c$ from the desired wave carrier frequency signal generating source 32 is supplied to the carrier frequency signal phase-shifting circuit 34 so that its phase is delayed by $\pi/2$. The offset frequency signal $\omega o$ is supplied to the offset frequency signal phase-shifting circuit 35 so that its phase is delayed by $\pi/2$. The first multiplier 37a of the two multipliers 37a and 38a making up the first quadrature demodulator 36a accepts the desired wave carrier frequency signal $\cos \omega c t$ from the aforesaid desired wave carrier frequency signal generating source 32 and the offset frequency signal $\cos \omega o t$ from the offset frequency signal generating source 33. The second multiplier 38a accepts the desired wave carrier frequency signal $\sin \omega c t$ from the carrier frequency signal phase-shifting circuit 34 which is phase-delayed by $\pi/2$ and the offset frequency signal $\sin \omega o t$ from the offset frequency signal phase-shifting circuit 35 which is phase-delayed by $\pi/2$. As a result, a frequency of $\omega c-\omega o$, as shown below, appears in the output of the negative offset side local frequency outputting adder 51 of the first quadrature demodulator 36a.

$$\cos \omega c t \times \cos \omega o t + \sin \omega c t \times \sin \omega o t = \cos(\omega c - \omega o)t$$

The third multiplier 37b of the two multipliers 37b, 38b making up the second quadrature modulator 36b accepts the desired wave carrier frequency signal $\cos \omega c t$ from the aforesaid desired wave carrier frequency signal generating source 32 and the offset frequency signal $\sin \omega o t$ from the offset frequency signal phase-shifting circuit 35 which is phase-delayed by $\pi/2$. The fourth multiplier 38b accepts the desired wave carrier frequency signal $\sin \omega c t$ from the carrier frequency signal phase-shifting circuit 34 which is phase-delayed by $\pi/2$ and the offset frequency signal $\cos \omega o t$ from the offset frequency signal phase-shifting circuit 35 which is phase-delayed by $\pi/2$. As a result, a frequency of $\omega c+\omega o$, as shown below, is obtainable in the output of the negative offset side local frequency outputting adder 52 of the first quadrature demodulator 36b.

$$\cos \omega c t \times \sin \omega o t + \sin \omega c t \times \cos \omega o t = \sin(\omega c + \omega o)t$$

As described above, it is obvious that this embodiment can generate the complementary type local oscillation frequency necessary for the basic arrangement of this invention, which is obtainable as an independent output. In addition, it is obvious that, even if the carrier frequency of the desired signal is variable, the signal is treatable with no corresponding filters.

Nineteenth Embodiment

Figure 22:
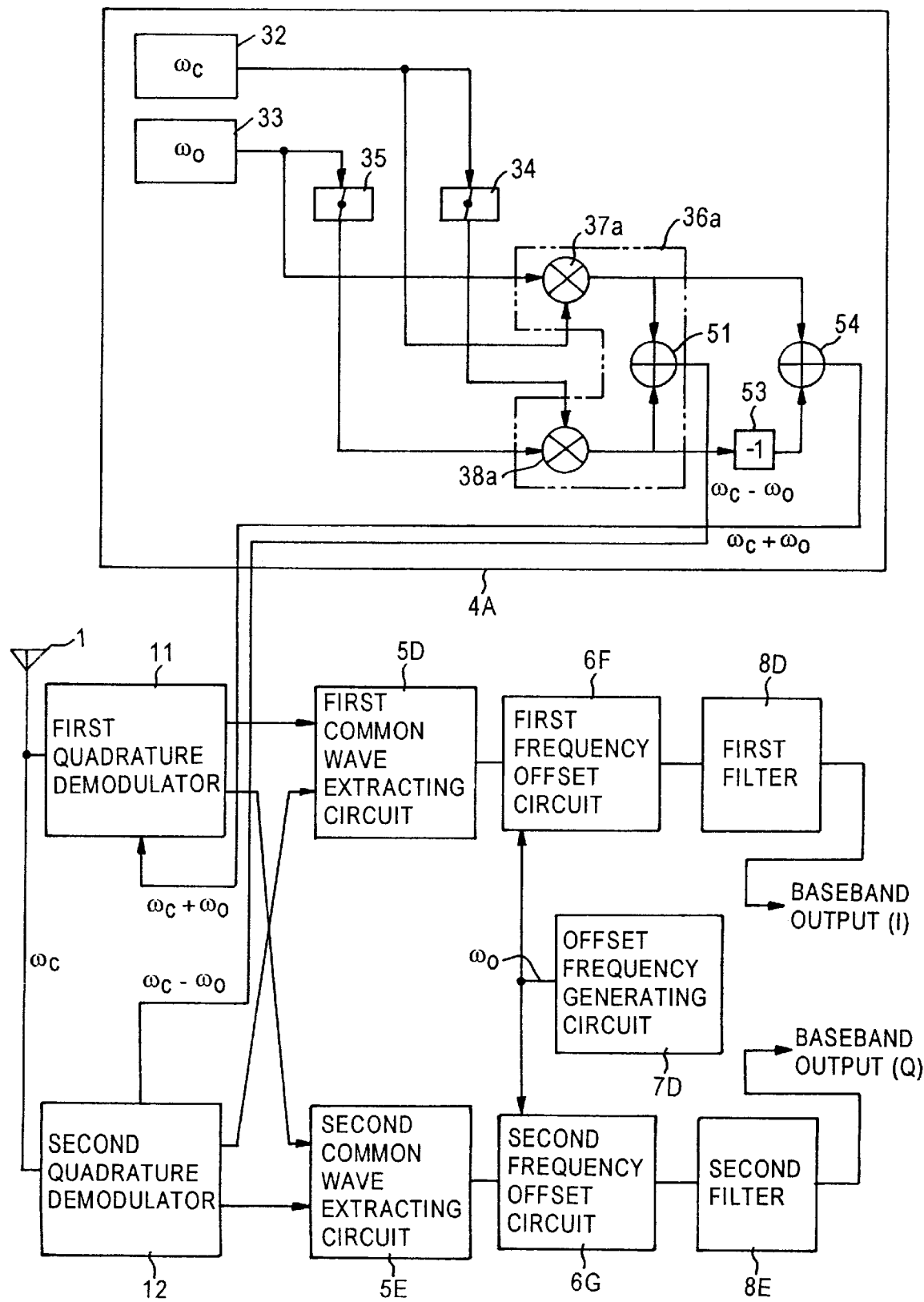
FIG. 22 is a block diagram showing an arrangement of a receiving circuit according to a nineteenth embodiment of this invention.

FIG. 22 is a block diagram showing an arrangement of a receiving circuit according to a nineteenth embodiment of this invention. In this embodiment, in order to obtain fc+fo and fc-fo, there are used two phase shifters, a quadrature modulator, an adder and a polarity-inverting circuit. This embodiment adopts the same receiving method as that of the fifth embodiment shown in FIG. 5. For this reason, the parts corresponding to those in FIG. 5 are marked with the same reference numerals, and the detailed description will be omitted, while only the unique arrangement of FIG. 21 will be described hereinbelow. In this embodiment, the local frequency signal generating circuit 4A is composed of a a desired wave carrier frequency signal generating source 32 for producing a desired wave carrier frequency signal, an offset frequency signal generating source 33 placed in parallel relation to the desired wave carrier frequency signal generating source 32 to produce an offset frequency signal, a carrier frequency signal phase-shifting circuit 34 being a means for phase-shifting the carrier frequency signal from the desired wave carrier frequency signal generating source 32, an offset frequency signal phase-shifting circuit 35 being a means for phase-shifting the offset frequency signal from the offset frequency signal generating source 33, and a quadrature demodulator 36a, a polarity inverting circuit 53, and a positive offset side local frequency outputting adder 54.

The quadrature modulator 36a has the same construction as the first quadrature modulator of the aforementioned eighteenth embodiment, and comprises a first multiplier 37a for multiplying the desired wave carrier frequency signal produced in the desired wave carrier frequency signal generating source 32 by the offset frequency signal produced in the offset frequency signal generating source 33, a second multiplier 38a for multiplying the desired wave carrier frequency signal phase-shifted in the carrier frequency signal phase-shifting circuit 34 by the offset frequency signal phase-shifted in the offset frequency signal phase-shifting circuit 35, and a negative offset side local frequency outputting adder 51 for summing up the multiplication result of the first multiplier 37a and the multiplication result of the second multiplier 38a to output a negative offset side local frequency ($\omega c - \omega o$).

The polarity inverting circuit 53 inverts the polarity of the output of the second multiplier 38a. The positive offset side local frequency outputting adder 54 sums up the multiplication result output of the first multiplier 37a and the polarity-inverted output of the polarity inverting circuit 53 to output a positive offset side local frequency ($\omega c + \omega o$). Further, the output of the negative offset side local frequency outputting adder 51 is fed to the second quadrature demodulator 12, while the output of the positive offset side local frequency outputting adder 54 is fed to the first quadrature modulator 11.

Secondly, a description will be made hereinbelow of an operational principle and an operation of the nineteenth embodiment The desired wave carrier frequency signal $\omega c$ from the desired wave carrier frequency signal generating source 32 is supplied to the carrier frequency signal phase-shifting circuit 34 so that its phase is delayed by $\pi/2$. On the other hand, the offset frequency signal $\omega o$ from the offset frequency signal generating source 33 is supplied to the offset frequency signal phase-shifting circuit 35 so that its phase is delayed by $\pi/2$.

The first multiplier 37a of the two multipliers 37a and 38a making up the quadrature demodulator 36a accepts the desired wave carrier frequency signal cos $\omega c t$ from the aforesaid desired wave carrier frequency signal generating source 32 and the offset frequency signal cos $\omega o t$ from the offset frequency signal generating source 33. The second multiplier 38a accepts the desired wave carrier frequency signal sin $\omega c t$ from the carrier frequency signal phase-shifting circuit 34 which is phase-delayed by $\pi/2$ and the offset frequency signal sin $\omega o t$ from the offset frequency signal phase-shifting circuit 35 which is phase-delayed by $\pi/2$. As a result, a frequency of $\omega c - \omega o$, as shown below, appears in the output of the negative offset side local frequency outputting adder 51 of the first quadrature demodulator 36a.

$$\cos \omega c t \times \cos \omega o t + \sin \omega c t \times \sin \omega o t = \cos(\omega c - \omega o)t$$

A portion of the output of the second multiplier 38a of the two multipliers 37a, 38a making up the quadrature modulator 36a is fed to the polarity inverting circuit 53, and its inverted output, together with the output of the first multiplier 37a, is inputted to the positive offset side local frequency outputting adder 54. As a result, a frequency of $\omega c + \omega o$, as shown below, takes place.

$$\cos \omega c t \times \sin \omega o t + (-1) \sin \omega c t \times \cos \omega o t = \cos(\omega c + \omega o)t$$

As described above, it is obvious that this embodiment can generate the complementary type local oscillation frequency necessary for the basic arrangement of this invention, which is obtainable as an independent output. In addition, it is obvious that, even if the carrier frequency of the desired signal is variable, the signal is treatable with no corresponding filters.

Twentieth Embodiment

Figure 23:
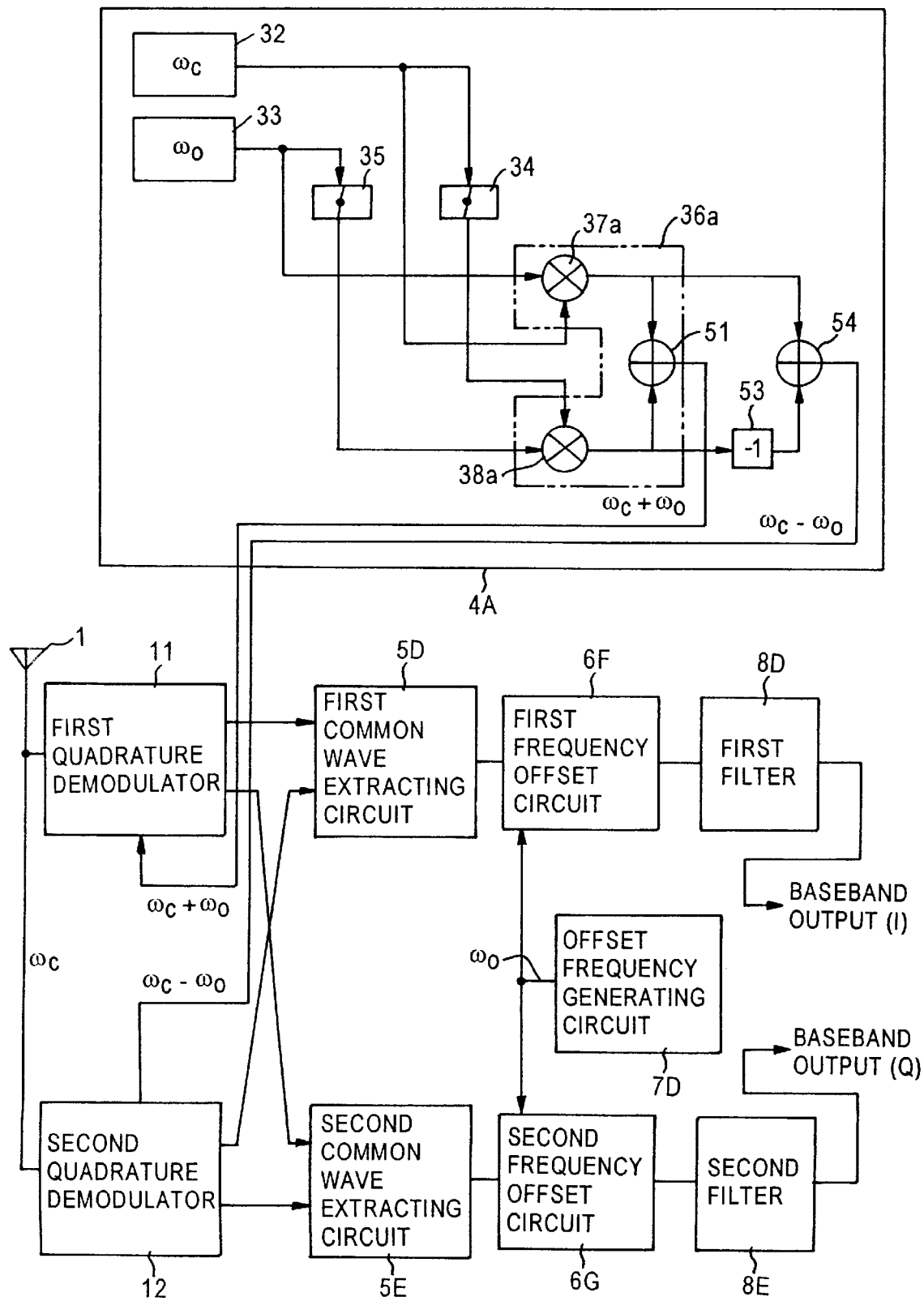
FIG. 23 is a block diagram showing an arrangement of a receiving circuit according to a twentieth embodiment of this invention.

FIG. 23 is a block diagram showing an arrangement of a receiving circuit according to a twentieth embodiment of this invention. In this embodiment, in order to obtain fc+fo and fc−fo, there are used two phase shifters, a quadrature modulator, two adders and a polarity-inverting circuit. This embodiment adopts the same receiving method as that of the fifth embodiment shown in FIG. 5. For this reason, the parts corresponding to those in FIG. 5 are marked with the same reference numerals, and the detailed description will be omitted, while only the unique arrangement of FIG. 23 will be described hereinbelow. In this embodiment, the local frequency signal generating circuit 4A is composed of a a desired wave carrier frequency signal generating source 32 for producing a desired wave carrier frequency signal, an offset frequency signal generating source 33 placed in parallel relation to the desired wave carrier frequency signal generating source 32 to produce an offset frequency signal, a carrier frequency signal phase-shifting circuit 34 being a means for phase-shifting the carrier frequency signal from the desired wave carrier frequency signal generating source 32, an offset frequency signal phase-shifting circuit 35 being a means for phase-shifting the offset frequency signal from the offset frequency signal generating source 33, and a quadrature demodulator 36a, a polarity inverting circuit 53, and a positive offset side local frequency outputting adder 54.

The quadrature modulator 36a has the same construction as the first quadrature modulator of the aforementioned eighteenth embodiment, and comprises a first multiplier 37a for multiplying the desired wave carrier frequency signal produced in the desired wave carrier frequency signal generating source 32 by the offset frequency signal produced in the offset frequency signal generating source 33, a second multiplier 38a for multiplying the desired wave carrier frequency signal phase-shifted in the carrier frequency signal phase-shifting circuit 34 by the offset frequency signal phase-shifted in the offset frequency signal phase-shifting circuit 35, and a negative offset side local frequency outputting adder 51 for summing up the multiplication result of the first multiplier 37a and the multiplication result of the second multiplier 38a to output a negative offset side local frequency ($\omega c - \omega o$).

The polarity inverting circuit 53 inverts the polarity of the output of the second multiplier 38a. The positive offset side local frequency outputting adder 54 sums up the multiplication result output of the first multiplier 37a and the polarity-inverted output of the polarity inverting circuit 53 to output a positive offset side local frequency ($\omega c + \omega o$). Further, unlike the nineteenth embodiment, the output of the negative offset side local frequency outputting adder 51 is fed to the first quadrature demodulator 11, while the output of the positive offset side local frequency outputting adder 54 is fed to the second quadrature modulator 12.

Secondly, a description will be made hereinbelow of an operational principle and an operation of the twentieth embodiment. The desired wave carrier frequency signal ωc from the desired wave carrier frequency signal generating source 32 is supplied to the carrier frequency signal phase-shifting circuit 34 so that its phase is delayed by π/2. On the other hand, the offset frequency signal ωo from the offset frequency signal generating source 33 is supplied to the offset frequency signal phase-shifting circuit 35 so that its phase is delayed by π/2.

The first multiplier 37a of the two multipliers 37a and 38a making up the quadrature demodulator 36a accepts the desired wave carrier frequency signal cos ωct from the aforesaid desired wave carrier frequency signal generating source 32 and the offset frequency signal cos ωot from the offset frequency signal generating source 33. The second multiplier 38a accepts the desired wave carrier frequency signal sin ωct from the carrier frequency signal phase-shifting circuit 34 which is phase-delayed by π/2 and the offset frequency signal sin ωot from the offset frequency signal phase-shifting circuit 35 which is phase-delayed by π/2. As a result, a frequency of ωc−ωo, as shown below, appears in the output of the negative offset side local frequency outputting adder 51 of the first quadrature demodulator 36a.

cos ωctxcos ωot+sin ωctxsin ωot=cos(ωc−ωo)t

A portion of the output of the second multiplier 38a of the two multipliers 37a, 38a making up the quadrature modulator 36a is fed to the polarity inverting circuit 53, and its inverted output, together with the output of the first multiplier 37a, is inputted to the positive offset side local frequency outputting adder 54. As a result, a frequency of ωc+ωo, as shown below, takes place.

cos ωctxsin ωot+(−1)sin ωctxcos ωot=cos(ωc+ωo)t

As described above, it is obvious that this embodiment can generate the complementary type local oscillation frequency necessary for the basic arrangement of this invention, which is obtainable as an independent output. In addition, it is obvious that, even if the carrier frequency of the desired signal is variable, the signal is treatable with no corresponding filters.

Twenty-First Embodiment

Figure 24:
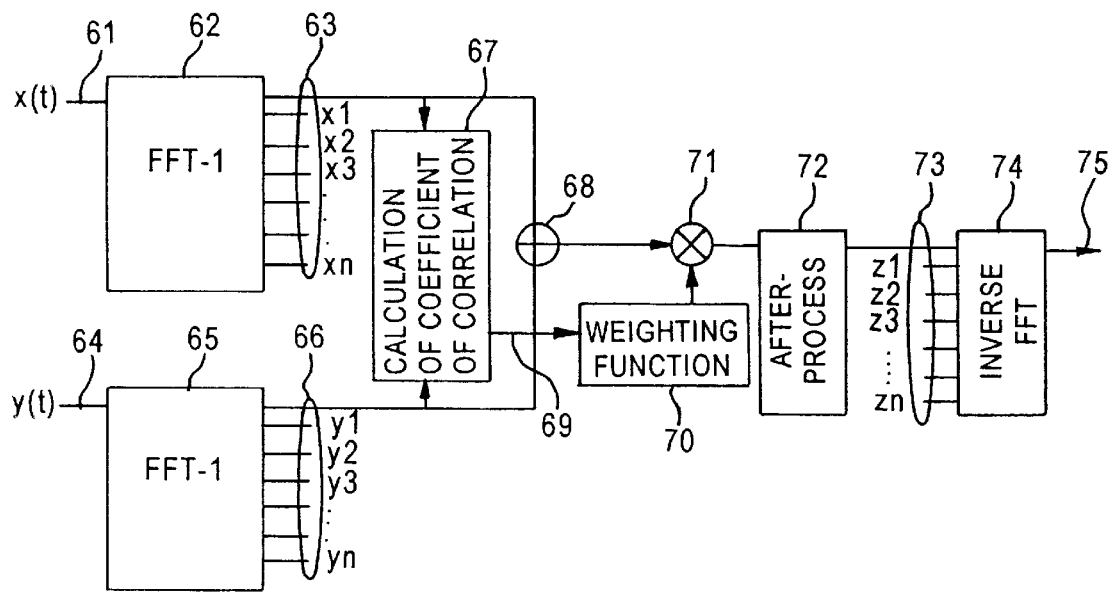
FIG. 24 is a block diagram showing an arrangement of a receiving circuit according to a twenty first embodiment of this invention.

FIG. 24 is a block diagram showing an arrangement of a receiving circuit according to a twenty first embodiment of this invention. In a digital modulating type communication system, this embodiment allows less power in a receiving system, simplifies the circuit, and permits reduction of power consumption. In FIG. 24, reference numeral 61 represents a first data input line for carrying a first received signal data obtained through a frequency converting circuit or a quadrature demodulating circuit, 62 designates a first Fourier transformer for carrying out a Fourier transform of a signal inputted from the first data input line 61, and 63 numeral depicts a first Fourier transformed output obtained by the first Fourier transformer 62. Further, the reference numeral 64 denotes a second data input line for carrying a second received signal obtained by the frequency converting circuit or the quadrature demodulating circuit, numeral 65 indicates a second Fourier transformer for performing a Fourier transform of a signal inputted through the second data input line 64, and numeral 66 stands for a second Fourier transformed output obtained by the second Fourier transformer 65. Moreover, reference numeral 67 shows a correlator for accepting the frequency component outputs of the first and second Fourier transformers 62, 65 at every frequency to calculate a coefficient of correlation, numeral 68 represents an adder for summing up the outputs of the first and second Fourier transformers 62, 65, numeral 69 designates an output of the correlator 67, numeral 70 depicts a weighting function device for accepting the obtained correlator output 69 to perform the weighting, numeral 71 denotes a weighting value multiplier for multiplying the addition output of the adder 68 to the output of the weighting function device 70, numeral 72 indicates an after-processing circuit for performing an after-process of the multiplication operation by the weighting value multiplier 71, numeral 72 indicates an inverse Fourier transformer input produced by the after-process of the output of the weighting value multiplier 71, numeral 74 stands for an inverse Fourier transformer for accepting the inverse Fourier transformer input to carry out the inverse Fourier transform process thereof, and numeral 75 denotes an inverse Fourier transform output.

Secondly, a description will be made hereinbelow of an operational principle and an operation of the twenty first embodiment. In the aforementioned first to thirteenth embodiments as the basic arrangement there are provided the first and second frequency converting circuit 2, 3, the first and second quadrature demodulating circuits 11, 12, or one frequency converting circuit and one quadrature demodulating circuit. With this arrangement, for the receiving operation, the receiving circuit can obtain the first and second received signals. In this embodiment, the first received signal is expressed by x(t) and inputted into the first data input line 61. The second received signal is expressed by y(t) and inputted into the second data input line 62. The first received signal x(t) inputted into the first data input line 61 is inputted into the first Fourier transformer 62 to be Fourier-transform-processed to provide the first Fourier-transformed output 63. On the other hand, the second received signal y(t) is inputted into the second Fourier transformer 65 to be Fourier-transform-processed to provide the second Fourier transformed output 66. With the Fourier transform processes in the first and second Fourier transformers 62, 65, the first and second received signal data inputted is transformed from the time base information into the frequency base information.

The first and second Fourier transformed outputs 63, 65 are fed into the correlator 67. The correlator 67 accepts the frequency components of the first and second Fourier transformed outputs 63, 65 at every frequency to calculate a coefficient of correlation. On the other hand, the first and second Fourier transformed outputs 63, 65 are inputted into the adder 68 apart from the calculation of the correlation coefficient by the correlator 67. This adder 68 adds both the Fourier transformed output signals thereto. In addition, The correlation coefficient outputted from the correlator 67 is inputted into the weighting function device 70 to be weighting-processed. Moreover, the weighting value multiplier 71 accepts the addition output of the adder 68 and the output of the weighting function device 70 to multiply an amount output signal thereby. Thereafter, the after-processing circuit 72 performs the after-process of the multiplying operation of the weighting value multiplier 71. The inverse Fourier transformer input 73 produced through this after-process is fed to the inverse Fourier transformer 74 to be inverse-Fourier-transform-processed, whereby the processing data is restored from the frequency base information into the time base information and the resultant signal represents the desired wave extraction result as the inverse Fourier transformed output 75. Then, a description will be made in terms of the theory of the desire wave extracting principle. First of all, the theory of the suppressing operation will be shown in the case that the desired wave does not come. A non-desired wave (existing independently between two signal systems with time) is synchronously added, before an amplitude component is increased to R times (where R denotes a coefficient of correlation). The operation expression in the correlator is as follows.

$$\text{Addition} \quad \frac{x+y}{2} \quad (51)$$

$$\text{Coefficient of Correlation} \quad R = \frac{|\sum \text{Re}(x^* \cdot y)|}{\sqrt{(\sum |x|^2)(\sum |y|^2)}}$$

$$\text{Weighting} \quad \text{when } R > 0, \ f(R) = R$$

$$\text{when } R < 0, \ f(R) = 0$$

If in each averaging window for calculation of the coefficient of correlation the power $P_{NO}$ of the non-desired wave takes a constant value, the power $P_N$ of the process output is expressed according to the following equation.

$$P_N = (R^2 P_{NO})/2$$

where $P_{NO}$: power of non-desired wave, R: coefficient of correlation.

This correlation coefficient R is calculated using a finite averaging window, and therefore a statistic error takes place so that it does not coincide with the real correlation coefficient. The calculation of R is made with the independent samples which is N in number. Since the real correlation coefficient should be zero, the distribution of R is expressed by the probability density function of the following equation.

Probability density function with respect to distribution of R is:

$$g(R) = \frac{\Gamma\left(\frac{N-1}{2}\right)}{\sqrt{\pi}\,\Gamma\left(\frac{N-2}{2}\right)}(1-R^2)^{\frac{N-4}{2}} \quad (52)$$

From the above, the average power $P_N$ of the process output is expressible by the following equation.

average power $$PN = \int_0^1 \frac{1}{2} R^2 P_{No} \cdot g(R)\,dR = \frac{P_{No}}{4(N-1)} \quad (53)$$

If the averaging window for the calculation of the coefficient of correlation is a rectangular window with a length of Tc and the length of the hamming window in carrying out the Fourier transform is taken as TF, the number N of the independent samples present in the averaging window is as follows.

N=(Tc)/(TF)

Accordingly, when the number N is large, the non-desired wave process output can be expressed by the following equation.

$$PN = \lim_{N \to \infty} \frac{P_{No}}{4(N-1)} = \frac{P_{No}}{4N} \propto \frac{T_F}{T_C} \quad (54)$$

That is, the output is in proportion to 1/N.

Furthermore, a description will be made hereinbelow of the suppressing operation for the non-desired wave in the case that the desired wave arrives. When the signal components are band-divided, they are divided into regions where the desired wave signal exists and regions where it does not exist. The amplitude of the kth band component containing the desired wave component is outputted with the multiplication of the coefficient of correlation R(k) of that band. The coefficient of correlation R(k) can be expressed by the following equation.

The coefficient of correlation in kth band containing a desired wave component is:

$$R(k) = \frac{P_{SO}(k)}{P_{SO}(k) + P_{NO}(k)} \quad (55)$$

where $P_{SO}(k)$: power of the kth frequency component of the desired wave component within the average time, $P_{NO}(k)$: power of the kth frequency component of the non-desired wave component within the average time.

When, in terms of k, $P_{SO}(k)$ and $P_{NO}(k)$ are constant values $P_{SO}$ and $P_{NO}$, the non-desired wave suppression effect is obtainable by the following equation.

$$\frac{\text{ratio of desired wave/non-desired wave in output signal}}{\text{ratio of desired wave/non-desired wave in input signal}} = \quad (56)$$

$$1 \Big/ \left( \frac{F_S}{2} + \frac{(1-F_S)}{4(N-1)} \frac{P_{SO} + P_{NO}}{P_{SO}} \right)$$

where Fs=(the number of bands containing the desired wave component)/(the total number of bands).

It is found from this equation that the improvement effect of the ratio of desired wave/non-desired wave becomes larger as the number of bands containing the desired wave component is smaller.

Thus, according to this embodiment, the non-desired wave suppression function can be realized using the statistic error of the coefficient of correlation obtained by the finite averaging window, i.e., the average time, and using the characteristic that the non-desired wave is time-independently present between two signal systems of the first and second received signals and treatable as unbalanced signal.

Twenty-Second Embodiment

FIGS. 25 to 33 are illustrations available for describing an arrangement and an operational principle of a receiving circuit according to a twenty-second embodiment of this invention. The above-described embodiments relate to method corresponding to a multiplexing digital modulating method such as to deal with a quadrature modulation signal. In this method, two quadrature demodulators are necessary, with the result that difficulty is experienced to reduce the power consumption and simplify the system. This embodiment relates to improvement of this point. In this embodiment, one quadrature demodulator is used, and hence secondary sampling is effected in the A/D converter to prevent the turning on the frequency axis and to produce, from the A/D converted output through a digital signal process, the quadrature-demodulated output, essentially necessary but not lost, due to the complementary local frequency.

Figure 25:
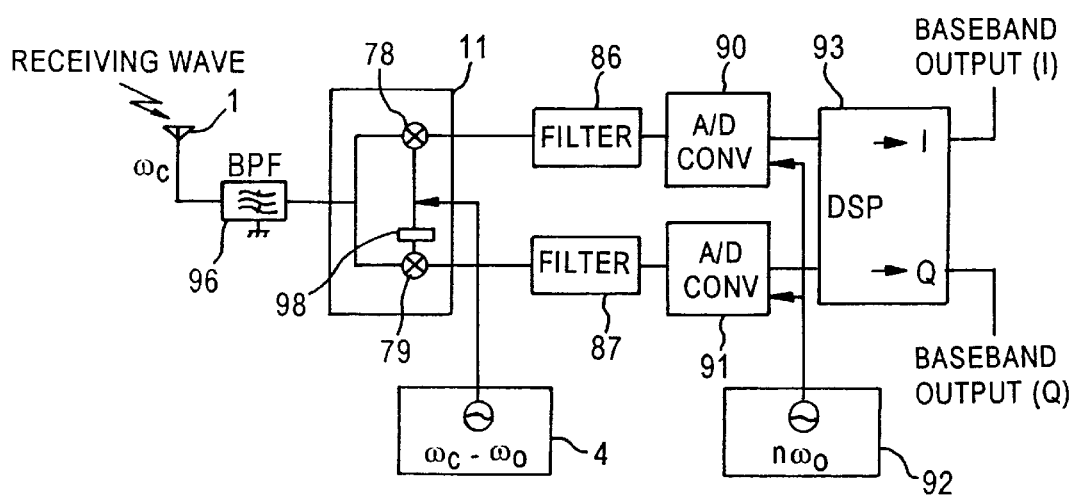
FIG. 25 is a concept illustration of a transformer in a twenty second embodiment of this invention.

FIG. 25 is a block diagram showing an arrangement of a receiving circuit according to a twenty second embodiment of this invention. In FIG. 25, reference numeral 1 denotes an antenna, numeral 96 depicts a reception bandpass filter being a bandpass filter for waveform-shaping a received signal at a given frequency band, numeral 11 represents a quadrature demodulator for accepting the received signal, numeral 4 designates a local frequency signal generating circuit, numeral 86 stands for a first low-pass filter for cutting the high-frequency band of one output signal of the quadrature demodulator 11, numeral 87 indicates a second low-pass filter for cutting the high-frequency band of the other output signal of the quadrature demodulator 11, numeral 90 signifies a first A/D converter for A/D-converting the output of the first low-pass filter 86, numeral 91 represents a second A/D converter for A/D-converting the output of the second low-pass filter 87, numeral 92 designates a sampling signal generating source having the function of supplying a clock with a frequency higher than a frequency corresponding to the band width of the received signal to the first and second A/D converter 90, 91, the function of adding a delayed pulse train to a sampling clock pulse train, and the function of providing the sampling clock pulse train and the delayed pulse train as the sampling pulses to the first and second A/D converters 90, 91, and numeral 93 denotes an operating unit for extracting a desired received channel signal from the digital output data of the first and second A/D converters 90, 91.

In this embodiment, the quadrature demodulator 11 is composed of first and second multipliers 78, 79 for accepting the received signal from the reception bandpass filter 96 to carry out a frequency conversion and a frequency offset circuit 98 for offset-processing the local oscillation frequency signal from the local frequency signal generating circuit 4 to give it to the second multiplier 79, thus performing the frequency converting process of the received signal.

Secondly, a description will be made hereinbelow of an operational principle and operation of the aforementioned twenty second embodiment. In FIG. 25, the received signal obtained through the antenna 1 passes through the reception bandpass filter 96 to come into an intended or aiming signal group within the band from which the I-axis component and Q-axis component are extracted through the quadrature demodulator 11. These signals are inputted into the first and second low-pass filters 86, 87 to remove their high-frequency unnecessary components, before are inputted into the first and second A/D converters 90, 91. For the A/D conversion operation in the A/D converters 90, 91, the sampling signal from the sampling signal generating source 92 is fed to the first and second A/D converters 90, 91 for carrying out the sampling operation. The digital data obtained through this sampling operation is led into the operating unit 93 to be digital-signal-processed to provide a baseband output. If the ordinary sampling is effected in the A/D converters 90, 91, an alias occurs due to the sampling so that the digital frequency conversion to be made afterwards becomes impossible.

Figure 26A:
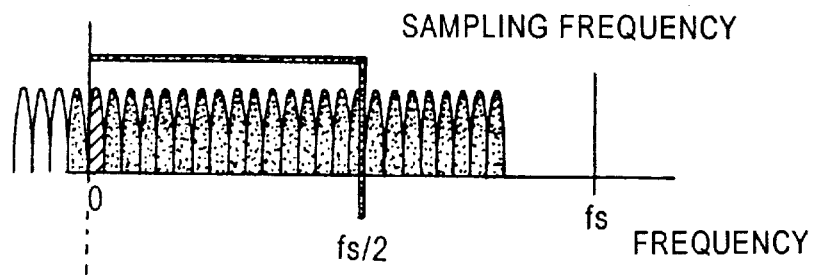
FIG. 26 is an illustration for explaining a state of an alias generated as a result of sampling by an A/D converter in the twenty second embodiment of this invention.
Figure 26B:
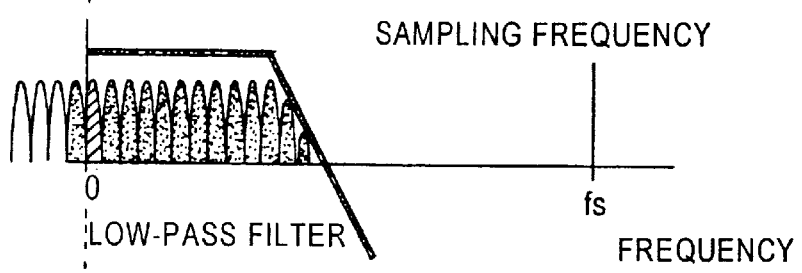
Figure 26C:
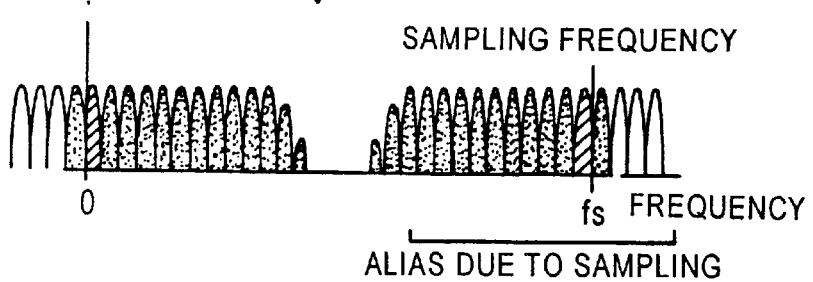

FIG. 26 is an illustration of the occurrence of an alias at the sampling by the A/D converters 90, 91. In FIG. 26, when a signal shown in (A) is supplied and passed through a low-pass filter, the high-frequency component is removed as shown in (B). When this high-frequency-component-removed signal is sampled, as shown in the A/D-converted output illustration of (C), an alias arises. For this reason, in this embodiment, means is provided for avoiding the turning on the frequency axis which causes the occurrence of the alias. This will be described hereinbelow with reference to equations.

Now, when the carrier frequency is taken to be fc and the QPSK sub-carrier frequency is taken as fo, the radio signal $f_{RF}$ can be expressed as follows.

$$f_{RF} = A(t)\cos\{2\pi(f_c + f_o)t + \theta(t)\} \tag{57}$$

$$= A(t)\cos\{2\pi(f_c + f_o)t + \theta a(t)\} +$$

$$A(t)\sin\{2\pi(f_c + f_o)t + \theta a(t)\}$$

In this equation, the phase signal θ(t) is θ(t)=0, ±π/2, π. A consideration is taken of a multi-channel communication system such as a PDC. FIG. 27 is a model showing a state of a receiving channel in a multi-channel communication system. Now, let it be assumed that as shown in FIG. 27 the respective channel are disposed at an equal interval on the frequency axis. Further, it is assumed that the channel spacing frequency is fb. When the N channels arrive after being passed through the input filter of the receiver, the input signal $f_{IN}$ is as follows.

$$f_{IN} = \sum_{i=0}^{N-1} Ai(t)\cos\{2\pi(f_c + i \times f_b + f_o)t + \theta_{ai}(t)\} + \tag{58}$$

$$\sum_{i=0}^{N-1} Ai(t)\sin\{2\pi(f_c + i \times f_b + f_o)t + \theta_{ai}(t)\}$$

In this instance, if the respective channels are close to each other, 2fo=fb, and hence the input signal $f_{IN}$ can be written as follows.

$$f_{IN} = \sum_{i=o}^{N-1} Ai(t)\cos\{2\pi(f_c + [2i+1]f_o)t + \theta_{ai}(t)\} + \tag{59}$$

$$\sum_{i=o}^{N-1} Ai(t)\sin\{2\pi(f_c + [2i+1]f_o)t + \theta_{ai}(t)\}$$

This signal group undergoes a frequency conversion being a direct conversion. In general, if the frequency conversion is effected to lower the frequency by $f_{LO}$ and the frequency of the resultant signal is taken as $f_{DC}$, this frequency $f_{DC}$ can be expressed by the following equation.

$$f_{DC} = f_{IN} \times f_{LO} \tag{60}$$

$$= \sum_{i=o}^{N-1} Ai(t)\cos\{2\pi(f_c - f_{LO} + [2i+1]f_o)t + \theta_{ai}(t)\} +$$

$$\sum_{i=o}^{N-1} Ai(t)\sin\{2\pi(f_c - f_{LO} + [2i+1]f_o)t + \theta_{ai}(t)\} +$$

$$\sum_{i=o}^{N-1} Ai(t)\cos\{2\pi(f_c + f_{LO} + [2i+1]f_o)t + \theta_{ai}(t)\} +$$

$$\sum_{i=o}^{N-1} Ai(t)\sin\{2\pi(f_c + f_{LO} + [2i+1]f_o)t + \theta_{ai}(t)\}$$

In the above equation, the later two items are ordinarily easily blocked by the circuit frequency characteristic because the frequency is increased to two times the RF frequency. Accordingly, the frequency fDC after the frequency conversion can be given as the following equation.

$$f_{DC} = f_{IN} \times f_{LO} \tag{61}$$

$$= \sum_{i=o}^{N-1} Ai(t)\cos\{2\pi(f_c - f_{LO} + [2i+1]f_o)t + \theta_{ai}(t)\} +$$

$$\sum_{i=o}^{N-1} Ai(t)\sin\{2\pi(f_c - f_{LO} + [2i+1]f_o)t + \theta_{ai}(t)\}$$

In this case, some channels causes fc–$f_{LO}$) to be negative. That is, the frequency is negative. This means that, of the polarities of the phase rotating plane of the QPSK signal, the Q axis is inverted, that is, means only that the rotation of the QPSK signal is reversed. Accordingly, even if the polarity of the frequency is negative, the signal does not disappear.

Subsequently, for digital conversion, this signal is supplied to the A/D converters 90, 91. In this case, the A/D converters 90, 91 are equivalent to sampling, and the outputs thereof take discrete states. In the discrete process, the signals before and after the process does not always have one-to-one relation to each other. In many cases, an alias occurs. Accordingly, the signal to be A/D-converted is made to be lower than ½ of the A/D conversion frequency or a plurality of conversion signal trains for the A/D conversion are used (high-order sampling).

A consideration is taken of a physical meaning of the negative frequency to find a way for using the negative region on the frequency axis. In the following equation, the carrier of the QPSK is set to a negative frequency. The position of the negative signal is moved mathematically and the negative signal is rewritten to time and function value. In the following equation, the uppermost portion represents a negative frequency, the second portion represents a negative time axis, and the lowermost portion shows a negative function.

$$f_{RF} = A(t)\cos\{2\pi(-f_c)t + \theta a(t)\} + A(t)\sin\{2\pi(-f_c)t + \theta a(t)\} \quad (62)$$
$$= A(-t)\cos\{2\pi f_c(-t) + \theta a(-t)\} + A(-t)\sin\{2\pi f_c(-t) + \theta a(-t)\}$$
$$= A(t)\cos\{2\pi f_c t + \theta a(t)\} - A(t)\sin\{2\pi f_c t + \theta a(t)\}$$

FIG. 28 is an illustration of an A/D converted output with a negative frequency domain. The physical meaning of the negative domain of the frequency does not differ from the behavior of the positive frequency domain as far as viewing the above equation. However, the expression of –fc means that the fc is treated as being positive and the advancing direction on the frequency axis or the direction of the line of sight is opposite, that is, means that the rotation on the frequency circumference is reversed. It can be considered that the fact that the frequency is zero indicates a state that it does not move anywhere on the circumference. Since the QPSK operation that θa(t) behaves is implemented at that position, the spectrum signifies the bandwidth of the QPSK information.

For example, the RF signal and the local signals fed to the first and second multipliers 94, 95 fight with each other in terms of the rotating direction on the respective frequency circles in the frequency conversion. In lowering the frequency, they complete with each other to give the rotation in the opposite direction. As the frequency approaches zero, the rotating speed decreases and the rotation stops finally. When further advancing, the opposite-direction speed of the local signal side becomes higher so that the rotating direction becomes reversed.

From the above, in this theorical development, the signal spectrum that the result gets into a negative frequency domain due to the frequency conversion or the like is not expressed to have a turning to the positive domain, but expressed such that the frequency axis continues in the positive and negative directions. This is for the purpose of expressing that the signal itself has information comprising a plurality of axes like the QPSK signal and others. According to the general prior expression, the frequency domain is limited to the positive region and the spectrum is turned to narrow the frequency space, thereby losing the degree of freedom of the expression by one.

Figure 29:
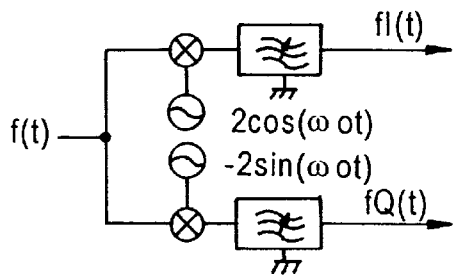
FIG. 29 is an illustration of a method of dividing a signal component into quadrature components on the basis of a cosine function and a sin function by utilizing a $\pi/2$ phase difference in the twenty second embodiment of this invention.

On the other hand, the signal itself needs to be divided so as to discriminate in the quadrature space that it forms the phase space as time, i.e., phase function. FIG. 29 shows a method for decomposing a signal component in quadrature components with a cosine function and a sine function by utilizing the phase difference of π/2. In this illustration, because being expressed by the cosine function, fI(t) does not depend upon the positive and negative on the frequency axis (even function). Since fQ(t) is expressible by the sine function, when the frequency is in the negative region, the sign of the function inverts (odd function).

By using the above-mentioned two methods, unlike the conventional spectrum disposition that, in the A/D conversion, the conversion frequency (or sampling frequency) fs is taken as a turning point and the high frequency side is turned to less than the conversion frequency fs, the image spectrum over the conversion frequency fs is directly expressible.

Figure 30:
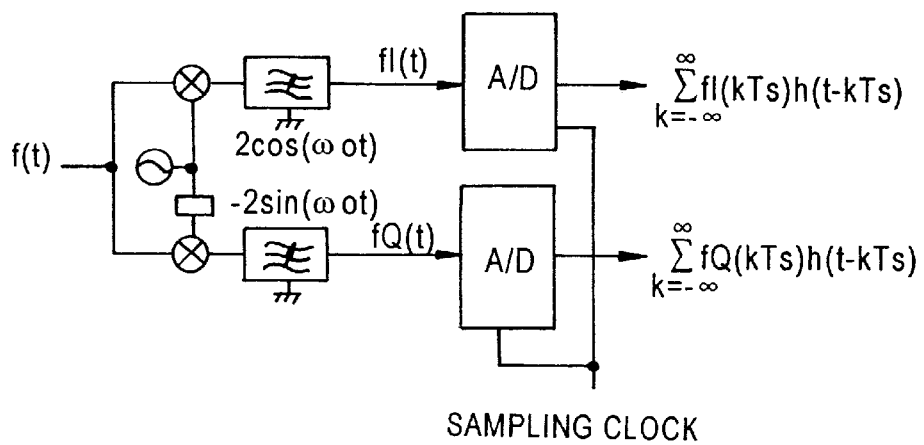
FIG. 30 is an illustration of one example of a quadrature sampling operation in the case of A/D conversion of two orthogonal signals in the twenty second embodiment of this invention.

Then, these two orthogonal signals are subjected to A/D conversion. The frequency domains of the two orthogonal signals are at the vicinity of the baseband, and it is sufficient that the conversion speed is more than two times that of the intended signal by the shannon's sampling theorem. FIG. 30 is an illustration of one example of an quadrature sampling in the case that two orthogonal signals are A/D-converted. The arrangement of FIG. 30 clearly shows the signal flowing into parts in the arrangement from the reception bandpass filter 96 to the first and second A/D converter 90, 91. In FIG. 30, Ts represents the sampling period. In this A/D converting operation, the sampling frequency ωs has a relation of ωs>ωo and forms a pair of sampling trains of fI(t) and fQ(t). According to this method, since the signal f(t) is sampled as a point on the IQ plane, the information such as the rotating direction of the signal is obtainable and can be converted into a digital form.

Figure 31:
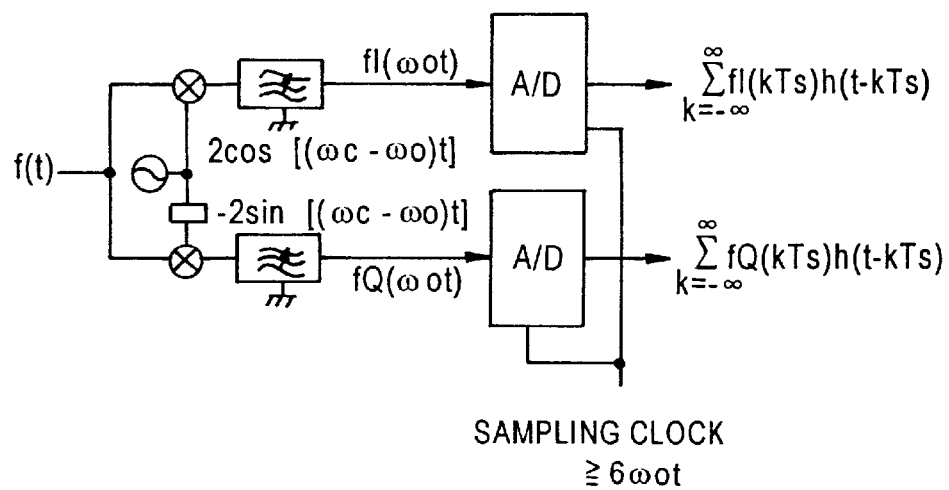
FIG. 31 is an illustration available for describing quadrature sampling taking offset in consideration.

If taking into account the frequency offset being a main point of this embodiment, the FIG. 30 arrangement becomes as shown in FIG. 31. That is, the local frequency is changed from ωc into ωc–ωo so that the offset frequency of ωo remains in the output signal. Since the frequency ωo being the transmission speed of the baseband signal and the frequency offset ωo are contained in the signals fI(ωot) and fQ(ωot) to be supplied to the A/D converters 90, 91, in the case of the base band transmission below a roll-off rate of 0.5, the frequency band width of 3ωo centering on the carrier frequency is considered to be contained therein. Accordingly, if the frequency of the sampling clock is more than 6ωo, it works sufficiently. Because the signal f(t) is sampled as a point on the IQ plane, the information such as the rotating direction of the signal can be ensured and converted into a digital form in a state that the continuity of the frequency axis in the positive and negative directions can be kept.

Accordingly, both the positive and negative frequency conversions of the digital signal output of this receiving circuit is are possible through the digital signal processing. That is, With the digital frequency conversion of minus 2ωo, the signals fI(–ωot) and fQ(–ωot) are obtainable from the signals fI(ωot) and fQ(ωot). As a result, according to the above-mentioned method, only one of the pairs of quadrature demodulators relaying on the complementary local oscillation frequency is used, whereby the high-frequency circuit is simplified up to approximately half and the power consumption is reducible.

Figure 32:
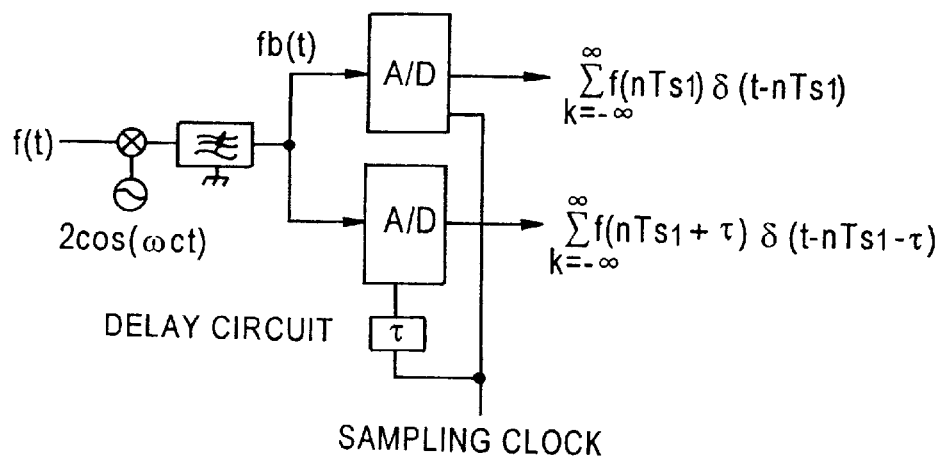
FIG. 32 is an illustration of an example of a quadrature sampling operation different from those of FIGS. 30 and 31 in the case of the A/D conversion of two orthogonal signals in the twenty second embodiment of this invention.

FIG. 32 is an illustration for describing another sampling operation different from the quadrature sampling (FIGS. 30 and 31) in the case of carrying out the aforesaid A/D conversing operation.

Figure 33:
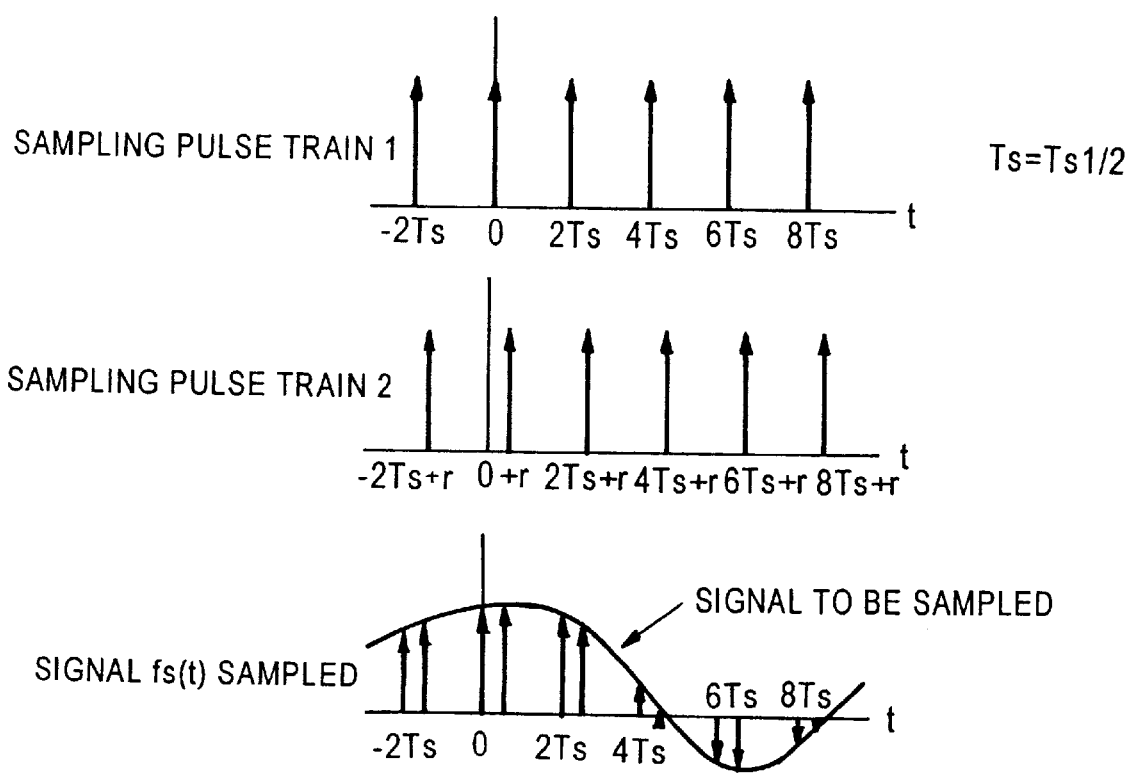
FIG. 33 is an illustration of sampling pulses obtainable in performing the quadrature sampling operation shown in FIG. 32 in the twenty second embodiment of this invention.

This is based on the so-called shannon's secondary sampling. In this sampling method, as shown in FIG. 32 a signal fb(t) obtained by lowering a high-frequency input signal f(t) to the baseband through the frequency conversion is coupled to two A/D converter systems. With this arrangement, sampling pulses arranged as conversion pulses (sampling pulses)

at an equal time interval as shown in FIG. 33 is attained in the form of two-system pulse trains in a state with a delay time τ. In consequence, as shown in FIG. 33 the signal to be sampled is sampled with doubled pulses. The sampling frequency is set to be more than the frequency band width of the signal. That is, in the above case, since the transmitting speed of the baseband signal fb(t) is ωo, in the case that the roll-off rate is below 0.5, the frequency band width becomes approximately 3ωo. Whereupon, it is sufficient that the sampling frequency is also 3ωo. With such sampling, the phase space can also extract the components other than the real axis at the frequency of the signal being sampled, and hence the information obtained continues on the frequency axis in the positive and negative directions. However, If the delay amount is set to a value corresponding to π, only the real axis component is obtained, with the result that it is required to select the phase shifting amount other than π. If this method is made to be of the frequency offset type according to this invention, it becomes as shown in FIG. 33.

Twenty-Third Embodiment

Figure 34:
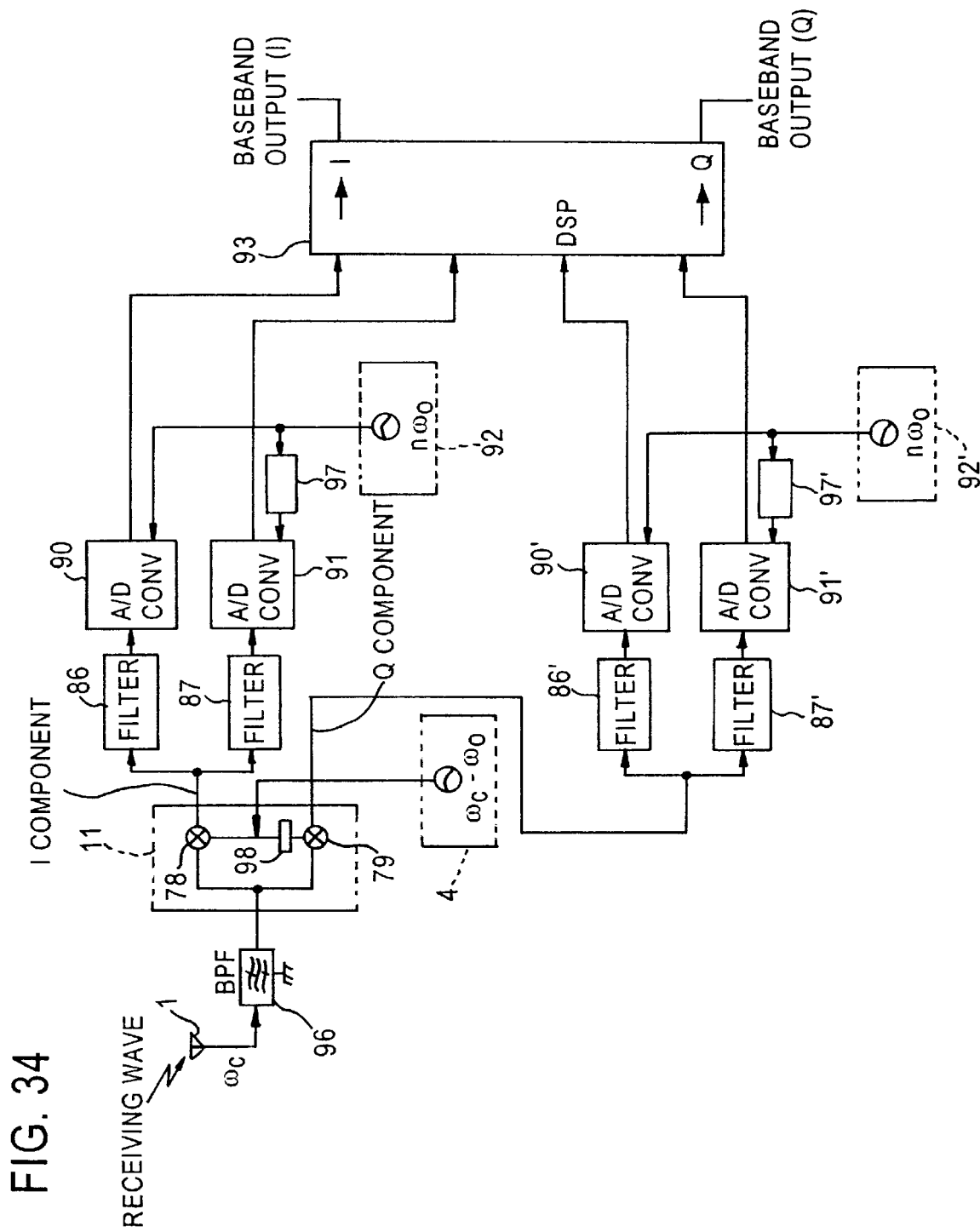
FIG. 34 is a block diagram showing an arrangement of a receiving circuit according to a twenty third embodiment of this invention.
Figure 35:
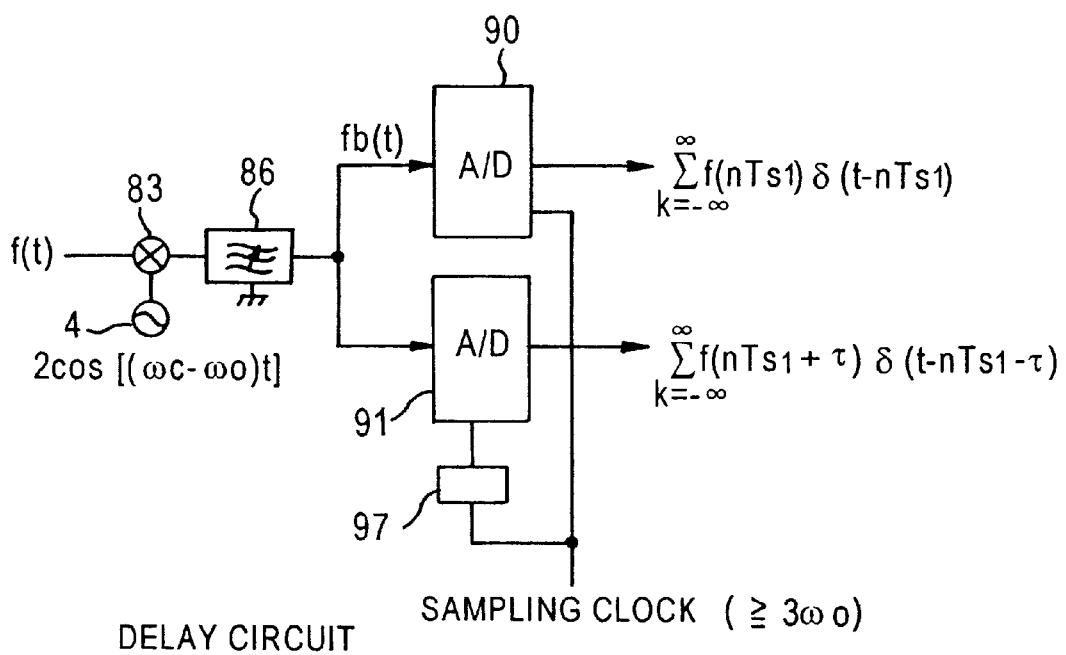
FIG. 35 is an illustration of a quadrature sampling operation in the case of A/D conversion of two orthogonal signals in the twenty third embodiment of this invention.

FIGS. 34 and 35 are illustrations for describing an arrangement and an operational principle of a receiving circuit according to a twenty third embodiment of this invention. Similarly, this twenty third embodiment is based upon the same concepts as that of the twenty second embodiment, and the number of the quadrature demodulator is reduced to one so as to lessen the power consumption and simplify the system. For this purpose, the secondary sampling is performed in the A/D converter in order to avoid the turning on the frequency axis and to produce the frequency-converted output due to the complementary frequency, essentially necessary but lost, from the A/D converted output by means of the digital signal processing.

FIG. 34 is a block diagram showing an arrangement of a receiving circuit according to the twenty third embodiment. In FIG. 34, reference numeral 1 represents an antenna for accepting a signal being received, numeral 96 designates a reception bandpass filter for waveform-shaping the received signal in a given frequency band, numeral 11 denotes a quadrature demodulator for accepting the received signal, numeral 4 depicts a local frequency signal generating circuit, 86 stands for a first low-pass filter for cutting a high-frequency band of one output signal (I) from the quadrature demodulator 11, numeral 87 indicates a second low-pass filter for cutting a high-frequency band of the aforesaid one output signal (I) from the quadrature demodulator 11, numeral 90 represents a first A/D converter for A/D-converting the output of the first low-pass filter 86, numeral 91 designates a second A/D converter for A/D-converting the output of the second low-pass filter 87, numeral 92 signifies a sampling signal generating source having a function of generating a clock signal with a frequency higher than a frequency corresponding to a bandwidth of the received signal to supply the clock signal as a sampling pulse signal to the first and second A/D converters 90, 91, and numeral 97 denotes a delay circuit for offsetting the sampling clock signal from the sampling signal generating source 92 to supply the offset signal to the second A/D converter 91. In addition, the other output signal Q of the quadrature demodulator II is given to a Q-axis side circuit section having the same arrangement as the I-axis side circuit section comprising the aforementioned filters 86, 87, A/D converters 90, 91, sampling signal generating source 92 and delay circuit 97. The parts making up the Q-axis side circuit section are marked with the same numerals as those of the I-axis side circuit section, but dashes are added to the numerals, in order to make clear the corresponding relationship. Furthermore, numeral 93 depicts an operating unit for extracting a desired reception channel signal from the digital output data of the first and second A/D converters 90, 90', 91 and 91' in both the I-axis and Q-axis sides.

In this instance, in place of the provision of the two low-pass filters 86, 87, a single low-pass filter (for example, the low-pass filter 86) can be used in common for the two A/D converters 90, 91 in such a way that the output of the filter is coupled to the inputs of the A/D converters 90, 91. Moreover, the respective ones of the sampling signal generating sources 92, 92' and the delay circuits 97, 97' can be used for both the I-axis side circuit section and Q-axis side circuit section.

Secondly, a description will be made hereinbelow of an operational principle and operation of the aforementioned twenty third embodiment. In FIG. 34, the received signal obtained through the antenna 1 passes through the reception bandpass filter 96 to come into an intended signal group within the band, from which the I-axis component and the Q-axis component are extracted through the quadrature demodulator 11. This I-axis component signal is inputted into the first and second low-pass filters 86, 87 to remove the high-frequency unnecessary components, the filtered signals being inputted into the first and second A/D converters 90, 91. For the A/D conversion operation in the A/D converters 90, 91, the sampling signal from the sampling signal generating source 92 is directly fed to the first A/D converters 90. Meanwhile, after being frequency-offset in the delay circuit 97, it is fed to the second A/D converter 91, thus performing the sampling process. The Q-axis component undergoes the similar sampling process. The four digital data obtained through this sampling operations are led into the operating unit 93 to be digital-signal-processed to provide a baseband output.

FIG. 35 is an illustration of one example of the quadrature sampling in the case that two orthogonal signals are A/D-converted, in the twenty third embodiment. The FIG. 35 arrangement obviously shows the signals flowing the parts in the arrangement from the reception bandpass filter 96 to the first and second A/D converters 90, 91 of the I-axis side circuit section in FIG. 34, where the illustration of the Q-aixs side circuit section is omitted for simplicity. In FIG. 35, Ts1 is indicative of a sampling period. In this embodiment, since the frequency conversion includes the offset frequency ωo, the offset remainder ωo is present in the output signal. In this state, as described in the aforesaid twenty second embodiment, the offset frequency ωo is used as the carrier, and the signal band with a spectrum developing the transmission speed of ωo is made. At this time, the shannon's secondary sampling theorem has a sampling frequency above the signal band width, and with the pulse train undergoing the delay τ being also added, it is possible to sample all the information amount including the original signals. Accordingly, in a case where the roll-off rate is below 0.5, the frequency band width of the aforesaid signal fb(t) is about 3ωo, and hence the sampling frequency can be set to 3ωo. As described before, the delay time τ can take a value other than the phase π of the signal fb(t). Particularly, if τ=π/2, the output can form an orthogonal IQ plane.

Since from the above the signal fb(t) is sampled as a point on the orthogonal IQ plane, it is possible to obtain the information such as the rotating direction of the signal and further to keep the continuity of the frequency axis in the positive and negative directions, which allows digital conversion. Accordingly, it is also possible that the digital signal output of this receiving circuit is frequency-converted through the digital signal process in both the positive and negative directions. That is, with the digital frequency conversion of minus 2ωo, the signals fI(−ωot) and fQ(−ωot) are obtainable from the signals fI(ωot) and fQ(ωot). As a result, according to the above-mentioned method, only one of the pairs of quadrature demodulators depending on the complementary local oscillation frequency is used, whereby the high-frequency circuit is simplified up to approximately half and the power consumption is reducible. Incidentally, it is equivalent to use one A/D converter and integrally supply the sampling pulses. That is, referring to the FIG. 25 example, the first and second A/D converters 90, 91 are replaced with one A/D converter, and the sampling pulse for the first A/D converter 90 and the sampling pulse due to the delayed pulse train for the second A/D converter 91 are made to be received through a common sampling input section of the one A/D converter. In this instance, two systems of digital output data outputting sections are provided so as to separately output and supply the digital output data due to the non-delayed sampling pulse train and the digital output data due to the delayed sampling pulse train. It is also possible to provide a receiving circuit with such an arrangement.

Twenty-Fourth Embodiment

Figure 36:
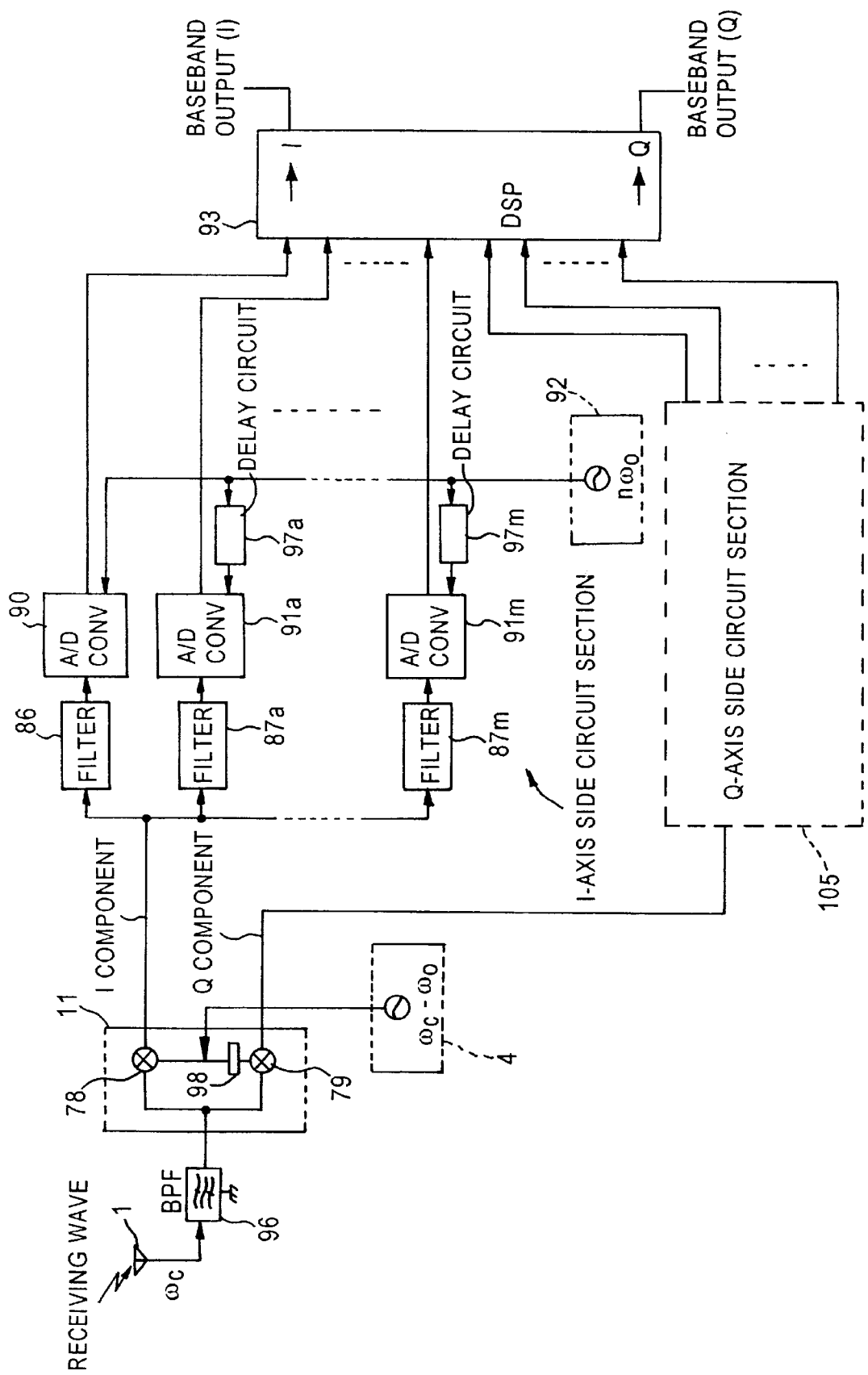
FIG. 36 is a block diagram showing an arrangement of a receiving circuit according to a twenty fourth embodiment of this invention.
Figure 37:
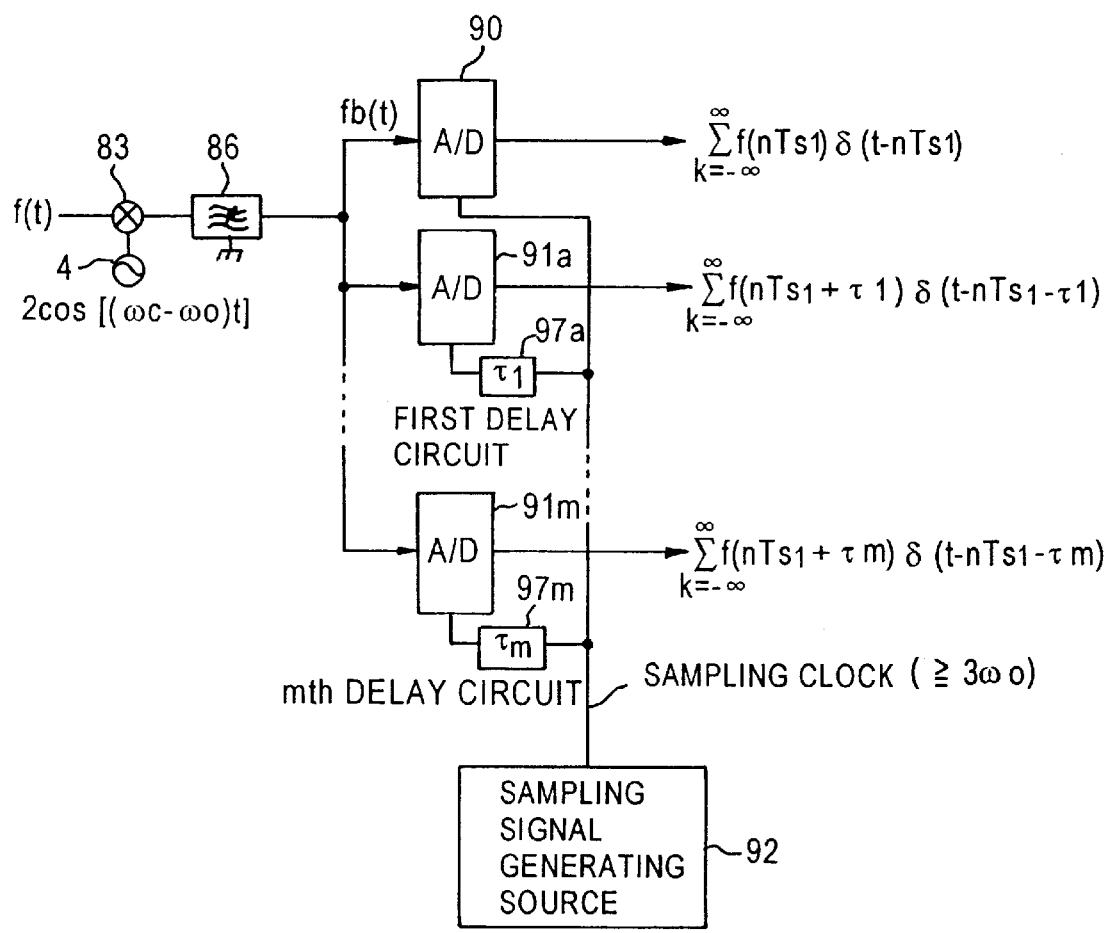
FIG. 37 is an illustration of a quadrature sampling operation in the case of A/D conversion of two orthogonal signals in the twenty fourth embodiment of this invention.

FIGS. 36 and 37 are illustrations for describing an arrangement and an operational principle of a receiving circuit according to a twenty fourth embodiment of this invention. Similarly, this twenty fourth embodiment is based upon the same concepts as that of the twenty third embodiment, and the number of the quadrature demodulator is reduced to one so as to lessen the power consumption and simplify the system. In this instance, a plurality of A/D converters (two or more converters) are provided, and the secondary sampling is performed in the A/D converter in order to avoid the turning on the frequency axis and to produce the frequency-converted output due to the complementary local frequency, essentially necessary but lost, from the A/D-converted output by means of the digital signal processing.

FIG. 36 is a block diagram showing an arrangement of a receiving circuit according to a twenty fourth embodiment of this invention. In FIG. 36, there are shown an antenna 1 for accepting a signal being received, a reception bandpass filter 9 being a bandpass filter for waveform-shaping the received signal at a given frequency band, a quadrature demodulator 11 for accepting the received signal, a local frequency signal generating circuit 4, a first low-pass filter 86 for cutting off the high-frequency band of one output signal (I) of the quadrature demodulator 11, a plurality of second and following low-pass filters 87a to 87m for cutting off the high-frequency band of the aforesaid one output signal (I) of the quadrature demodulator 11, the number of the low-pass filters being equal to the number of second and following A/D converters which will be noted later, a first A/D converter 90 for A/D-converting the output of the first low-pass filter 86, a plurality of second and following A/D converters 91a to 91m for A/D-converting the outputs of the second and following low-pass filters 87a to 87m, respectively, a sampling signal generating source 92 for supplying a clock with a frequency higher than a frequency corresponding to the band width of the received signal to the first, second and following A/D converters 90, 91a to 91m, and a plurality of delay circuits 97a to 97m for offsetting the sampling clock signal from the sampling signal generating source 92 to supply it to the second and following A/D converters 91a to 91m, respectively. As well as the FIG. 34 arrangement, in the FIG. 36 arrangement the one output (I) of the quadrature demodulator 11 is supplied to the I-axis side circuit section while the other output (Q) thereof is given to a Q-axis side circuit section 105 having the same arrangement as the I-axis side circuit section. Reference numeral 93 depicts an operating unit for extracting a desired reception channel signal from the digital output data of the first, second and following A/D converters 90, 91a to 91m. In this embodiment, the number of the second and following A/D converters 91a to 91m is m, and correspondingly the numbers of the low-pass filters 87 and the delay circuits 97 are also m.

Further, as well as the twenty third embodiment, the sampling signal generating source and the delay circuit can be used in common for the I-axis side circuit section and the Q-axis side circuit section.

Secondly, a description will be made hereinbelow of a operational principle and an operation of the twenty fourth embodiment. In FIG. 36, the signal received by the antenna 1 passes through the reception bandpass filter 96 to come into an intended signal group within the band, from which the I-axis component and Q-axis component are extracted through the quadrature demodulator 11. This I-axis component is inputted into the first, second and following low-pass filters 86, 87a to 87m to remove the high-frequency unnecessary component, before inputted into the first, second and following A/D converters 90, 91a to 91m. For the A/D conversion operation in the A/D converters 90, 91a to 91m, the sampling signal from the sampling signal generating source 92 is directly fed to the first A/D converters 90. Meanwhile, after being frequency-offset in the delay circuits 97a to 97m, it is fed to the second and following A/D converters 91a to 91m, subsequently undergoing the sampling process. The similar sampling process is also made to the Q-axis component. The plurality of digital data obtained through these sampling operations are led into the operating unit 93 to be digital-signal-processed to provide a baseband output.

FIG. 37 is an illustration of one example of the quadrature sampling in the case that two orthogonal signals are A/D-converted, in the twenty fourth embodiment. FIG. 37 arrangement obviously shows the signals flowing the parts in the arrangement from the reception bandpass filter 96 to the first, second and following A/D converters 90, 91a to 91m of the I-axis side circuit section in FIG. 36. In FIG. 37, Ts1 is indicative of a sampling period. In this embodiment, (m+1)-order sampling is effected by (m+1) A/D converters different in delay time. Accordingly, it is possible to simplify the high-frequency circuit for the signal in the case of the digital modulation and multiplexing. In consequence, according to the aforesaid method, the complicatedly multiplexed digital-modulated signal can also be covered by only one of the pairs of frequency converters relying on the complementary local oscillation frequency, whereby the high-frequency circuit is simplified up to approximately half and the power consumption is reducible. Incidentally, it is equivalent to use one A/D converter and integrally supply the sampling pulses.

Twenty-Fifth Embodiment

Figure 38:
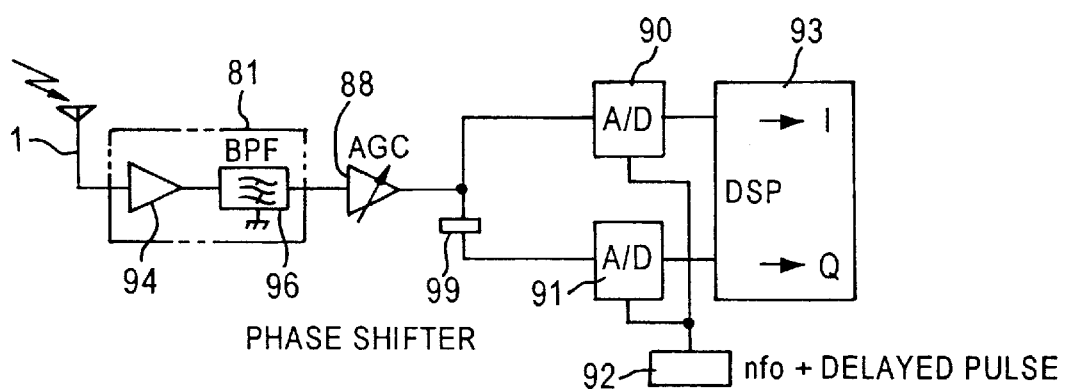
FIG. 38 is a block diagram showing an arrangement of a receiving circuit according to a twenty fifth embodiment of this invention.

FIG. 38 is a block diagram showing an arrangement of a receiving circuit according to a twenty fifth embodiment of this invention. In FIG. 38, there are shown an antenna 1, a received signal inputting circuit 81 for accepting the received signal from the antenna 1, a gain control circuit (AGC) 88 for performing the gain control of the received signal, a first A/D converter 90 for A/D converting the output signal of the gain control circuit 88, a second A/D converter 91 for accepting the output signal of the gain control circuit 88 as a signal of a system different from the first A/D converter 90 to A/D convert it, a sampling signal generating source 92 for supplying a clock with a frequency higher than a frequency corresponding to the band width of the received signal to the first and second A/D converters 90, 91, and for adding a delayed pulse train to a sampling clock pulse train to provide the sampling clock pulse train and the delayed pulse train as the sampling pulses to the first and second A/D converters 90, 91, and an operating unit 93 for extracting a desired received channel signal from the digital output data of the first and second A/D converters 90, 91. The received signal inputting section 81 is composed of an amplifier 94 and a bandpass filter (receiving band) 96. In addition, a phase shifter 99 is placed between the gain control circuit 88 and the second A/D converter 91.

Secondly, a description will be made hereinbelow of an operational principle and an operation of the twenty fifth embodiment. A signal group received by the antenna 1 gets into signals of only the communication channel band by means of the received signal inputting circuit 81 including the reception bandpass filter 96. This signal is gain-adjusted through the gain control circuit 88 to turn into a signal with a given level which in turn, is fed to the first A/D converter 90, where from the sampling signal generating source 92 there is obtained sampling pulses comprising a pulse group with a frequency n times the frequency ωo (n: an integer) and a pulse group with the same frequency delay-processed. Thus, the received signal undergoes the secondary sampling operation by the first A/D converter 90 and is converted into data centering on the desired channel signal, before being supplied to the operating unit 93.

The received signal gain-adjusted by the gain control circuit 88 to have a give level is inputted through another system signal line into the phase shifter 99 to be phase-processed, before being fed to the second A/D converter 91, where from the sampling signal generating source 92 there is obtained sampling pulses comprising a pulse group with a frequency n times the frequency ωo (n: an integer) and a pulse group with the same frequency delay-processed. Thus, the received signal undergoes the secondary sampling operation by the second A/D converter 91 and is converted into data centering on the desired channel signal, before being supplied to the operating unit 93. The information on the frequency conversion with ωc−ωo is produced on the basis of both the data, and the correlation operation is effected to extract the desired signal as a common wave.

Figure 39:
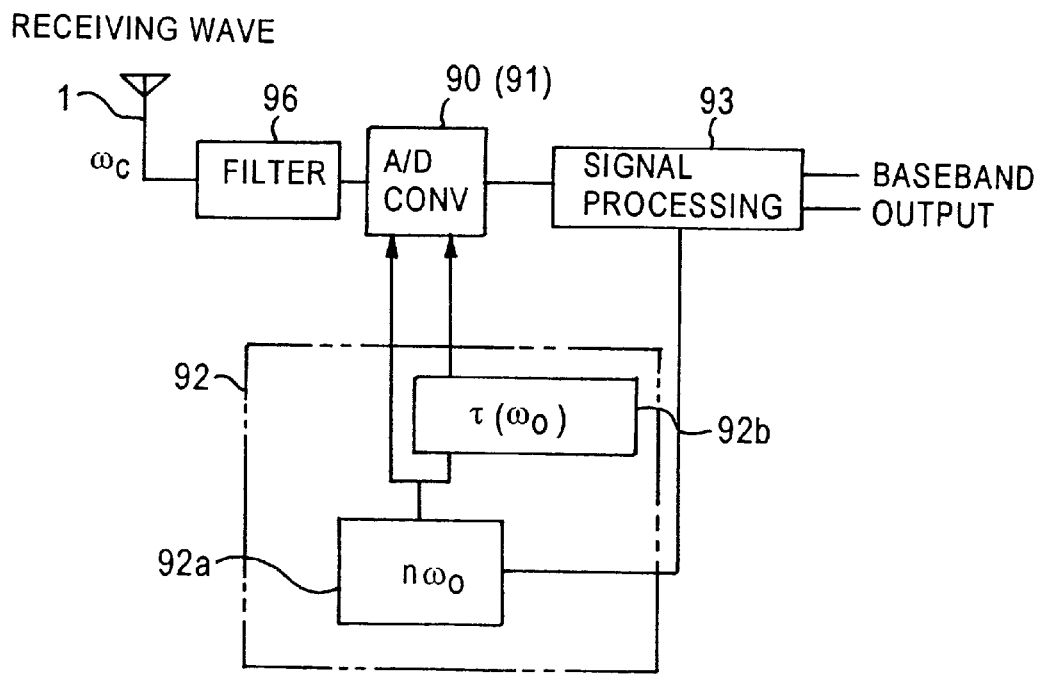
FIG. 39 is a simplified block diagram for describing one operation of a sampling signal generating source portion in the twenty fifth embodiment of this invention.

FIG. 39 is an illustration for describing one example of an operation of the sampling signal generating source 92 in the twenty fifth embodiment, and is a block diagram schematically and briefly showing one A/D converter (for example, 90), the sampling signal generating source 92 and other portions other than the operating unit 93 in the FIG. 38 arrangement. In the FIG. 39 arrangement, a pulse group with a frequency n times the frequency ωo (n: an integer) is produced in the sampling signal generating source 92 and the delay operation is made τ time for ωo in the delay circuit and the result is added to a pulse train from the sampling clock generator.

Figure 40:
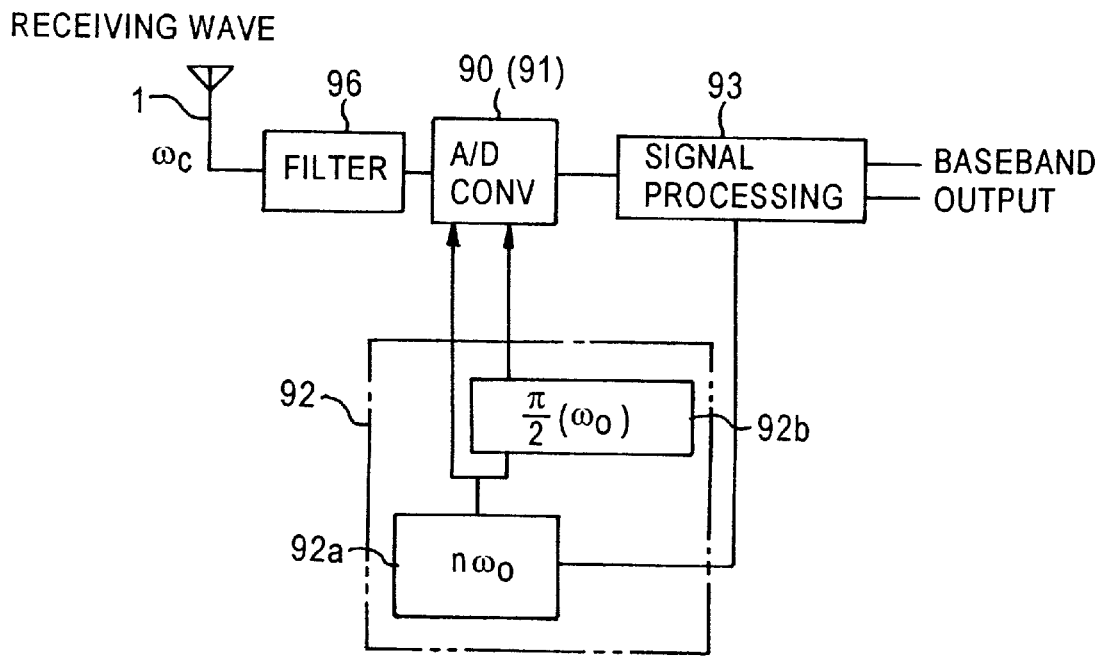
FIG. 40 is a simplified block diagram for describing another operation of a sampling signal generating source portion in the twenty fifth embodiment of this invention.

FIG. 40 is an illustration for describing another example of an operation of the sampling signal generating source 92 in the twenty fifth embodiment, and is a block diagram schematically and briefly showing the first A/D converter 90, the sampling signal generating source 92 and the other portions other than the operating unit 93 in the FIG. 38 arrangement. In the FIG. 40 example, the sampling signal generating source 92 produces a pulse group with a frequency n times the frequency ωo (n: an integer) and the delay circuit performs the delay operation for ωo by time corresponding to π/2, thus generating the pulse train from the sampling clock generator and the delayed pulse train from the delayed-pulse-train-adding circuit, particularly delayed pulses delayed by a phase difference time corresponding to π/2 with respect to the frequency of the desired channel signal.

Figure 41:
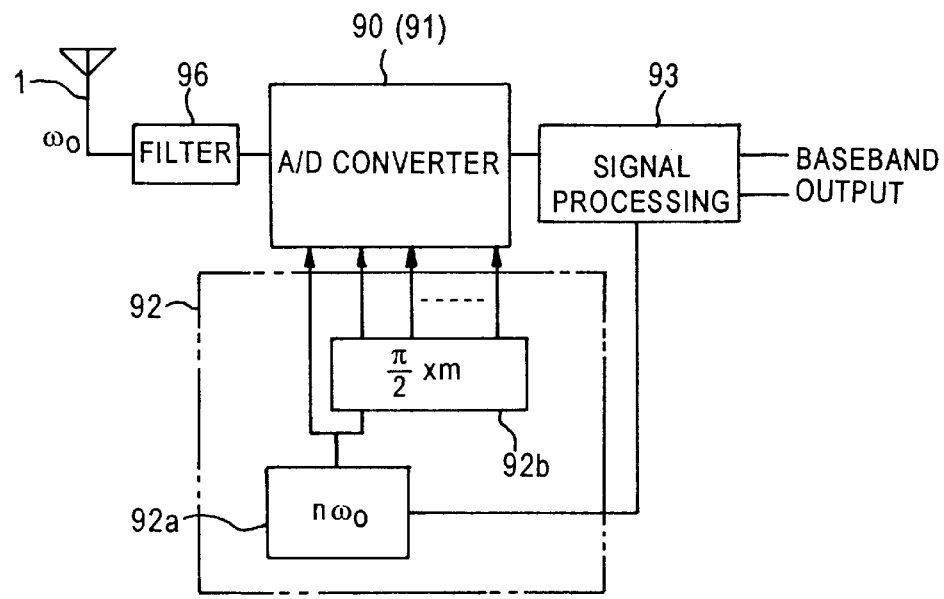
FIG. 41 is a simplified block diagram for describing a further operation of a sampling signal generating source portion in the twenty fifth embodiment of this invention.

FIG. 41 is an illustration for describing a further example of an operation of the sampling signal generating source 92 in the twenty fifth embodiment, and is a block diagram schematically and briefly showing the first A/D converter 90, the sampling signal generating source 92 and the other portions other than the operating unit 93 in the FIG. 38 arrangement In the FIG. 40 example, the sampling signal generating source 92 produces a pulse group with a frequency n times the frequency ωo (n: an integer) and the delay circuit performs the delay operation for ωo by π/2 time plural times, thus generating the pulse train from the sampling clock generator and the delayed pulse train from the delayed-pulse-train-adding circuit, particularly a plurality of delayed pulse trains delayed by a phase difference time corresponding to π/2 in relation to the frequency of the desired channel signal.

As obvious from the above, according to this embodiment, the frequency based on the band width is used as a sampling clock frequency for the A/D converter, with the result that, even if the sampling frequency component leaks in the air, the leakage does not interfere with the communication, and the leakage can easily prevented by the reception bandpass filter 96 built in the received signal inputting circuit 81. In addition, since the sampling frequency is extremely lower than the carrier frequency, it is allowed to lower the frequency affecting the power consumption in the circuit. Furthermore, since no analog type frequency converting circuit is present in the receiving circuit, active elements and filter elements associated therewith are unnecessary. The A/D converters 90, 91 and the following digital signal processing circuit can all be constructed as an integrated circuit, and hence the circuit can be size-reduced and the wiring amount within the integrated circuit can be little, which greatly reduces the power consumption. Thus, it is possible to reduce the power in the receiving system, simplify the receiving circuit, and lessen the power consumption.

Twenty-Sixth Embodiment

Figure 42:
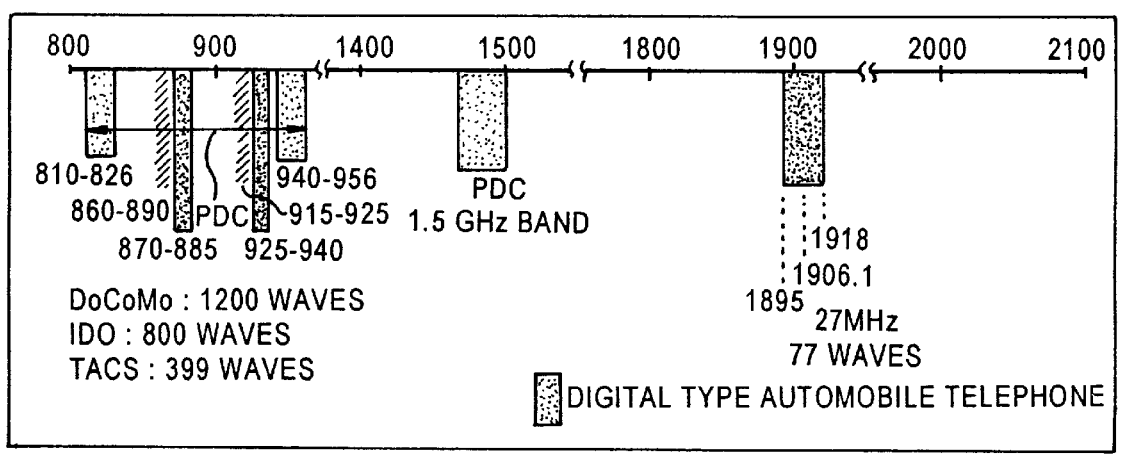
FIG. 42 is a schematic illustration of the frequency disposition for the Japanese standard digital type automobile telephone system used for description of a twenty sixth embodiment of this invention.

Furthermore, a description will be made hereinbelow of a twenty sixth embodiment of this invention. Although for reduction of the high-frequency circuit portion and reduction of the power consumption, various improvements have been made for receiving circuits of mobile communication systems, all of these improvements do not reach a satisfactory result. FIG. 42 shows a frequency disposition for the Japanese standard digital type automobile telephone system. In FIG. 42, for example, in the case of 810 MHz to 828 MHz of the PDC being one example of the Japanese standard, 640 waves are contained therein. That is, 1200 channels are arranged at 25 KMz. Directly performing the sampling for this frequency band greatly involves waste, because the channel band width accommodating the transmission information is as narrow as 23 KHz and the information amount is little. For this reason, if the received radio band signal is immediately sampled in relation to its carrier frequency band 800 MHz, the sampling of the several GHz (giga hertz) will be expected, whereas the information amount is only 25 kHz and hence most of the sample data becomes redundant.

In the receiving circuit according to this embodiment, a way of directly adding the received signal to an A/D converter is realized, thereby permitting the reduction of the number of the frequency converters. If according to the shannon's sampling theorem the maximum value of the time interval of samples necessary for specifying an arbitrary time function f(t) is considered in terms of the uniform samples, it is expressible as the following equation and comes to a well-known oversampling theorem.

$$f(t) = \sum_{n=-\infty}^{\infty} f\left(\frac{n}{2W}\right) \frac{\sin(2\pi Wt - n\pi)}{2\pi Wt - n\pi} \tag{63}$$

In this equation, the frequency W represents the upper limit of the frequency components contained in the time function f(t), i.e., in this case, 826 MHz. Whereupon, the sampling speed reaches several giga S/s more than two times of 826 MHz. A consideration is taken of the case that the spectrum is limited to f1 to f2. In this instance, an equation based on the shannon's secondary sampling theorem becomes as follows.

$$f(t) = \frac{T}{\pi} \sum_{n=-\infty}^{\infty} \left\{ f(nT) \frac{\sin(\pi/T)(t-nT)}{2\pi Wt - n\pi} \cos\pi(f_1+f_2)(t-nT) + f_q(nT) \frac{\sin(\pi/T)(t-nT)}{2\pi Wt - n\pi} \sin\pi(f_1+f_2)(t-nT) \right\} \tag{64}$$

where fq(t) denotes a value obtained by shifting the phases of all the spectrums of fq(t) by π/2.

Figure 43:
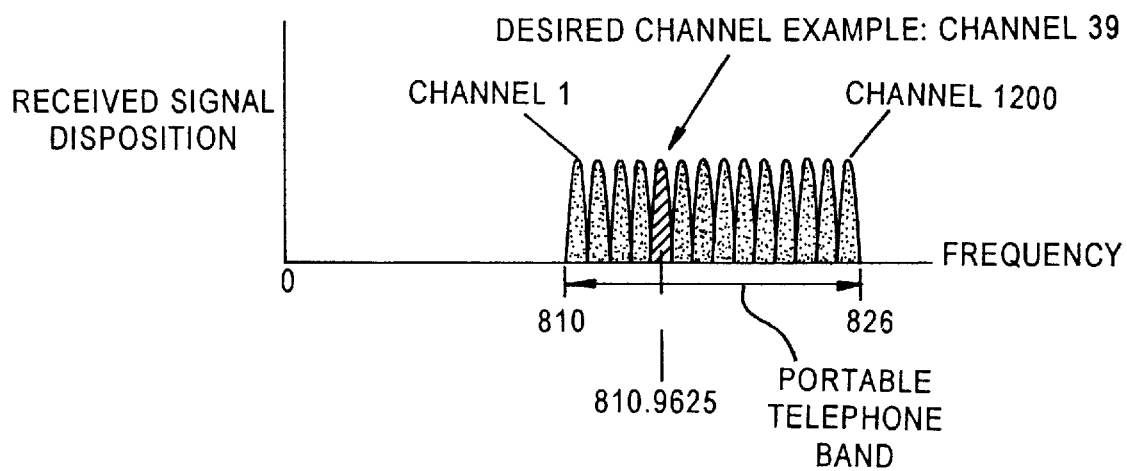
FIG. 43 is a schematic illustration of the channel disposition for the Japanese standard digital type automobile telephone system in FIG. 42.

This equation means that, if the values of f(t) and fq(t) are sampled at a sampling interval T=1/(f2−f1), the original signal f(t) is completely expressible. Accordingly, when f2−f1=W (Hz), it is sufficient if f(t) and fq(t) are alternately sampled at the sampling time interval of 1/W. That is, assuming that the bandwidth of the filter provided in the received signal inputting circuit is 25 KHz, the sampling speed of 25 KHz is enough. Because the filter actually placed in the received signal inputting circuit is designed in a state with all the adjacent channels being contained, its bandwidth becomes 826 (MHz)−810 (MHz)=16 (MHz), and the sampling speed becomes 15 MS.s. The disposition state of this received signal is shown in FIG. 43 which is a schematic illustration of the channel disposition in the Japanese standard digital type automobile telephone system.

Figure 44:
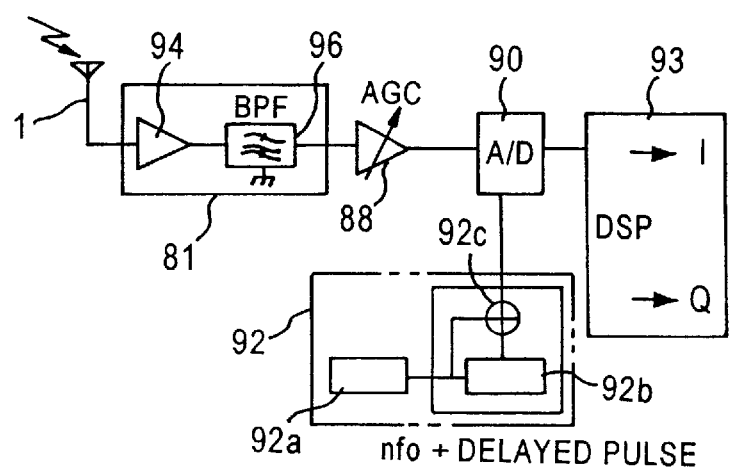
FIG. 44 is a block diagram showing an arrangement of a receiving circuit according to a twenty sixth embodiment of this invention.

FIG. 44 is a block diagram showing an arrangement of a receiving circuit according to the twenty-sixth embodiment of this invention. In FIG. 44, reference numeral 1 represents an antenna, numeral 81 designates a received signal input circuit for accepting a received signal obtained through the antenna 1, numeral 88 denotes a gain control, circuit for carrying out the gain adjustment for the received signal, numeral 90 depicts an A/D converter for A/D converting the output signal of the gain control circuit 88, numeral 92 indicates a sampling signal generating source comprising a sampling clock generating section 92a for outputting a clock with a frequency higher than the frequency corresponding to the bandwidth of the receives signal to the A/D converter 90, a delayed pulse adding section 92b for adding a delayed pulse train to a sampling clock pulse train, and a pulse adding section 92c for supplying the sampling clock pulse train and the delayed pulse train as sampling pulses to the A/D converter 90, and numeral 93 signifies an operating unit for extracting a desired receiving channel signal from the digital output data of the A/D converter 90. The received signal inputting section 81 is made up of an amplifier 94 and a reception bandpass filter 96.

Secondly, a description will be made hereinbelow of an operational principle and an operation of the twenty-sixth embodiment. A signal group obtained through the antenna 1 turns into only signals of the communication channel band through the received signal inputting circuit 81 including the reception bandpass filter 96. The signal is gain-adjusted in the gain control circuit 88 to have a given level, before being supplied to the A/D converter 90. In this A/D converter 90, there are given sampling pulses being a combination of a pulse group with a frequency n times (n: an integer) the frequency fo and a delayed pulse group with the same frequency which are supplied from the sampling signal generating source 92. Thus, the received signal is converted into data centering on the desired channel signal by means of the secondary sampling, operation of the A/D converter 90, and then being fed to the operating unit 93. On the basis of the data, the operating unit 93 produces the information in the case that the frequency conversion is made at a frequency fc−fo, and further performs the correlation operation to extract the desired signal (BPSK signal) as the common wave.

From the above, according to this embodiment, as a general example, in a communication system based on the BPSK type digital modulating method or the like, the desired wave channel is receivable without use of the frequency converter, which can realize a receiving circuit which is capable of reducing the power consumption and simplifying the circuit. Incidentally, although in this twenty-sixth embodiment one A/D converter 90 is employed for the A/D conversion, it is also appropriate that two A/D converters are disposed in parallel to separately supply two kinds of sampling pulse trains which in turn, are synthesized after the digital signal output is obtained.

Twenty-Seventh Embodiment

Figure 45:
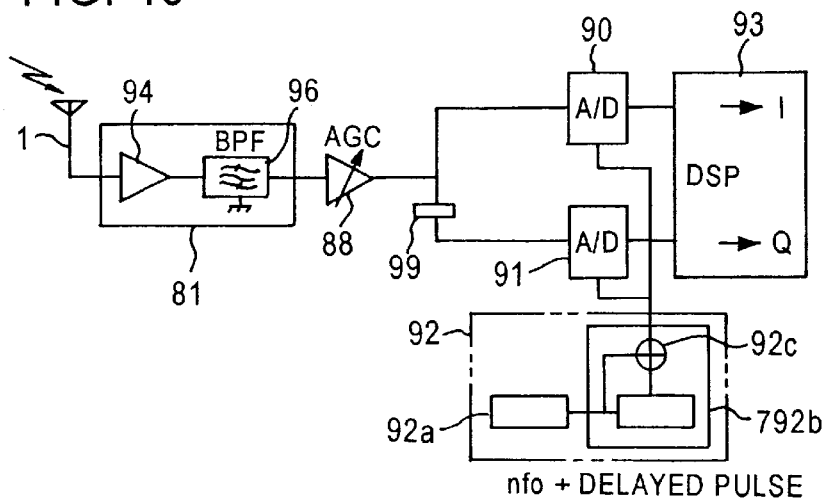
FIG. 45 is a block diagram showing an arrangement of a receiving circuit according to a twenty seventh embodiment of this invention.

FIG. 45 is a block diagram showing an arrangement of a receiving circuit according to a twenty-seventh embodiment of this invention. In FIG. 45, reference numeral 1 represents an antenna, numeral 81 designates a received signal input circuit for accepting a received signal obtained through the antenna 1, numeral 88 denotes a gain control, circuit for carrying out the gain adjustment for the received signal, numeral 90 depicts a first A/D converter for A/D converting the output signal of the gain control circuit 88, numeral 91 designates a second A/D converter for A/D converting the output of the gain control circuit 88 as a signal led through a system (path) different from the system to the first A/D converter 90, numeral 92 indicates a sampling signal generating source comprising a sampling clock generating section 92a for outputting a clock with a frequency higher than the frequency corresponding to the bandwidth of the receives signal to the first and second A/D converters 90, 91, a delayed pulse adding section 92b for adding a delayed pulse train to a sampling clock pulse train, and a pulse adding section 92c for supplying the sampling clock pulse train and the delayed pulse train as sampling pulses to the first and second A/D converters 90, 91, numeral 93 signifies an operating unit for extracting a desired receiving channel signal from the digital output data of the A/D converters 90, 91, and numeral 99 represents a phase shifter for accepting the gain control circuit 88 to shift its phase to send the resultant to the second A/D converter 92. The received signal inputting section 81 is made up of an amplifier 94 and a reception bandpass filter 96.

Secondly, a description will be made hereinbelow of an operational principle and an operation of the twenty-sixth embodiment. A signal group obtained through the antenna 1 turns into only signals of the communication channel band through the received signal inputting circuit 81 including the reception bandpass filter 96. The signal is gain-adjusted in the gain control circuit 88 to have a given level. The output of the gain control circuit 88 is distributed into two systems. One system output supplied to the first A/D converter 90. In this first A/D converter 90, there are given sampling pulses being a combination of a clock pulse train with a frequency higher than the frequency corresponding to the band width of the received signal, i.e., a pulse group with a frequency n times (n: an integer) the frequency fo and a delayed pulse group with the same frequency which are supplied from the sampling signal generating source 92. Thus, it is subjected to the sampling control. The first A/D converter 90 produces the digital signal output as well as the A/D converter in the aforesaid twenty-sixth embodiment and supplies it to the opening unit 93. On the other hand, the output of the gain control circuit 88 is distributed to the other system (second system). This second system is connected with the phase shifter 99, where the received signal undergoes a phase variation of 90 degrees. This phase-shifting-processed signal is inputted into the second A/D converter 91. The second A/D converter 91 accepts, from the sampling signal generating source 92, a clock pulse train with a frequency with a frequency higher than the frequency corresponding to the bandwidth of the received signal, i.e., a pulse group with a frequency n times (n: an integer) the frequency fo, and a delayed pulse group with the same frequency, to perform the sampling process for that signal. The operating unit 93 produces the information in the case that the frequency conversion is made at frequency fc−fo and further carries out the correlation operation to extract the desired signal (BPSK signal) as a common wave. As a result, the BPSK signal extracted from the digital output of the second A/D converter 91 in the operating unit denotes the information including the output of the first A/D converter 90 and a phase difference of 90 degrees.

These two kinds of information constitute a QPSK information. Thus, this means that the demodulation is possible in terms of the signal in the QPSK type communication method.

From the above, according to this embodiment, as a general example, in a communication system based on the BPSK type digital modulating method or the like, the desired wave channel is receivable without use of the frequency converter, which can realize a receiving circuit which is capable of reducing the power consumption and simplifying the circuit.

Twenty-Eighth Embodiment

Figure 46:
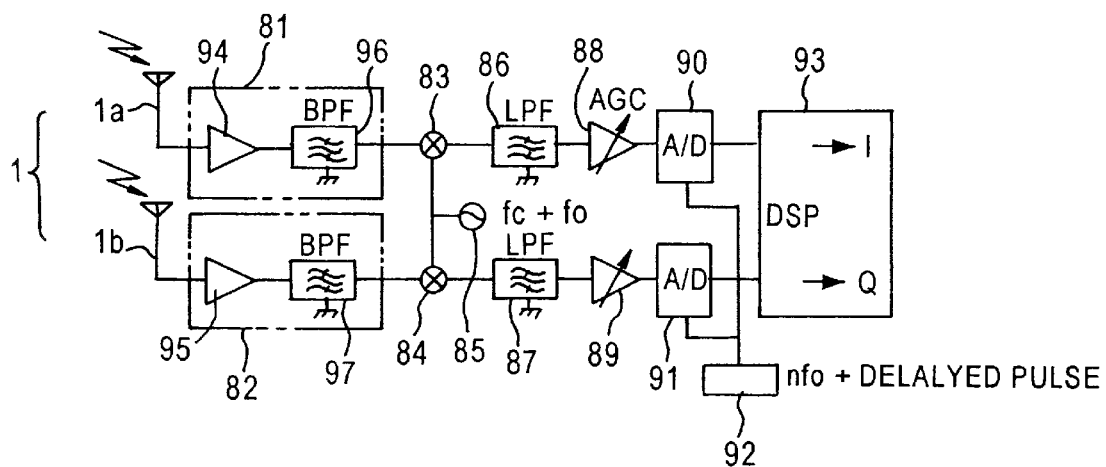
FIG. 46 is a block diagram showing an arrangement of a receiving circuit according to a twenty eighth embodiment of this invention.

FIG. 46 is a block diagram showing an arrangement of a receiving circuit according to a twenty-eighth embodiment of this invention. This embodiment realizes the space diversity with a receiving circuit basically comprising a single direct quadrature detector which is built in a local frequency complementary offset type direct frequency converting system which bases this invention.

In FIG. 46, numeral 1 represents a plurality of antennas including a first antenna 1a and a second antenna 1b. A first received signal inputting circuit 81 accepts a first received signal obtained through the first antenna 1a, a second received signal inputting circuit 82 accepts the received signal obtained through the second antenna 1b, a first frequency converter 83 accepts the received signal from the first received signal inputting circuit 81 to perform a frequency conversion thereof, and a second frequency converter 84 accepts the received signal from the second received signal inputting circuit 82 to carry out a frequency conversion thereof. Further, a local oscillator 85 offsets a desired carrier frequency by ½ of the channel spacing frequency and outputs it to the first and second frequency converters 83, 84, a first low-pass filter 86 cuts off the high-frequency band of the output signal of the first frequency converter 83, a second low-pass filter 87 cuts off the high-frequency band of the output signal of the second frequency converter 84, a first gain control (AGC) circuit 88 adjusts the gain of the first received signal, a second gain control circuit 89 adjusts the gain of the second received signal, a first A/D converter 90 A/D-converts the output signal of the first frequency converter 83, and a second A/D converter 91 A/D-converts the output signal of the second frequency converter 84. Still further, a sampling signal generating source 92 generates a clock with a frequency higher than the frequency corresponding to the bandwidth of the received signal toward the first and second A/D converters 90, 91, adds a delayed pulse train to a sampling clock pulse train, and supplies the sampling clock pulse train and the delayed pulse train as the sampling pulses to the first and second A/D converters 90, 91, and an operating unit 93 extracts a desired receiving channel signal from the digital output data of the first and second A/D converters 90, 91. The first and second received signal inputting circuits 81, 82 are made up of amplifiers 94, 95 and reception bandpass filters 96, 97, respectively.

Secondly, a description will be made hereinbelow of an operational principle and an operation of the twenty-eighth embodiment. A signal group attained through the first antenna 1a passes through the reception bandpass filter 96 to get into a signal of only the communication channel band, before being frequency converted at the offset local oscillation frequency fc+fo in the first frequency converter 83. This local frequency is fed from the local oscillator 85. As a result, the outputs of the frequency 2fc+fo and the frequency −fo are supplied to the first low-pass filter 86, where the signal with the frequency −fo is derived because of the low-frequency passing characteristic. This signal is adjusted by the first gain control circuit 88 to have a given level, before being fed to the first A/D converter 90, which also receives a pulse group being a combination of a pulse group with a frequency n times (n: an integer) the frequency fo and a delayed pulse group with the same frequency from the sampling signal generating source 92. Thus, the first A/D converter 90 obtains the secondary sampling operation so that the inputted signal is converted into the data centering on the desired channel signal. The converted signal is supplied to the operating unit 93.

A signal group received by the second antenna 1b is changed into a signal of only the communication channel band through the reception bandpass filter 97 and then frequency-converted at the local oscillation frequency fc+fo. This local oscillation frequency is supplied from the frequency oscillator 85. As a result, the outputs of the frequency 2fc+fo and the frequency −fo are supplied to the second low-pass filter 87, where the signal with the frequency −fo is derived because of the low-frequency passing characteristic. This signal is adjusted by the second gain control circuit 89 to have a given level, before being fed to the second A/D converter 91 which also receives a combination of a pulse group with a frequency n times (n: an integer) the frequency fo and a delayed pulse group with the same frequency from the sampling signal generating source 92. Thus, the second A/D converter 91 obtains the secondary sampling operation so that the inputted signal is converted into the data centering on the desired channel signal. The converted signal is supplied to the operating unit 93. On the basis of both data the operating unit 93 produces the information in the case that the frequency conversion is made at the frequency fc−fo, and performs the correlation operation to extract the desired signal as a common wave.

Twenty-Ninth Embodiment

Figure 47:
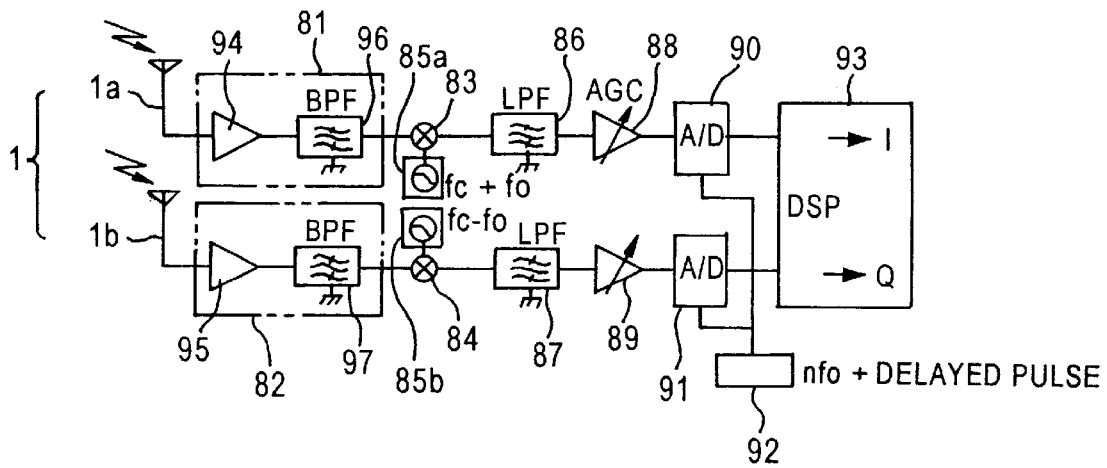
FIG. 47 is a block diagram showing an arrangement of a receiving circuit according to a twenty ninth embodiment of this invention.

FIG. 47 is a block diagram showing an arrangement of a receiving circuit according to a twenty-ninth embodiment of this invention. This embodiment has the almost same arrangement as that of the aforesaid twenty-eighth embodiment, and the parts corresponding to those of the twenty-eighth embodiment are marked with the same numerals and the detailed description thereof will be omitted for brevity. In this twenty-ninth embodiment, two local oscillators are provided, one local oscillator 85a being the same as the local oscillator 85 in the twenty-eighth embodiment and being connected with the first frequency converter 83 to supply the local oscillation frequency fc+fo thereto, and the other local oscillator 85b being connected with the second frequency converter 84 to supply the local oscillation frequency fc−fo thereto.

Secondly, a description will be made hereinbelow of an operational principle and an operation of the twenty-ninth embodiment. A signal group received by a first antenna 1a is changed into a signal of only the communication channel band through a reception bandpass filter 96 and is frequency-converted at the offset local oscillation frequency fc+fo in the first frequency converter 83. This local oscillation frequency is supplied from the local oscillator 85a As a result, the outputs of the frequency 2fc+fo and the frequency −fo are supplied to the first low-pass filter 86, and the signal with the frequency −fo is derived by the low-frequency passing characteristic. This signal is processed in the first gain control circuit 88 to have a given level and then supplied to the first A/D converter 90. This first A/D converter 90 accepts a pulse group being a combination of a pulse group with a frequency n times the frequency fo and a delayed pulse group with the same frequency which are supplied from a sampling signal generating source 92. Thus, the first A/D converter 90 converts the signal into data centering on the desired channel signal by the secondary sampling operation, with the converted data being supplied to the operating unit 93.

On the other hand, a signal group received by a second antenna 1b is changed into a signal of only the communication channel band through a reception bandpass filter 97 and is frequency-converted at the offset local oscillation frequency fc−fo in the second frequency converter 84. This local oscillation frequency is supplied from the local oscillator 85b. As a result, the outputs of the frequency 2fc−fo and the frequency fo are supplied to the second low-pass filter 87, and the signal with the frequency −fo is derived by the low-frequency passing characteristic. This signal is processed in the second gain control circuit 89 to have a given level and then supplied to the second A/D converter 91. This second A/D converter 91 accepts a pulse group being a combination of a pulse group with a frequency n times the frequency fo and a delayed pulse group with the same frequency which are supplied from a sampling signal generating source 92. Thus, the second A/D converter 91 converts the signal into data centering on the desired channel signal by the secondary sampling operation, with the converted data being supplied to the operating unit 93. On the basis of both the data the operating unit 93 produces the information in the case that the frequency conversion is made at the frequency fc−fo, and further performs the correlation operation to extract the desired signal as a common wave.

Thirtieth Embodiment

Figure 48:
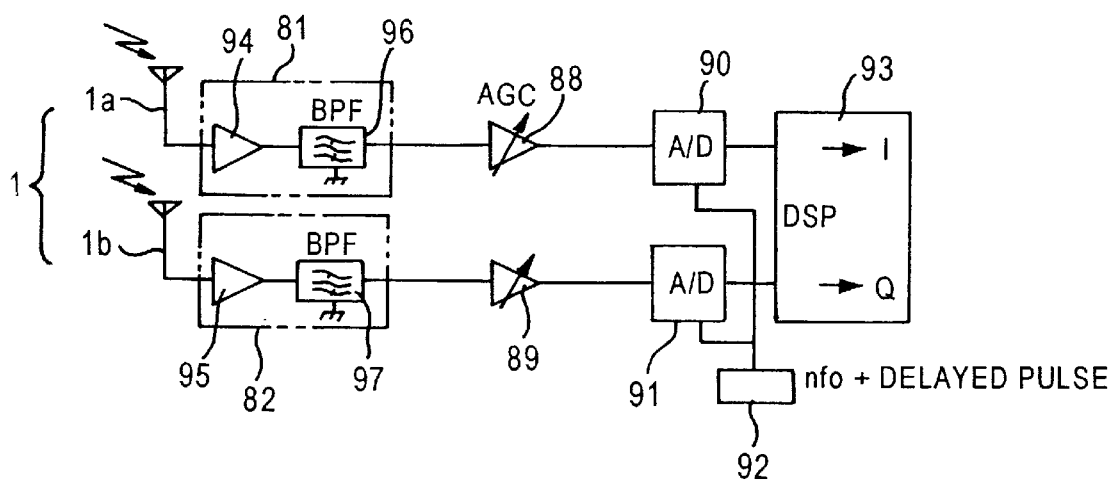
FIG. 48 is a block diagram showing an arrangement of a receiving circuit according to a thirtieth embodiment of this invention.

FIG. 48 is a block diagram showing an arrangement of a receiving circuit according to a thirtieth embodiment of this invention. The recording circuit according to this embodiment basically has the same construction as those of the twenty-eighth embodiment and the twenty-ninth embodiment, while the construction is further simplified. In FIG. 48, parts corresponding to those of both the aforesaid embodiments are marked with the same numerals and a description thereof will briefly be made hereinbelow. In FIG. 48, numeral 1 represents a plurality of antennas including a first antenna 1a and a second antenna 1b. A first received signal inputting circuit 81 accepts a first received signal obtained through the first antenna 1a, a second received signal inputting circuit 82 accepts the received signal obtained through the second antenna 1b, a first gain control circuit 88 adjusts the gain of the first received signal, a second gain control circuit 89 adjusts the gain of the second received signal, a first A/D converter 90 A/D-converts the output signal of the first gain control circuit 88, and a second A/D converter 91 A/D-converts the output signal of the second gain control circuit 89. Still further, a sampling signal generating source 92 generates a clock with a frequency higher than the frequency corresponding to the bandwidth of the received signal toward the first and second A/D converters 90, 91, adds a delayed pulse train to a sampling clock pulse train, and supplies the sampling clock pulse train and the delayed pulse train as the sampling pulses to the first and second A/D converters 90, 91, and an operating unit 93 extracts a desired receiving channel signal from the digital output data of the first and second A/D converters 90, 91. The first and second received signal inputting circuits 81, 82 are made up of amplifiers 94, 95 and reception bandpass filters 96, 97, respectively.

Secondly, a description will be made hereinbelow of an operational principle and an operation of the thirtieth embodiment. A signal group received by a first antenna 1a is changed into a signal of only the communication channel band through a reception bandpass filter 96. This signal is processed in the first gain control circuit 88 to have a given level and then supplied to the first A/D converter 90. This first A/D converter 90 accepts a pulse group being a combination of a pulse group with a frequency n times the frequency fo and a delayed pulse group with the same frequency which are supplied from a sampling signal generating source 92. Thus, the first A/D converter 90 converts the signal into data centering on the desired channel signal by the secondary sampling operation, with the converted data being supplied to the operating unit 93.

On the other hand, a signal group received by a second antenna 1b is changed into a signal of only the communication channel band through a reception bandpass filter 97. This signal is processed in the second gain control circuit 89 to have a given level and then supplied to the second A/D converter 91. This second A/D converter 91 accepts a pulse group being a combination of a pulse group with a frequency n times the frequency fo and a delayed pulse group with the same frequency which are supplied from a sampling signal generating source 92. Thus, the second A/D converter 91 converts the signal into data centering on the desired channel signal by the secondary sampling operation, with the converted data being supplied to the operating unit 93. On the basis of both the data the operating unit 93 produces the information in the case that the frequency conversion is made at the frequency fc−fo, and further performs the correlation operation to extract the desired signal as a common wave. In this embodiment, the frequency conversion is not carried out before the A/D converter, but the A/D converter itself is designed to have that function.

From the above, this embodiment can realize a space divercity function which is built in a local frequency complementary offset type frequency converting method which bases this invention.

According to this invention, as obvious from the above-described embodiments, the frequency between the channels contained in a communication system is directly converted as the local frequency of the receiver, besides it is possible to prevent the frequency offset arising in its output signal and the introduction of the adjacent channel signals thereinto, and hence it is possible to lessen the power in the receiving system, simplify the circuit, and reduce the power consumption.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A receiving circuit comprising:

first and second frequency converting circuits for accepting a received signal obtained through an antenna;

a local frequency signal generating circuit coupled to said first and second frequency converting circuits for generating middle frequencies between a radio carrier frequency of said received signal and radio carrier frequencies of adjacent upside and downside channels and further for outputting the upside frequency of the upside and downside two wave frequencies as a conversion frequency input to said first frequency converting circuit and for outputting the downside frequency thereof as a conversion frequency input to said second frequency converting circuit;

first and second integrating circuits, serving additionally as low-pass filters, for receiving outputs of said first and second frequency converting circuits through input lines;

first and second buffer amplifiers for receiving outputs of said first and second integrating circuits;

first and second transformers having the same construction and having primary coils whose one ends accepts outputs of said first and second buffer amplifiers, the other ends of said primary coils of said first and second transformers being grounded in the form of alternating currents, and secondary coils of said first and second transformers being coupled in parallel to each other in accordance with polarities of said primary coils and one ends of said secondary coils equal in polarity to said primary coils is used as an output terminal while the other ends of said secondary coils are grounded;

a third buffer amplifier for accepting an output from said first and second transformers;

a frequency offset circuit for removing a frequency offset remaining in an output of said third buffer amplifier; and a filter for removing an unnecessary frequency component remaining in an output of said frequency offset.

2. A receiving circuit comprising:

first and second frequency converting circuits for accepting a received signal obtained through an antenna;

a local frequency signal generating circuit coupled to said first and second frequency converting circuits for generating middle frequencies between a radio carrier frequency of said received signal and radio carrier frequencies of adjacent upside and downside channels and further for outputting the upside frequency of the upside and downside two wave frequencies as a conversion frequency input to said first frequency converting circuit and for outputting the downside frequency thereof as a conversion frequency input to said second frequency converting circuit;

first and second differential amplifiers for accepting outputs of said first and second frequency converting circuits through input lines;

first and second integrating circuits, serving additionally as low-pass filters, for correspondingly accepting outputs of said first and second differential amplifiers;

first and second buffer amplifiers for supplying outputs of said first and second integrating circuits;

means for making a feedback from an output side of each of said first and second buffer amplifiers to a negative input side thereof;

first and second transformers having the same construction and having primary coils whose one ends accepts outputs of said first and second buffer amplifiers, the other ends of said primary coils of said first and second transformers being at least grounded in the form of alternating currents, and secondary coils of said first and second transformers being coupled in parallel to each other in accordance with polarities of said primary coils and one ends of said secondary coils equal in polarity to said primary coils is used as an output terminal while the other ends of said secondary coils are at least grounded in the form of alternating currents;

a third buffer amplifier for accepting outputs of said first and second transformers;

means for comparing an output of said third buffer amplifier with an average of the output of said first frequency converting circuit and the output of said second frequency converting circuit to correct the outputs of said first and second frequency converting circuits;

means for causing an output of said third buffer amplifier to be feedbacked to one of said first and second frequency converting circuits to correct a difference between the outputs of said first and second frequency converting circuits;

a frequency offset circuit for removing a frequency offset remaining in said output of said third buffer amplifier; and a filter for removing an unnecessary frequency component remaining in an output of said frequency offset circuit.

3. A receiving circuit as set forth in claim 1, wherein said one end of said secondary coil different in polarity from said primary coil is connected with said third buffer amplifier in place of said end end of said secondary coil equal in polarity to said primary coil being connected therewith.

4. A receiving circuit as set forth in claim 2, wherein said one end of said secondary coil different in polarity from said primary coil is connected with said third buffer amplifier in place of said end end of said secondary coil equal in polarity to said primary coil being connected therewith.

* * * * *